(12) United States Patent
Tourne

(10) Patent No.: US 11,184,977 B2
(45) Date of Patent: Nov. 23, 2021

(54) METHOD FOR PRODUCING A PRINTED CIRCUIT BOARD

(71) Applicant: NextGin Technology BV, Helmond (NL)

(72) Inventor: J. A. A. M. Tourne, Helmond (NL)

(73) Assignee: NextGin Technology BV, Helmond (NL)

( * ) Notice: Subject to any disclaimer, the term of this patent is extended or adjusted under 35 U.S.C. 154(b) by 210 days.

(21) Appl. No.: 15/682,426

(22) Filed: Aug. 21, 2017

(65) Prior Publication Data

US 2018/0054892 A1 Feb. 22, 2018

Related U.S. Application Data

(60) Provisional application No. 62/377,195, filed on Aug. 19, 2016.

(51) Int. Cl.
*H05K 3/46* (2006.01)
*H05K 1/11* (2006.01)
(Continued)

(52) U.S. Cl.
CPC .......... *H05K 1/115* (2013.01); *H05K 1/0222* (2013.01); *H05K 3/0035* (2013.01); *H05K 3/403* (2013.01); *H05K 3/4602* (2013.01); *H01L 21/4842* (2013.01); *H01L 24/97* (2013.01); *H05K 1/0245* (2013.01); *H05K 3/429* (2013.01); *H05K 2201/09645* (2013.01);
(Continued)

(58) Field of Classification Search
CPC ...... H05K 3/0035; H05K 3/403; H05K 3/429; H05K 3/4602; H05K 1/0222; H05K 1/0245; H05K 1/115; H05K 2201/09645; H01L 21/552; H01L 24/97; H01L 21/4842; Y10T 29/49135; Y10T 29/49146; Y10T 29/49798
See application file for complete search history.

(56) References Cited

U.S. PATENT DOCUMENTS 4,543,715 A 10/1985 Iadarola et al.
4,838,800 A 6/1989 Lynch
(Continued)

FOREIGN PATENT DOCUMENTS

CN 200531185 3/1993
EP 1696482 A2 8/2006
(Continued)

OTHER PUBLICATIONS

International Search Report and Written Opinion regarding PCT App. No. PCT/US17/47860 dated Jan. 26, 2018.
(Continued)

*Primary Examiner* — A. Dexter Tugbang
(74) *Attorney, Agent, or Firm* — Dunlap Codding, P.C.

(57) ABSTRACT

A method for producing a printed circuit board is disclosed, In the method, a slot is formed in a substrate having at least three layers with the slot extending through at least two of the layers. The slot has a length and a width with the length being greater than the width. The sidewall of the substrate surrounding the slot is coated with a conductive layer. Then, the conductive layer is separated into at least two segments that are electrically isolated along the side wall of the substrate.

15 Claims, 36 Drawing Sheets

(51) Int. Cl.
*H05K 1/02* (2006.01)
*H05K 3/00* (2006.01)
*H05K 3/40* (2006.01)
*H05K 3/42* (2006.01)
*H01L 21/48* (2006.01)
*H01L 23/00* (2006.01)

(52) U.S. Cl.
CPC .... *Y10T 29/49135* (2015.01); *Y10T 29/49146* (2015.01); *Y10T 29/49798* (2015.01)

(56) References Cited

U.S. PATENT DOCUMENTS

| | | | |
|---|---|---|---|
| 5,825,084 A | 10/1998 | Lau et al. | |
| 6,137,064 A | 10/2000 | Kiani et al. | |
| 6,534,872 B1 | 3/2003 | Freda et al. | |
| 6,541,712 B1 | 4/2003 | Gately et al. | |
| 6,593,535 B2 | 7/2003 | Gailus | |
| 6,594,811 B2 | 7/2003 | Katz | |
| 6,713,685 B1 | 3/2004 | Cotton | |
| 6,891,272 B1 | 5/2005 | Fjelstad | |
| 7,168,164 B2 | 1/2007 | Jessep et al. | |
| 7,275,316 B2 | 10/2007 | Myers et al. | |
| 7,358,470 B2 | 4/2008 | Wang et al. | |
| 7,378,601 B2 | 5/2008 | Hsu et al. | |
| 7,457,132 B2 | 11/2008 | Gisin et al. | |
| 7,470,864 B2 | 12/2008 | Ho et al. | |
| 7,478,474 B2 * | 1/2009 | Koga | H01L 24/97 257/660 |
| 8,222,537 B2 | 7/2012 | Dudnikov, Jr. et al. | |
| 8,541,884 B2 | 9/2013 | Conn et al. | |
| 8,674,489 B2 | 3/2014 | Bolis et al. | |
| 8,715,006 B2 | 5/2014 | Jeon | |
| 8,835,226 B2 | 9/2014 | Morris et al. | |
| 9,035,197 B2 | 5/2015 | Ao | |
| 9,040,831 B2 | 5/2015 | Ishida et al. | |
| 2005/0133251 A1 | 6/2005 | Chiu | |
| 2005/0161255 A1 | 7/2005 | Takada | |
| 2005/0196898 A1 | 9/2005 | Ho et al. | |
| 2006/0012030 A1 | 1/2006 | Ho et al. | |
| 2007/0017697 A1 | 1/2007 | Hsu | |
| 2007/0033457 A1 | 2/2007 | Park et al. | |
| 2007/0089292 A1 | 4/2007 | Tourne et al. | |
| 2007/0089902 A1 | 4/2007 | Tourne | |
| 2007/0137891 A1 * | 6/2007 | Fan | H05K 3/403 174/262 |
| 2007/0163112 A1 * | 7/2007 | Wang | H05K 3/421 29/852 |
| 2008/0210462 A1 * | 9/2008 | Kawagishi | H01L 24/97 174/377 |
| 2009/0057912 A1 | 3/2009 | Kheng | |
| 2009/0211794 A1 | 8/2009 | Nakaie | |
| 2009/0233461 A1 | 9/2009 | Tourne | |
| 2009/0266586 A1 * | 10/2009 | Sato | H05K 3/403 174/254 |
| 2009/0294169 A1 | 12/2009 | Tsubamoto et al. | |
| 2012/0306597 A1 | 12/2012 | Kushta | |
| 2015/0208514 A1 | 7/2015 | Thomas et al. | |

FOREIGN PATENT DOCUMENTS

| | | | | |
|---|---|---|---|---|
| JP | 2630308 B2 | | 7/1997 | |
| JP | 2000004086 | | 1/2000 | |
| JP | 2011228322 A | * | 11/2011 | |
| JP | 2015079775 A | * | 4/2015 | H05K 3/301 |
| TW | 201127244 A1 | | 8/2011 | |

OTHER PUBLICATIONS

PCT Search Report and Written Opinion regarding PCT App. No. PCT/US2016/018682 dated Jul. 12, 2016.
Chinese Office Action regarding Chinese Patent App. No. 201680010993.8 with English translation, dated Apr. 24, 2020.
Partial Supplementary European Search Report regarding European Patent App. No. 17842271.3, dated Apr. 14, 2020.
European Patent Office, Extended European Search Report including the supplementary European Search Report and the European Search Opinion regarding European Patent Application No. 16753147.4, dated Oct. 8, 2018.
Nextgin Technology Bv, Response to Extended European Search Report regarding European Patent Application No. 16753147.4, dated Jul. 2, 2019.
China National Intellectual Property Administration, First Office Action regarding Chinese Patent Application No. 201680010993.8, dated Jun. 19, 2019, with English translation.
China National Intellectual Property Administration, Third Office Action of Chinese Application No. 201680010993.8, dated Jan. 18, 2021 with an accompanying English translation of the third Office Action.

* cited by examiner

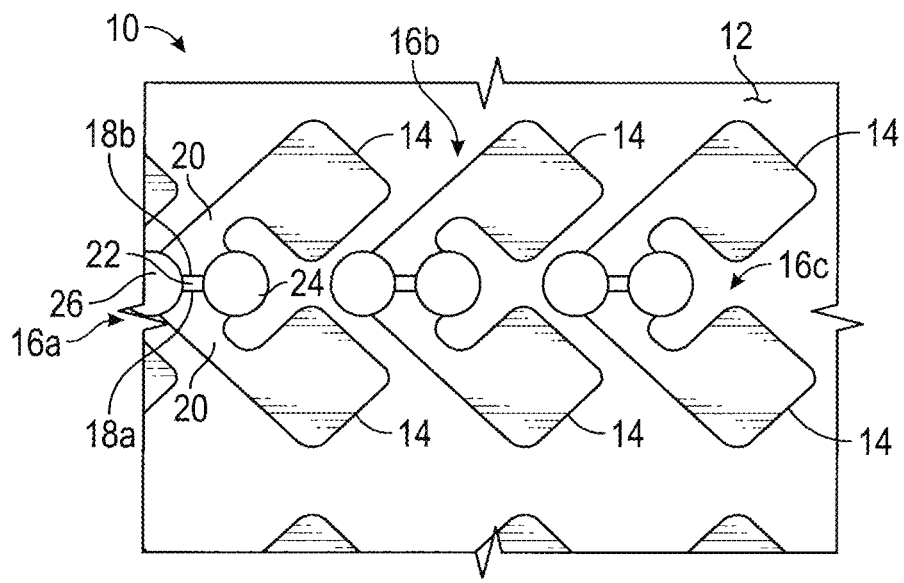
FIG. 1
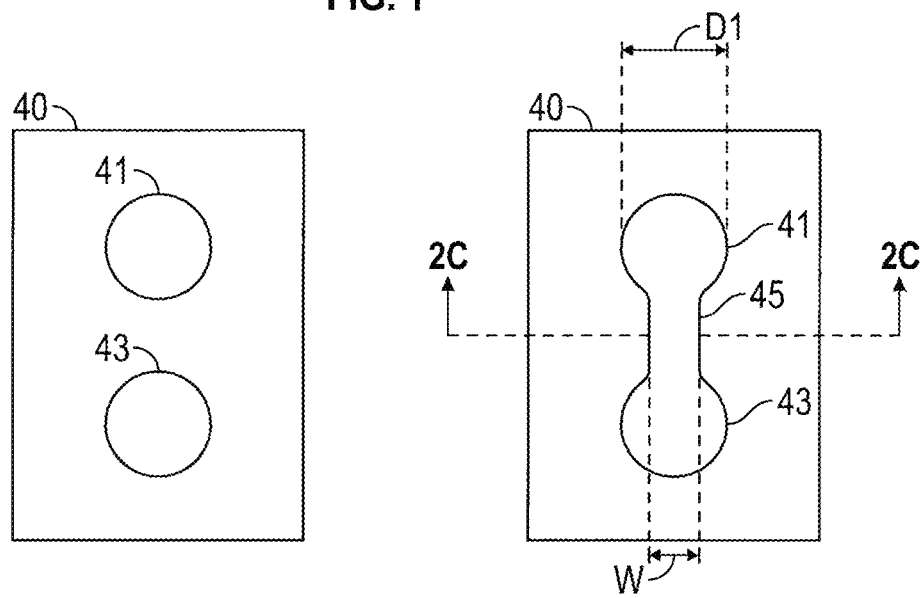
FIG. 2A  FIG. 2B
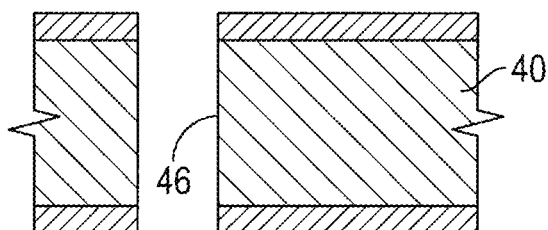
FIG. 2C

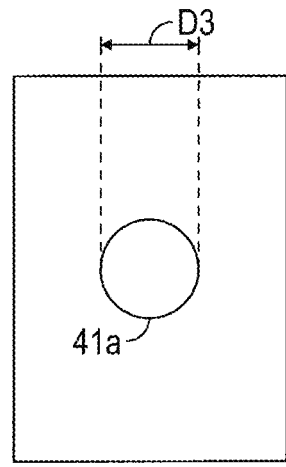
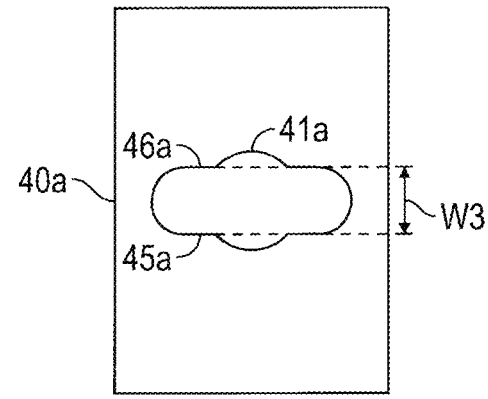
FIG. 4A        FIG. 4B
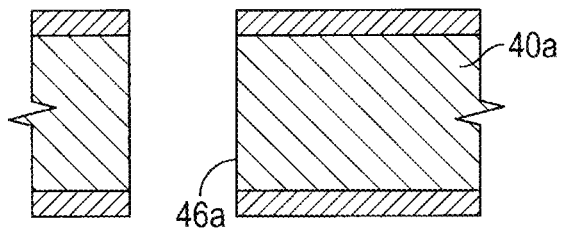
FIG. 4C
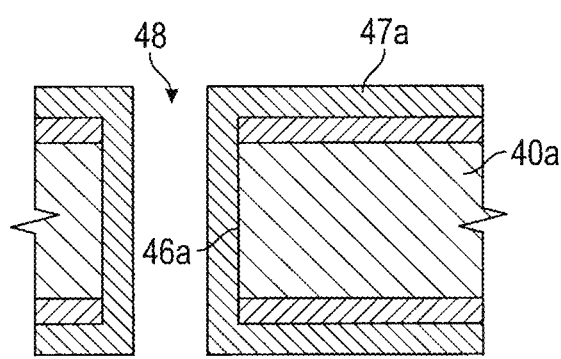
FIG. 4D
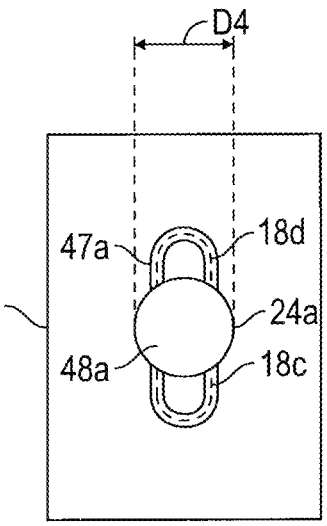
FIG. 4E

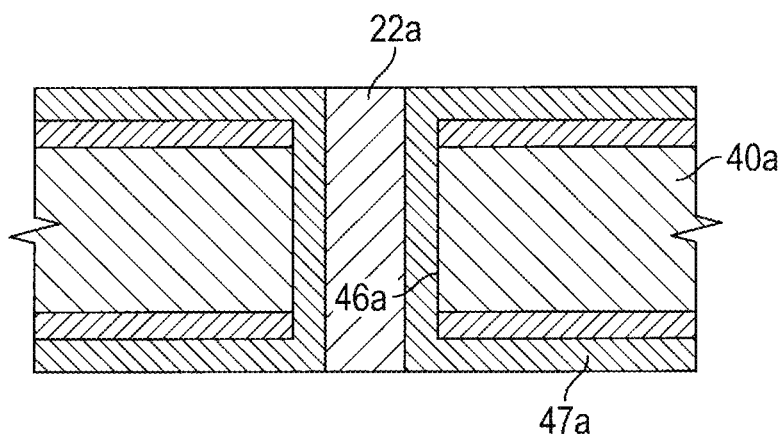
FIG. 4F
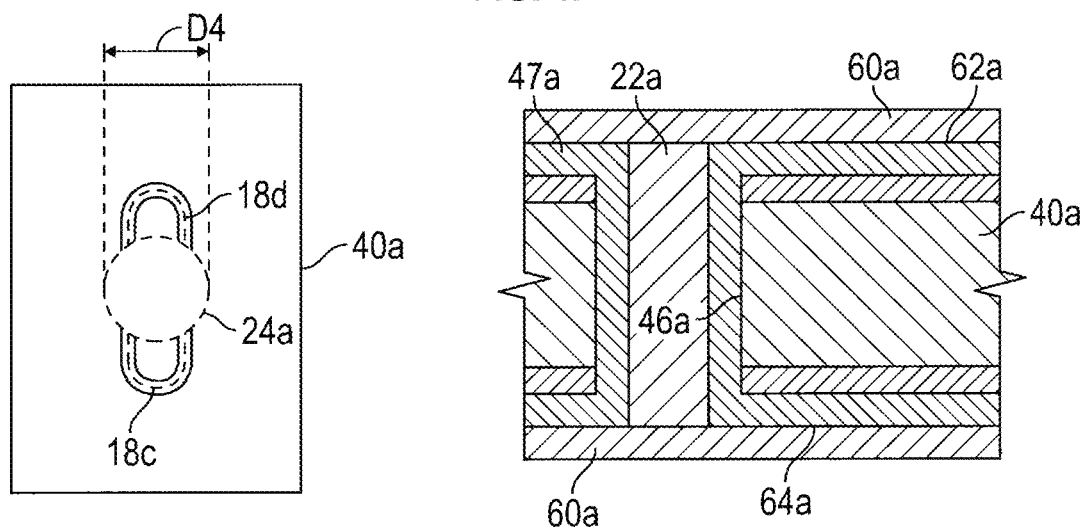
FIG. 4G
FIG. 4H
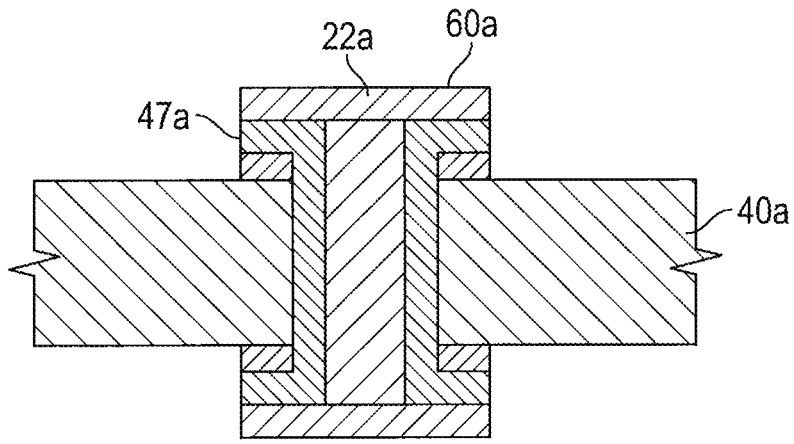
FIG. 4I

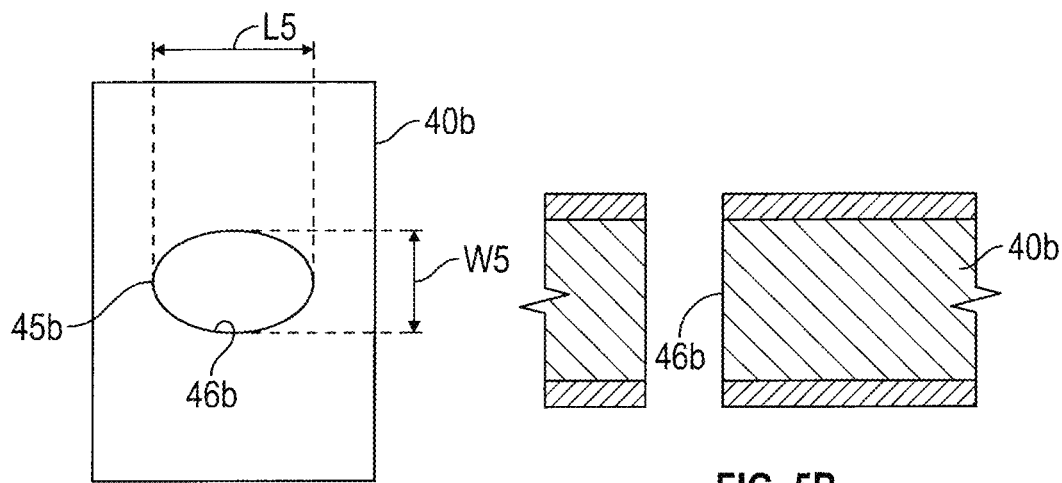
FIG. 5A
FIG. 5B
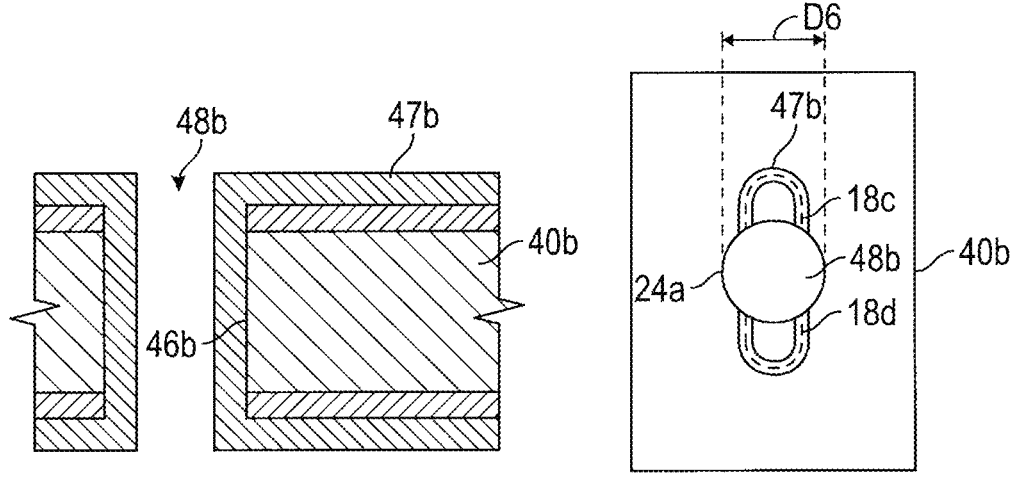
FIG. 5C
FIG. 5D
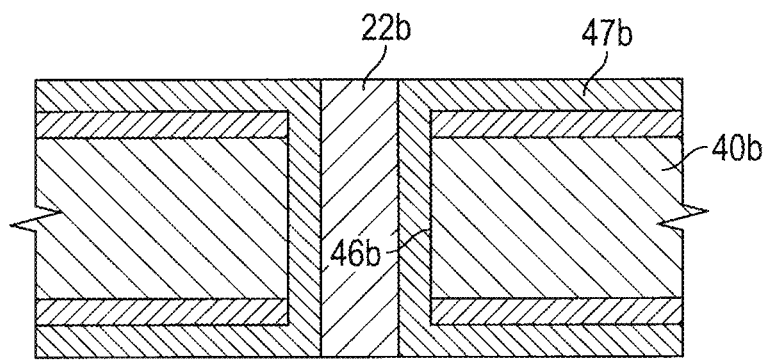
FIG. 5E

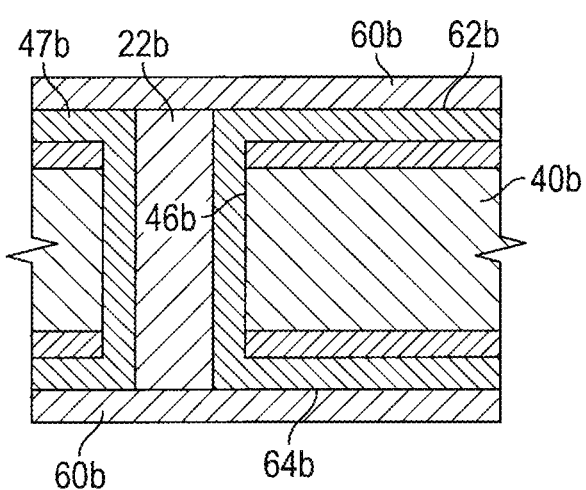
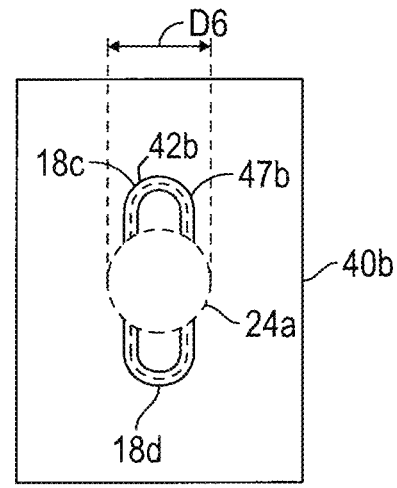
FIG. 5F    FIG. 5G
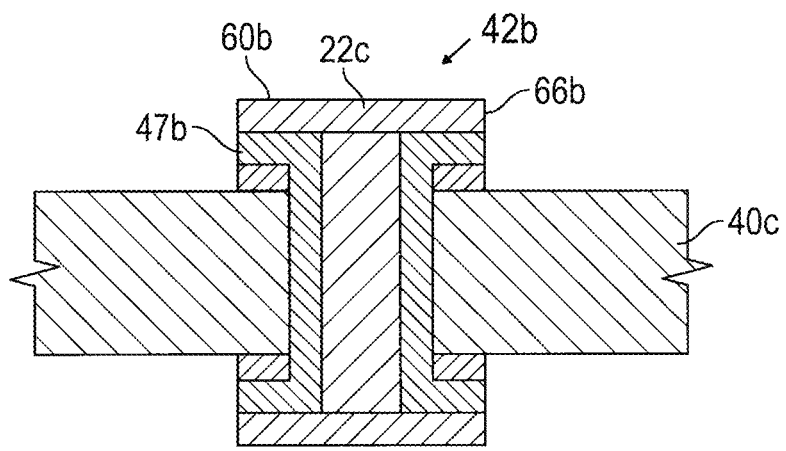
FIG. 5H

METHOD FOR PRODUCING A PRINTED CIRCUIT BOARD

INCORPORATION BY REFERENCE

The entire provisional patent application filed on Aug. 19, 2016, and identified by U.S. Ser. No. 62/377,195 is hereby incorporated herein by reference.

BACKGROUND

Printed circuit boards (PCBs) are widely known in the art and are used for forming a wide variety of types of electrical devices. Printed circuit boards typically consist of a number of layers of copper conductors which are interconnected by metallized holes. The metallized holes can be in different forms, such as microvias, buried vias, blind vias and through-holes. In the typical cases, the hole has a single function: the plating in the hole connects all copper layers exposed in the hole to each other, or the hole is used for component insertion.

Vias have also served dual purposes such as providing layer-to-layer interconnection and through-hole component mounts. The growth of surface mount component technology however, has reduced the need to utilize holes for through-hole component mount and has resulted in the via primarily providing layer-to-layer interconnection, i.e., a via hole.

There has, however, been a trend to provide PCBs having increasingly higher circuit density and higher circuit speed. Many of these designs have a few dense high Input/Output components grouped together. Thus, many PCB will have a very dense area around the high Input/Output components, while the remainder of the PCB is often of lower density. These very dense areas cause an increased layer count in the PCB resulting in an increased cost of the PCB.

To help meet the demand for increased circuit density, it has been proposed to provide more than one independent signal path or connection in a single via. However, there are limitations with vias. The surface area of vias are too large for the new generations of components and pushing the limits down in hole size cause yield issues in the drilling, cleaning, and plating of the vias. Thus, a need exists for a structure with a reduced surface area having electrically isolated segments. It is to such an improved method of producing PCBs that the present invention is directed.

BRIEF DESCRIPTION OF THE DRAWINGS

The accompanying drawings, which are incorporated in and constitute a part of this specification, illustrate one or more implementations described herein and, together with the description, explain these implementations. The drawings are not intended to be drawn to scale, and certain features and certain views of the figures may be shown exaggerated, to scale or in schematic in the interest of clarity and conciseness. Not every component may be labeled in every drawing. Like reference numerals in the figures may represent and refer to the same or similar element or function. In the drawings:

FIG. 1 is a top plan view of a portion of a printed circuit board constructed in accordance with the present invention.

FIGS. 2A, 2B, 2C, 2D, 2E, 2F, 2G, 2H, and 2I illustrate sequential steps utilized in one method of forming the printed circuit board depicted in FIG. 1.

FIGS. 4A, 4B, 4C, 4D, 4E, 4F, 4G, 4H and 4I illustrate exemplary sequential steps utilized in forming the printed circuit board depicted in FIG. 3.

FIGS. 5A, 5B, 5C, 5D, 5E, 5F, 5G and 5H illustrate the sequential steps utilized in yet another method of forming the printed circuit board depicted in FIG. 3.

DETAILED DESCRIPTION

Figure 2D:
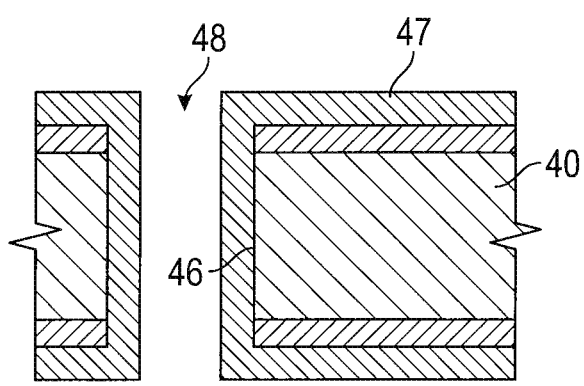

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. The inventive concepts disclosed herein are capable of other embodiments, or of being practiced or carried out in various ways. Also, it is to be understood that the phraseology and terminology employed herein is for the purpose of description and should not be regarded as limiting the inventive concepts disclosed and claimed herein in any way.

In the following detailed description of embodiments of the inventive concepts, numerous specific details are set forth in order to provide a more thorough understanding of the inventive concepts. However, it will be apparent to one of ordinary skill in the art that the inventive concepts within the instant disclosure may be practiced without these specific details. In other instances, well-known features have not been described in detail to avoid unnecessarily complicating the instant disclosure.

As used herein, the terms "comprises," "comprising," "includes," "including," "has," "having," and any variations thereof, are intended to cover a non-exclusive inclusion. For example, a process, method, article, or apparatus that comprises a list of elements is not necessarily limited to only those elements, and may include other elements not expressly listed or inherently present therein.

Unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B is true (or present).

In addition, use of the "a" or "an" are employed to describe elements and components of the embodiments disclosed herein. This is done merely for convenience and to give a general sense of the inventive concepts. This description should be read to include one or at least one and the singular also includes the plural unless it is obvious that it is meant otherwise.

As used herein, qualifiers like "substantially," "about," "approximately," and combinations and variations thereof, are intended to include not only the exact amount or value that they qualify, but also some slight deviations therefrom, which may be due to manufacturing tolerances, measurement error, wear and tear, stresses exerted on various parts, and combinations thereof, for example.

Finally, as used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

The term "conductive material" as used herein refers to a type of material that allows the flow of electrical current in one or more directions. In metals such as copper or aluminum, the flow of electrical current occurs through movement of mobile charged particles called electrons. In other types of conductive material, the flow of electrical current occurs through movement of positive charges such as cationic electrolyte(s) of a battery, or mobile protons of a proton conductor in a fuel cell. Examples of conductive materials include copper, aluminum, gold, silver, carbon, palladium, nickel, zinc and combinations thereof.

Referring now to the drawings, and in particular to FIG. 1, shown therein and designated by a general reference numeral 10, is a printed circuit board constructed in accordance with the present invention. The printed circuit board 10 is provided with a substrate 12, a plurality of contact pads 14, and a plurality of vertical conductive structures 16 (the vertical conductive structures 16 are designated in FIG. 1 by the reference numerals 16a, 16b, and 16c for purposes of clarity). Each of the vertical conductive structures 16a, 16b, and 16c are similar in construction and function. Thus, only the vertical conductive structure 16a will be described in detail herein. The vertical conductive structure 16a is provided with at least two electrically isolated conductive segments 18a and 18b. Each of the conductive segments 18a and 18b is connected to a separate contact pad 14 by way of a trace 20, although the conductive segments 18a and 18b can be connected directly to the contact pads 14. The conductive segments 18a and 18b are electrically isolated by a non-conductive filling material 22 interposed between the conductive segments 18a and 18b. As will be discussed in more detail below, the conductive segments 18a and 18b are typically formed by conductive plating which has been separated or cut by the formation of at least two spaced-apart holes 24 and 26 (which may be referred to herein as a first hole 24 and a second hole 26).

The substrate 12 can be any material or device capable of being utilized to support electrical components, conductors, and the like. In one preferred embodiment, the substrate 12 includes multiple layers of interleaved conductive paths (or traces) and insulators.

The contact pads 14 can be any type of material or device capable of providing an electrical connection or contact to an external component, such as an integrated circuit. For example, the contact pad 14 can be a surface mount contact, or a ball grid array contact, or solder mask defined common mode contact. This shape can be in the form of round, oval, or multi-sided shapes depending on the optimum routing and bonding criteria.

The vertical conductive structure (V.C.S.) 16a, for example can be used to transfer various types of signals, including differential or common mode type signals. Exemplary types of signals include analog signals, digital signals, fixed voltage signals, or a power ground. In certain instances, pairs of the conductive segments 18 may be used together to convey a differential or common mode signal. In the case of differential type signals the path or running two signals in parallel would with traditional technology be distorted as the vias separate the signal. In the case of the vertical conductive structure 16 the signals/traces stay close together and have a minimum distortion of the signal. With matching dielectric fill materials the coupling effects can simulate a broadside coupled circuit. This is in combination with the signal impedance on the innerlayers and outerlayers can potentially dramatically reduce the effects of via stub influence for inductance and capacitance. Stub reduction in a Z direction of the vertical conductive structure, using control depth drilling or blind via structures will further reduce the influence of the vertical conductive structure 16a compared to conventional single signal through hole vias. An example of a system for stub reduction in the Z direction of the via is disclosed is U.S. Ser. No. 10/944,583 filed on Sep. 17, 2004, the entire content of which is hereby incorporated herein by reference.

Typical drill sizes for the through holes and buried holes are in the range of 0.35 mm to 0.2 mm and the current trend in the field of producing printed circuit boards is to lower the drill sizes even further to accommodate smaller pin pitches in new generation components. Further, the current trend in the field of producing printed circuit boards is to increase a layer count within the printed circuit boards due to ever increasing I/O count, which results in the printed circuit boards getting thicker. Thicker printed circuit boards in combination with smaller holes results in lower yield processes with conventional printed circuit board manufacturing technologies. A ratio of the PCB thickness versus drill size is known in the art as an aspect ratio. When using aspect ratios greater than 12, conventional printed circuit board manufacturing processes have difficulty plating the vias. If we compare, however, the surface area of a through hole via constructed in accordance with conventional printed circuit board manufacturing processes with a surface area of the vertical conductive structure 16 then we see a large difference in A/R (by surface area), which shows one advantage of the vertical conductive structure 16.

| Through hole | Board thickness [mm] | Drill/VCS size [mm] | Surface area [mm$^2$] | A/R By diameter | A/R by surface area |
|---|---|---|---|---|---|
| VCS | 3.0 | 0.25 | 0.049 | 12 | 61.1 |
| | 3.0 | 0.2 | 0.0314 | 15 | 95.5 |
| | 3.0 | 0.35 × 1.0 | 0.323 | * | 9.3 |
| | 3.0 | 0.25 × 0.8 | 0.187 | * | 16.1 |

* There is no diameter for the VCS element and therefore the A/R by diameter cannot be calculated for a comparison with a through hole therefore we take the surface area as a comparison.

In practice the vertical conductive structure 16 may be longer than listed in the table above in order to hold more conductive elements. This will result in even a higher surface area making the plating easier, which again results in less complex plating systems and higher yield reducing the total cost.

The conductive segments 18a and 18b can be constructed of any type of conductive material which is suitable for providing the electrical connection between an internal trace or conductive path, and another internal or external conductive path or trace, with or without external contact pads. Typically, the conductive segments 18a and 18b will be constructed of copper. However, it should be understood that other materials and/or alloys of materials and or combinations of different materials can be utilized in forming the conductive segments 18a and 18b.

The traces 20 are constructed of a conductive material, such as gold or copper.

The filling material 22 is optional, but may be helpful when space is an issue as the filling material 22 permits the contact pads 14 to be positioned over the conductive segments 18a and 18b. The filling material 22 when used acts as a dielectric between the two conductive segments 18a and 18b. The dielectric between the two conductive segments 18a and 18b can be adjusted by varying the size of a channel or slot connecting the holes 24 and 26 or modifying the material forming the filling material 22.

The filling material 22 may be formed of a material having chemical and thermal compatibility with the substrate 12 fabrication processes and materials and is desirably compatible with the various plating baths employed. Also, the filling material 22 should exhibit sufficient flow characteristics in order to fill small aspect ratio plated through-holes (or blind holes) and have the ability to be transformed, cured or converted into a solid material, with a minimal volume change after filling. The thermal expansion of the filling material 22 should be compatible with the rest of the substrate 12. Furthermore, the filling material 22 should exhibit good adhesion to the conductive segments 18.

Referring now to FIGS. 2A-2I, the sequential steps followed to accurately form the vertical conductive structures

16a, 16b and 16c in the substrate 12 will be described. FIG. 2a shows an insulator substrate 40, such as a printed circuit board or a flexible thin-film substrate. Two spatially disposed holes 41 and 43 are formed in the insulator substrate 40 at a desired position, as shown in FIG. 2a and desired angle relative to an upper surface of the insulator substrate 40. For example, the holes 41 and 43 may be formed at an angle substantially normal to the upper surface of the insulator substrate 40. The holes 41 and 43 include a diameter D1, which may be the same or different for each of the holes 41 and 43. The holes 41 and 43 may be formed through the use of a drilling method, but any conventional method, such as milling, punching, laser drilling, water cutting, or photo-definition, can be used. The diameter D1 of the holes 41 and 43 can be any size that is compatible with the other design requirements of the insulator substrate 40. In an embodiment, the diameter D1 of holes 41 and 43 may be in a range between about 0.05 millimeters and about 0.5 millimeters. In some embodiments, the diameter D1 of holes 41 and 43 may be in a range between about 0.1 millimeters and about 0.5 millimeters. The space between the holes 41 and 43 may be between 0.1 millimeters and 0.5 millimeters apart or smaller or bigger, depending upon the accuracy of processing. All or substantially all of the openings or holes in the insulator substrate 40 may be formed at the same time, whether the openings or holes are ultimately to be formed into the vertical conductive structure 16, as described below, or not. This avoids misregistration, especially from tolerance buildups, that can occur between the separate hole forming processes and the subsequently formed wiring patterns that are formed by the use of one or more masks that must be registered with the vertical conductive structure 16. This factor is especially important as a printed circuit boards' wiring patterns become finer and denser.

Thereafter, as shown in FIGS. 2B and 2C, at least a portion of the material between the holes 41 and 43 is removed by formation of a slot 45 in the substrate 40. FIG. 2C is a partial cross-sectional view taken along the lines 2C-2C in FIG. 2B. The slot 45 may have a width W less than the diameter D1 of the two spatially disposed holes 41 and 43. However, the width W of the slot 45 and the diameter D1 of the two spatially disposed holes 41 and 43 may be the same. In an embodiment, the diameter D1 of the two spatially disposed holes 41 and 43 may be smaller than the width W of the slot 45 and could be used as pilot holes. The slot 45 intersects the two spatially disposed holes 41 and 43 in such a way that a sidewall 46 is formed with a dog-bone shaped perimeter, for example. The slot 45 may be formed by the use of a drilling method, but any conventional method, such as routing, milling, punching, laser drilling/cutting/ablation, water cutting, or photo-definition, can be used.

Figure 2E:
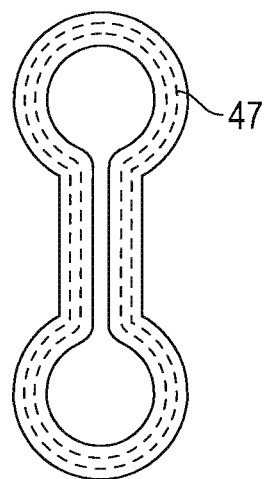

Thereafter, as shown in the cross-sectional view of FIG. 2D and the top plan view of FIG. 2E, a conductive seed layer (not shown) is added followed by the addition of a conductive layer 47 of a first conductive material being deposited on the surfaces of the substrate 40 and sidewall 46 to leave an opening in the substrate 40 surrounded by the conductive layer 47. In an embodiment, the first conductive material is copper and may be deposited to a thickness in the range between about 2.54 micron and about 25 microns, to a thickness of >approximately 5 microns, and to a thickness of approximately 15-25 microns. For a through structure, the thickness may be in a range from about 20 to 25 micron and for a blind structure, the thickness may be about 15 micron, for example. The conductive layer 47 on the sidewall 46 may be thick enough to provide a robust mechanical structure that will survive the thermal fluctuations and aggressive handling experienced by a printed circuit board during subsequent component assembly and usage.

In an embodiment, an electrolytic plating process is used to deposit the conductive layer 47. The electrolytic process may follow a surface preparation step involving either a direct metallization process or an electroless process. The surface preparation step includes depositing a thin conductive seed layer that sensitizes the surface and assists in the adhesion of the conductive layer 47 to the sidewalls 46. Direct metallization comprises depositing a thin conductive molecular layer (not shown) on the substrate surfaces and the vertical conductive structure sidewall 46 prior to depositing the conductive layer 47. The conductive layer 47 may also be palladium or platinum. This process avoids the typical catalytically deposited copper, thereby rendering this device more economically feasible.

The electroless surface preparation process comprises depositing a thin conductive seed layer (not shown), which may be copper, on the surfaces of the substrate 40 and the sidewalls 46 prior to depositing the conductive layer 47, to a thickness in the range between about 30 microns and about 200 microns, and in an embodiment, to a thickness in the range between about 70 microns and about 80 microns.

The surface preparation followed by the electrolytic deposition may result in a non-linear distribution of the conductive layer 47 on the sidewall 46 due to a natural tendency for the thickness of the conductive layer 47 to reduce as a depth of the sidewall 46 increases.

Figure 2F:
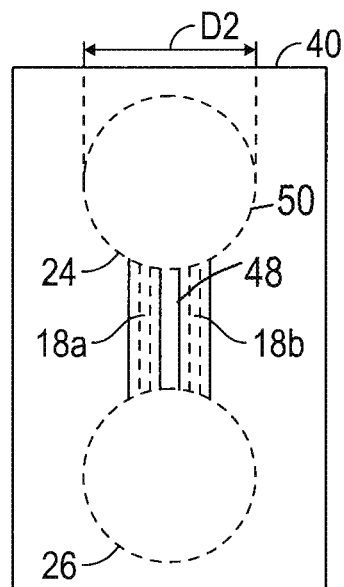

Then, as illustrated in FIG. 2F, the first and second holes 24 and 26 are formed in the substrate 40 with each hole 24 and 26 overlapping the sidewall 46 and the conductive layer 47. Each hole 24 and 26 removes a portion of the conductive layer 47 on the sidewall 46 so that the holes 24 and 26 cooperate to form the electrically isolated segments 18a and 18b from the conductive layer 47. The first and second holes 24 and 26 may be concentric with the holes 41 and 43, but include a diameter D2 that is preferably larger than the diameter D1 of the holes 41 and 43. When drilling, using a bit having a diameter D2 that is larger than the diameter D1 permits the bit to be substantially equally supported by the substrate 40 to assist in preventing lateral deflection of the bit during drilling as the conductive layer 47 is removed and without having to fill the void surrounded by the conductive layer 47 with a filler material prior to drilling.

A cavity 48 may be formed by substrate 40 and the electrically isolated segments 18a and 18b. The first hole 24, the second hole 26, and the cavity 48 cooperate to form final slot 50. In one non-exclusive embodiment, the final slot 50 may have one of the following width-to-length ratios: 1 to 2, 1 to 3, 1 to 1.5, and 1 to 1.6. In one non-exclusive embodiment, the final slot 50 has one of the following width-to-length dimensions and ratios:

| Length of Final Slot 50 | Width of Final Slot 50 | Ratio |
| --- | --- | --- |
| 0.30 mm | 0.15 mm | 2 |
| 0.45 mm | 0.15 mm | 3 |
| 0.30 mm | 0.20 mm | 1.5 |
| 0.40 mm | 0.25 mm | 1.6 |
| 0.75 mm | 0.25 mm | 3 |
| 0.50 mm | 0.25 mm | 2 |

Figure 2G:
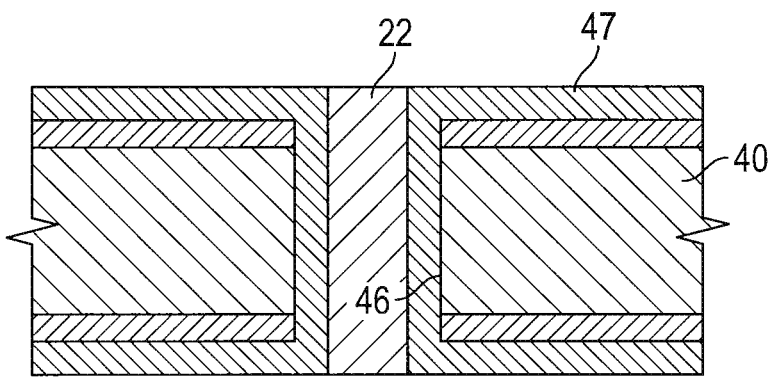

After the first and second holes 24 and 26 are formed in the substrate 40, as illustrated in FIG. 2G, the filling material 22 (which is optional because air serves as a dielectric) may be introduced into the cavity 48 formed by substrate 40 and the electrically isolated segments 18a and 18b. The filling material 22 can be introduced into the cavity 48 by way of any suitable process. For example, the filling material 22 can be introduced into the cavity 48 by way of a squeegee with or without a pattern or stencil or screen. Other manners of introducing the filling material 22 into the cavity 48 may also be used, such as rollers, a pressurized head introducing a pressurized supply of the filling material 22 into the cavity 48, a syringe having a needle inserted into the cavity 48, inkjet printing, or any other manner capable of filling the cavity 48 with the filling material 22. The filling material 22 may be positioned within the cavity 48, so as to avoid the formation of bubbles or pits.

If the filling material 22 is introduced into the cavity 48, and the filling material 22 has cured, the substrate 40 may be planarized employing an abrasive, brush, or other type of planing device so that an outer end of the filling material 22 is substantially coplanar with an outer surface of the conductive layer 47.

Figure 2H:
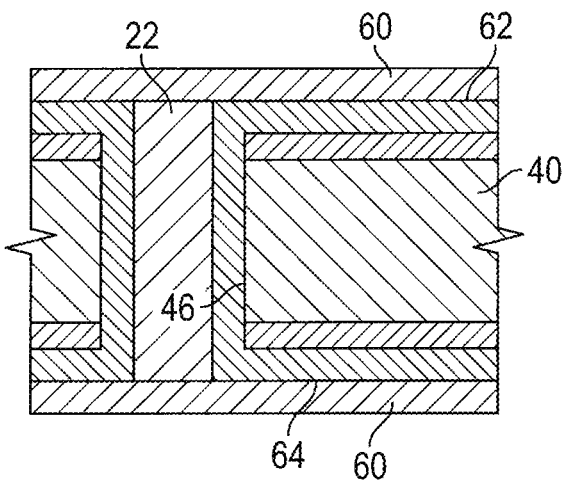
Figure 2I:
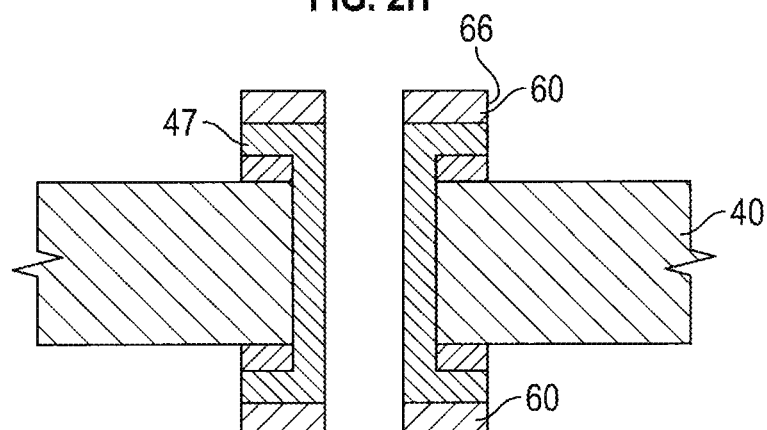

One or more pattern plates 60 are then provided on a first surface 62, and/or a second surface 64 of the substrate 40 as shown in FIG. 2H. The one or more pattern plates 60 include a second conductive layer when plating on the surface of the cured filling material 22 and the electrically isolated segments 18a and 18b. This would be required when the surface mount contact area overlaps into the areas of the substrate 40 having the cured filling material 22 and the electrically isolated segments 18a and 18b. Once this area is plated to the optimum thickness, the substrate 40 is passed through a (image definition process typical called a Strip Etch Strip (Sn is typical used as an etch resist but other materials can be used as well) process employing a "Strip Etch Strip" (SES) line. Examples of "Strip Etch Strip" lines are disclosed in U.S. Pat. No. 6,074,561, the entire content of which is hereby incorporated herein by reference. The Strip Etch Strip process removes portions of the one or more pattern plates 60, and also portions of the layer 47 as shown in FIG. 2I and the base copper from the laminate/copper foil.

Then, the substrate 40 may be finished with a solder mask, surface finish, such as ENIG, and the like to produce the printed circuit board 10. The solder mask can be any suitable solder mask, such as a glossy type version.

Figure 3:
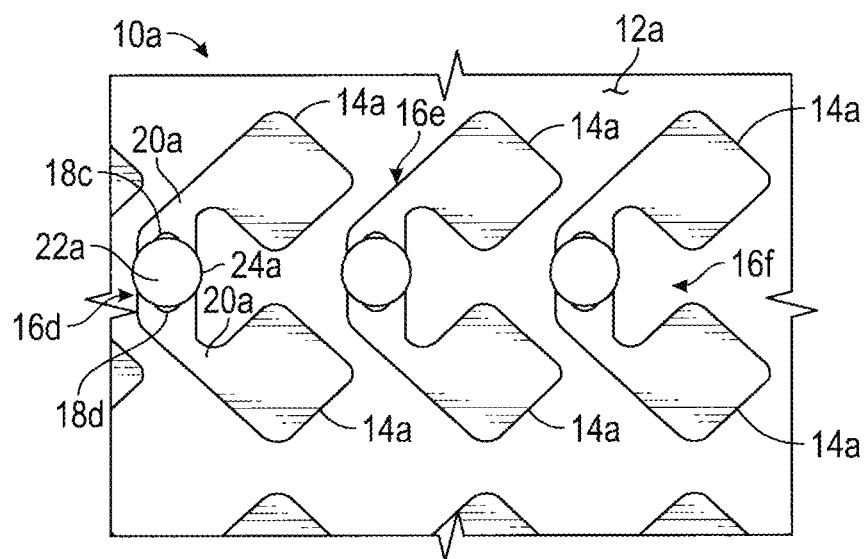
FIG. 3 is a top plan view of a portion of a printed circuit board constructed in accordance with the present invention.

Referring now to FIG. 3, shown therein and designated by a general reference numeral 10a, is a second embodiment of a printed circuit board constructed in accordance with the present invention. The printed circuit board 10a is provided with a substrate 12a, a plurality of contact pads 14a, and a plurality of vertical conductive structures 16 (the vertical conductive structures 16 are designated in FIG. 1 by the reference numerals 16d, 16e, and 16f for purposes of clarity). Each of the vertical conductive structures 16d, 16e, and 16f are similar in construction and function. Thus, only the vertical conductive structure 16d will be described in detail herein. The vertical conductive structure 16d is provided with at least two electrically isolated conductive segments 18c and 18d. Each of the conductive segments 18c and 18d is connected to a separate contact pad 14a by way of a trace 20a, although the conductive segments 18c and 18d can be connected directly to the contact pads 14a. The conductive segments 18c and 18d are electrically isolated by a filling material 22a (non-conductive) interposed between the conductive segments 18c and 18d. As will be discussed in more detail below, the conductive segments 18c and 18d are typically formed by conductive plating which has been separated or cut by the formation of at least one hole 24a.

The substrate 12a can be any material or device capable of being utilized to support electrical components, conductors, and the like. In one preferred embodiment, the substrate 12a includes multiple layers of interleaved conductive paths (or traces) and insulators.

The contact pads 14a can be any type of material or device capable of providing an electrical connection or contact to an external component, such as an integrated circuit. For example, the contact pad 14a can be a surface mount contact, or a ball grid array contact, or solder mask defined common mode contact. This shape can be in the form of round, oval, or multi-sided shapes depending on the optimum routing and bonding criteria.

The vertical conductive structure (V.C.S.) 16d can be used to transfer a differential or common mode type signal where each of the conductive segments 18c and 18d is coupled to a different portion of the differential or common mode signal. In the case of differential type signals the path or running two signals in parallel would with traditional technology be distorted as the vias separate the signal. The following table shows exemplary values of an aspect ratio by surface area for the vertical conductive structure 16d.

| Through hole | Board thickness [mm] | Drill/VCS size [mm] | Surface area [mm²] | A/R By diameter | A/R by surface area |
|---|---|---|---|---|---|
| VCS | 3.0 | 0.25 | 0.049 | 12 | 61.1 |
|  | 3.0 | 0.2 | 0.0314 | 15 | 95.5 |
|  | 3.0 | 0.35 × 1.0 | 0.323 | * | 9.3 |
|  | 3.0 | 0.25 × 0.8 | 0.187 | * | 16.1 |

* There is no diameter for the VCS element and therefore the A/R by diameter cannot be calculated for a comparison with a through hole therefore we take the surface area as a comparison.

In practice, the vertical conductive structure 16d may be longer than listed in the table above in order to hold more conductive elements. This will result in even a higher surface area making the plating easier, which again results in less complex plating systems and higher yield reducing the total cost.

The conductive segments 18c and 18d can be constructed of any type of conductive material which is suitable for providing the electrical connection between an internal trace or conductive path, and another internal or external conductive path or trace, with or without external contact pads. Typically, the conductive segments 18c and 18d will be constructed of copper. However, it should be understood that other materials and/or alloys of materials and or combinations of different materials can be utilized in forming the conductive segments 18c and 18d.

The traces 20a are constructed of a conductive material, such as gold or copper. Any conductive material can be used so long as the conductive material includes a resistance which is suitably low for the particular application of the traces 20a, and structurable to form the traces 20a. Further, the traces 20a may be constructed of a combination of conductive materials. For example, gold may be applied to an underlying material, such as copper and acts as a finish to protect the underlying material against corrosion.

The filling material 22a acts as a dielectric between the two conductive segments 18c and 18d. The dielectric between the two conductive segments 18c and 18d can be adjusted by varying the size of the hole 24a or modifying the material forming the filling material 22a.

The filling material 22a, which is optional, may be formed of a material having chemical and thermal compatibility with the substrate 12a fabrication processes and materials and is desirably compatible with the various plating baths employed. Also, the filling material 22a should exhibit sufficient flow characteristics in order to fill small aspect ratio plated through-holes (or blind holes) and have the ability to be transformed, cured or converted into a solid material, with a minimal volume change after filling. The thermal expansion of the filling material 22a should be compatible with the rest of the substrate 12a. Furthermore, the filling material 22a should exhibit good adhesion to the conductive segments 18c and 18d.

Two exemplary methods for fabricating the printed circuit board 10a will be described hereinafter.

Example 1

Referring now to FIGS. 4A-4I, one example of sequential steps followed to accurately form the vertical conductive structures 16d, 16e and 16f in the substrate 12a (shown in FIG. 3) will be described. FIG. 4A shows an insulator substrate 40a, such as a printed circuit board or a flexible thin-film substrate. At least one hole 41a is formed in the insulator substrate 40a at a desired position, as shown in FIG. 4A and desired angle relative to an upper surface of the insulator substrate 40a. For example, the hole 41a may be formed at an angle substantially normal to the upper surface of the insulator substrate 40a. The hole 41a includes a diameter D3. The hole 41a may be formed through the use of a drilling method, but any conventional method, such as milling, punching, laser drilling, water cutting, or photo-definition, can be used. The diameter D3 of the hole 41 can be any size that is compatible with the other design requirements of the insulator substrate 40a. In an embodiment, the diameter D3 of hole 41a may be in a range between about 0.1 millimeters and about 0.5 millimeters. All or substantially all of the openings or holes in the insulator substrate 40a may be formed at the same time, whether they are ultimately to be formed into the vertical conductive structure 16, as described below, or not. This avoids misregistration, especially from tolerance buildups, that can occur between the separate hole forming processes and the subsequently formed wiring patterns that are formed by the use of one or more masks that must be registered with the vertical conductive structure 16d. This factor is especially important as a printed circuit boards' wiring patterns become finer and denser.

Thereafter, as shown in FIGS. 4B and 4C, a slot 45a is formed in the substrate 40a with the hole 41a being used to move a bit into the substrate 40a, preferably without contacting the substrate 40a. The bit can then be reciprocated in a lateral direction to remove material outside of the confines of the hole 41a to form the slot 45a. The slot 45a has a width W3 less than the diameter D3 of the hole 41a. The slot 45a intersects the hole 41a in such a way that a sidewall 46a is formed with a perimeter. The slot 45a may be formed by the use of a routing method with a bit as described herein, but any conventional method, such as milling, punching, laser drilling/cutting/ablation, water cutting, or photo-definition, can be used.

Thereafter, as shown in FIG. 4D, a conductive seed layer (not shown) is added followed by the addition of a conductive layer 47a of a first conductive material being deposited on the surfaces of the substrate 40a and sidewall 46a to leave an opening in the substrate 40a surrounded by the conductive layer 47a. In an embodiment, the first conductive material is copper and may be deposited to a thickness in the range between about 2.54 microns and about 25 microns, to a thickness between 15 microns and 25 microns, or to a thickness of approximately 15 microns. The conductive layer 47a on the sidewall 46a may be sufficiently thick to provide a robust mechanical structure that will survive the thermal fluctuations and aggressive handling experienced by a printed circuit board during subsequent component assembly and usage. For a through structure, the thickness may be in a range from about 20 to 25 microns and for a blind structure, the thickness may be about 15 microns, for example.

In an embodiment, an electrolytic plating process is used to deposit the conductive layer 47a. The electrolytic process may follow a surface preparation step involving either a direct metallization process or an electroless process. The surface preparation step includes depositing a thin conductive seed layer that sensitizes the surface and assists in the adhesion of the conductive layer 47a to the sidewalls 46a. Direct metallization comprises depositing a thin conductive molecular layer (not shown) on the substrate surfaces and the sidewall 46a prior to depositing the conductive layer 47a. The conductive layer 47a may also be palladium or platinum. This process avoids the typical catalytically deposited copper, thereby rendering this device more economically feasible.

The electroless surface preparation process comprises depositing a thin seed conductive layer (not shown), which may be copper, on the surfaces of the substrate 40a and the sidewalls 46a prior to depositing the conductive layer 47a, to a thickness in the range between about 3 microns and about 20 microns, and in an embodiment, to a thickness in the range between about 70 microns and about 80 microns.

The surface preparation followed by the electrolytic deposition may result in a non-linear distribution of the conductive layer 47a on the sidewall 46a due to a natural tendency for the thickness of the conductive layer 47 to reduce as a depth of the sidewall 46a increases.

Then, as illustrated in FIG. 4E, the hole 24a is formed in the substrate 40a with the hole 24a concentric with the hole 41a and also overlapping the sidewall 46a and the conductive layer 47a. The hole 24a removes a portion of the conductive layer 47a on the sidewall 46a so that the hole 24a forms the electrically isolated segments 18c and 18d from the conductive layer 47a. The hole 24a may include a diameter D4 that is preferably larger than the diameter D3 of the hole 41a. When drilling, using a bit having a diameter D4 that is larger than the diameter D3 permits the bit to be substantially equally supported by the substrate 40a as the conductive layer 47a is removed to assist in preventing deflection of the bit during drilling and without having to fill the void surrounded by the conductive layer 47a with a filler material prior to drilling.

After the hole 24a is formed in the substrate 40a, as illustrated in FIG. 4F, the filling material 22a may be introduced into a cavity 48a formed by substrate 40a and the electrically isolated segments 18c and 18d. The filling material 22a can be introduced into the cavity 48a by way of any suitable process. For example, the filling material 22a can be introduced into the cavity 48a by way of a squeegee with or without a pattern or stencil or screen. Other manners of introducing the filling material 22a into the cavity 48a may also be used, such as rollers, a pressurized head introducing a pressurized supply of the filling material 22a into the cavity 48a, a syringe having a needle inserted into the cavity 48a, inkjet printing, or any other manner capable of filling the cavity 48a with the filling material 22a. The filling material 22a may be positioned within the cavity 48a, so as to avoid the formation of bubbles or pits.

Once the filling material 22a is introduced into the cavity 48a, and the filling material 22a has cured, the substrate 40a may be planarized employing an abrasive, brush, or other type of planing device so that an outer end of the filling material 22a is substantially coplanar with an outer surface of the conductive layer 47a.

One or more pattern plates 60a are then provided on a first surface 62a, or a second surface 64a of the substrate 40a as shown in FIGS. 4G and 4H. The one or more pattern plates (the pattern plate can be done as a panel plate or combination of both, this applies for all plating processes) 60a include a second conductive layer when plating on the surface of the cured filling material 22a and the electrically isolated segments 18c and 18d. This would be required when the surface mount contact area overlaps into the areas of the substrate 40a having the cured filling material 22a and the electrically isolated segments 18c and 18d. Once this area is plated to the optimum thickness, the substrate 40a is passed through an image definition process typically called a Strip Etch Strip ($S_n$ is typically used as an etch resist but other materials can be used as well) process employing a "Strip Etch Strip" (SES) line. Examples of "Strip Etch Strip" lines are disclosed in U.S. Pat. No. 6,074,561, the entire content of which is hereby incorporated herein by reference. The Strip Etch Strip process removes portions of the one or more pattern plates 60a, and also portions of the layer 47a as shown in FIG. 4I and the base copper from the laminate/copper foil.

Then, the substrate 40a may be finished with a solder mask, surface finish, such as ENIG, and the like to produce the printed circuit board 10a. The solder mask can be any suitable solder mask, such as a glossy type version.

Example 2

Referring now to FIGS. 5A-5I, another example of sequential steps followed to accurately form the vertical conductive structures 16d, 16e and 16f in the substrate 12a will be described. FIG. 5A shows an insulator substrate 40b, such as a printed circuit board or a flexible thin-film substrate. At least one slot 45b is formed in the insulator substrate 40b at a desired position, as shown in FIGS. 5A and 5B and desired angle relative to an upper surface of the insulator substrate 40b. For example, the slot 45b may be formed at an angle substantially normal to the upper surface of the insulator substrate 40b. The slot 45b is formed in the substrate 40b in such a way that a sidewall 46b is formed with a perimeter. The slot 45b includes a length L5 and a width W5. The slot 45b may be formed through the use of a milling method, but any conventional method, such as routing, punching, laser drilling, water cutting, or photo-definition, can be used. The length L5 and width W5 of slot 45b can be any size that is compatible with the other design requirements of the insulator substrate 40b. All or substantially all of the openings or holes in the insulator substrate 40b may be formed at the same time, whether they are ultimately to be formed into the vertical conductive structures 16d, 16e and 16f, as described below, or not. This avoids misregistration, especially from tolerance buildups, that can occur between the separate hole forming processes and the subsequently formed wiring patterns that are formed by the use of one or more masks that must be registered with the vertical conductive structure 16. This factor is especially important as a printed circuit boards' wiring patterns become finer and denser.

Thereafter, as shown in FIG. 5C, a conductive seed layer (not shown) is added followed by the addition of a conductive layer 47b of a first conductive material being deposited on the surfaces of the substrate 40b and sidewall 46b to leave an opening in the substrate 40b surrounded by the conductive layer 47b. In an embodiment, the first conductive material is copper and may be deposited to a thickness in the range between about 2.54 microns to about 25 microns, or to a thickness in the range of approximately 5 microns to approximately 25 microns, or to a thickness of approximately 15 microns. The conductive layer 47b on the sidewall 46b may be sufficiently thick to provide a robust mechanical structure that will survive the thermal fluctuations and aggressive handling experienced by a printed circuit board during subsequent component assembly and usage. As discussed above, for a through structure, the thickness may be in a range from about 20 to 25 microns and for a blind structure, the thickness may be about 15 microns, for example.

In an embodiment, an electrolytic plating process is used to deposit the conductive layer 47b. The electrolytic process may follow a surface preparation step involving either a direct metallization process or an electroless process. The surface preparation step includes depositing a thin conductive seed layer that sensitizes the surface and assists in the adhesion of the conductive layer 47b to the sidewalls 46b. Direct metallization comprises depositing a thin conductive molecular layer (not shown) on the substrate surfaces and the vertical conductive structure sidewall 46b prior to depositing the conductive layer 47b. The conductive layer 47b may also be palladium or platinum. This process avoids the typical catalytically deposited copper, thereby rendering this device more economically feasible.

The electroless surface preparation process comprises depositing a thin conductive seed layer (not shown), which may be copper, on the surfaces of the substrate 40b and the sidewalls 46b prior to depositing the conductive layer 47b, to a thickness in the range between about 30 microns and about 200 microns, and in an embodiment, to a thickness in the range between about 70 microns and about 80 microns.

The surface preparation followed by the electrolytic deposition results in a highly linear distribution of the conductive layer 47b on the sidewall 46b.

Then, as illustrated in FIG. 5D, the hole 24a is formed in the substrate 40b with the hole 24a overlapping the sidewall 46b and the conductive layer 47b. The hole 24a removes a portion of the conductive layer 47b on the sidewall 46b so that the hole 24a forms the electrically isolated segments 18c and 18d from the conductive layer 47b. The hole 24a may include a diameter D6 that is preferably larger than the width W5 of the slot 45b. When drilling, using a bit having a diameter D6 that is larger than the width W5 permits the bit to be substantially equally supported by the substrate 40b while removing the conductive layer 47b to assist in preventing lateral deflection of the bit during drilling and without having to fill the void surrounded by the conductive layer 47b with a filler material prior to drilling.

After the hole 24a is formed in the substrate 40b, as illustrated in FIG. 5E, a filling material 22b may be introduced into a cavity 48b formed by substrate 40b and the electrically isolated segments 18c and 18d. The filling material 22b can be introduced into the cavity 48b by way of any suitable process. For example, the filling material 22b can be introduced into the cavity 48b by way of a squeegee with or without a pattern or stencil or screen. Other manners of introducing the filling material 22b into the cavity 48b may also be used, such as rollers, a pressurized head introducing a pressurized supply of the filling material 22b into the cavity 48b, a syringe having a needle inserted into the cavity 48b, inkjet printing, or any other manner capable of filling the cavity 48b with the filling material 22b. The filling material 22b may be positioned within the cavity 48b, so as to avoid the formation of bubbles or pits.

Once the filling material 22b is introduced into the cavity 48b, and the filling material 22b has cured, the substrate 40b may be planarized employing an abrasive, brush, or other type of planing device so that an outer end of the filling material 22b is substantially coplanar with an outer surface of the conductive layer 47b.

One or more pattern plates 60b are then provided on a first surface 62b, or a second surface 64b of the substrate 40b as shown in FIGS. 5F and 5G. The one or more pattern plates 60b include a second conductive layer when plating on the surface of the cured filling material 22b and the electrically isolated segments 18c and 18d. This would be required when the surface mount contact area overlaps into the areas of the substrate 40b having the cured filling material 22b and the electrically isolated segments 18c and 18d. Once this area is plated to the optimum thickness, the substrate 40b is passed through a Strip Etch Strip ($S_n$ is typically used as an etch resist but other materials can be used as well) process employing a "Strip Etch Strip" (SES) line. Examples of "Strip Etch Strip" lines are disclosed in U.S. Pat. No. 6,074,561, the entire content of which is hereby incorporated herein by reference. The Strip Etch Strip process removes portions of the one or more pattern plates 60b, and also portions of the conductive layer 47b as shown in FIG. 5H. As shown in dashed lines in FIG. 5G, the conductive layer 47b on the sidewall 46b of the vertical conductive structure 42b, and a rim 66b formed by the conductive layer 47b defines a perimeter of the vertical conductive structure 42b.

Then, the substrate 40a may be finished with a solder mask, surface finish, such as ENIG, and the like to produce the printed circuit board 10a. The solder mask can be any suitable solder mask, such as a glossy type version.

Shown in FIGS. 6-16 are various examples of the substrate 12 having the vertical conductive structures 16, and traces 20 interconnected with selected ones of the conductive segments 18 of the vertical conductive structures 16. The FIGS. 6-16 are partial perspective views of examples of the substrate 12 and are not intended to show multiple views of the same example. FIGS. 6-16 are numbered to show generally where elements are located in the figures, but the same reference numeral, e.g., 16a, in FIGS. 6-16 is not intended to show the exact same element.

Figure 6:
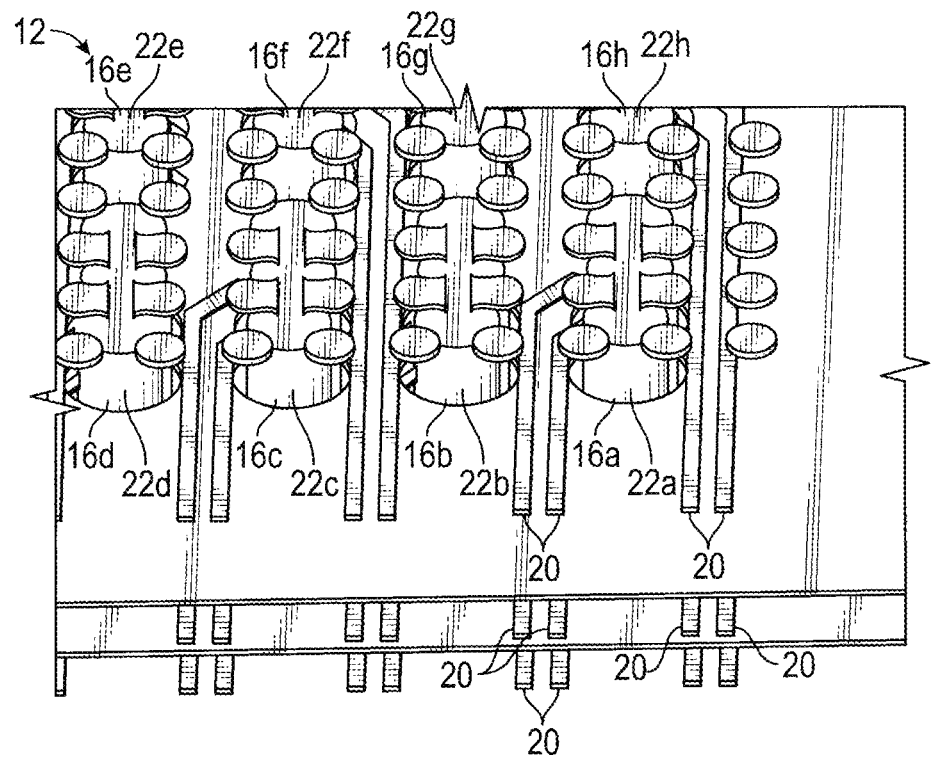
FIGS. 6-16 are various partial perspective views of exemplary substrates with vertical conductive structures (VCS) constructed in accordance with the present disclosure.

FIG. 6 is a partial perspective view showing multiple VCS 16a-h extending vertically through multiple layers of an exemplary multi-layered substrate 12 and with electrically isolated conductive segments of the VCS 16a-h connected to traces 20 at three different layers (and without all of the traces being numbered for purposes of clarity). One skilled in the art will understand that the techniques disclosed herein for forming the multiple VCS 16a-h create more routing space under a BGA type component and more space for the traces 20 used to convey power and ground signals to be positioned directly underneath the BGA type component.

Figure 7:
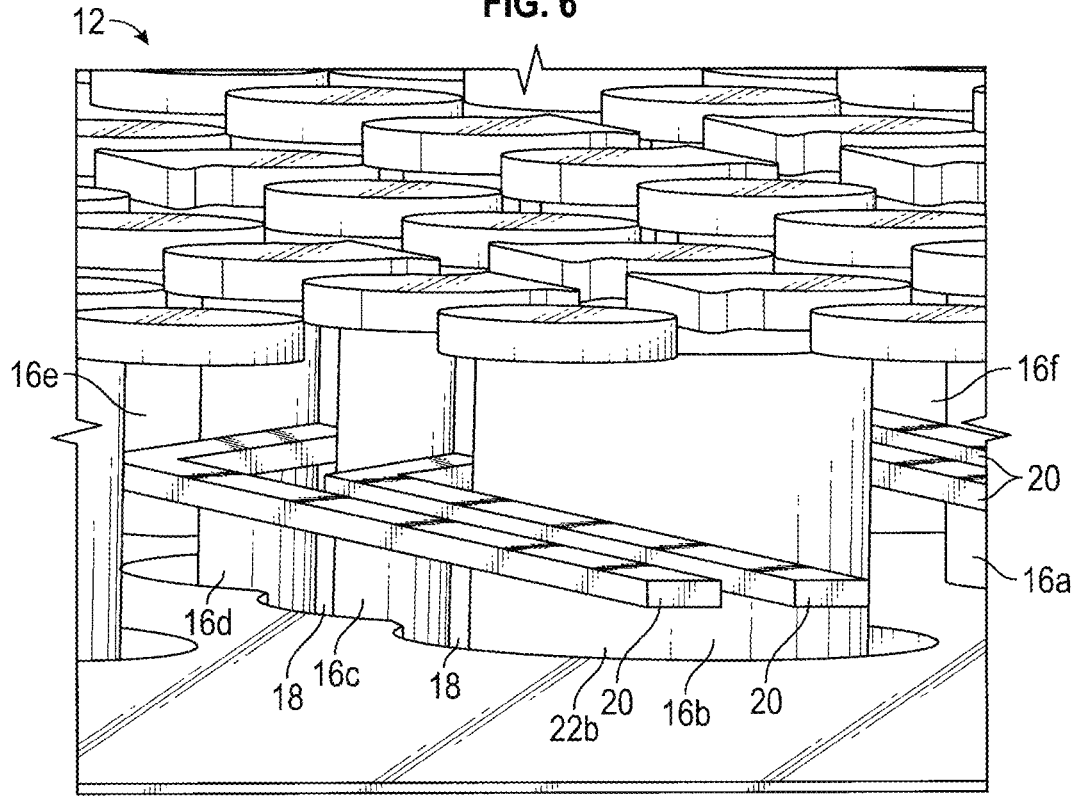

FIG. 7 is a partial perspective view of an exemplary multi-layered substrate 12 in which traces 20 extend through an interior layer of the substrate 12 from the VCS 16a-f.

Figure 8:
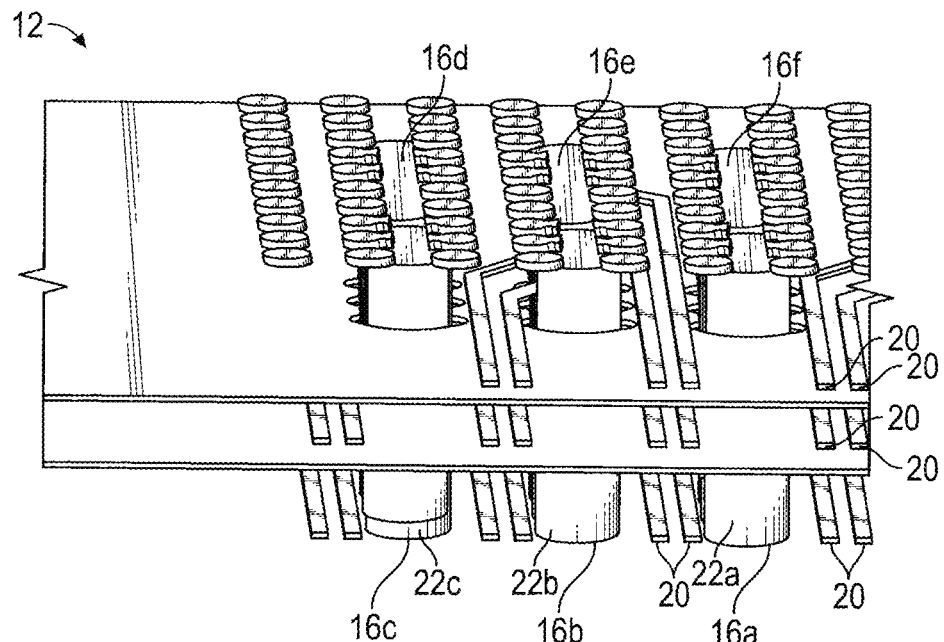

FIG. 8 is a partial perspective view of the substrate 12 showing a ball grid array with multiple VCS 16a-f having electrically isolated conductive segments connected to traces 20 and extending through multiple layers. The ball grid array of FIG. 8 can be a 0.5 mm ball grid array.

Figure 9:
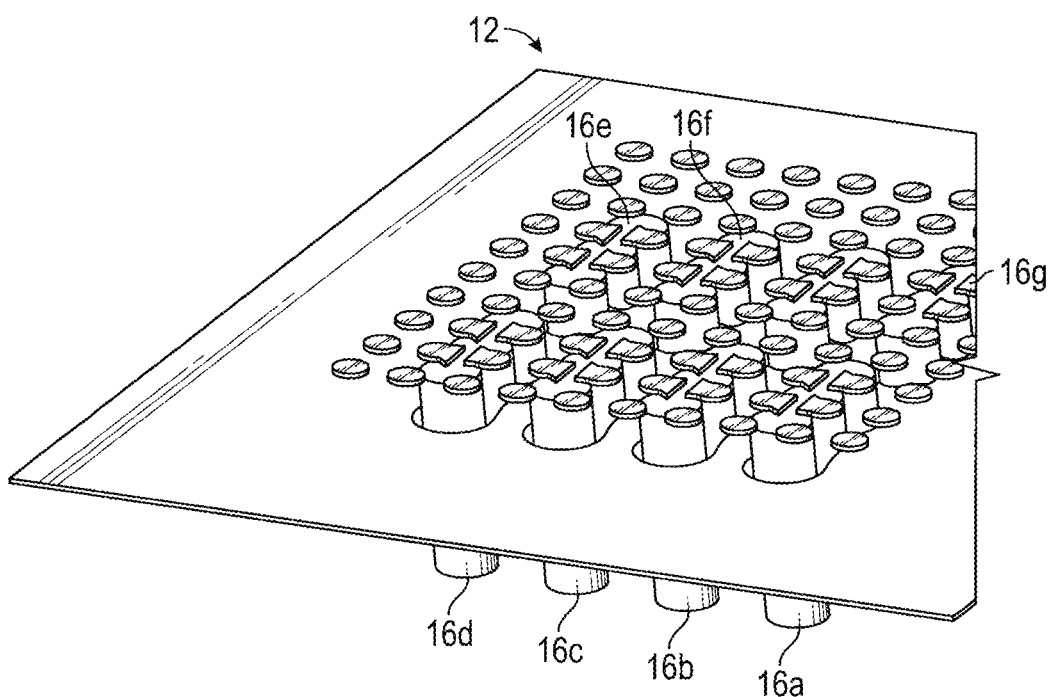

FIG. 9 is a partial perspective view of the substrate 12 showing a ball grid array shown on filling material 22 of six vertical conductive structures 16a-f with internal traces and multiple layers omitted. The ball grid array of FIG. 9 can be a 0.5 mm ball grid array.

Figure 10:
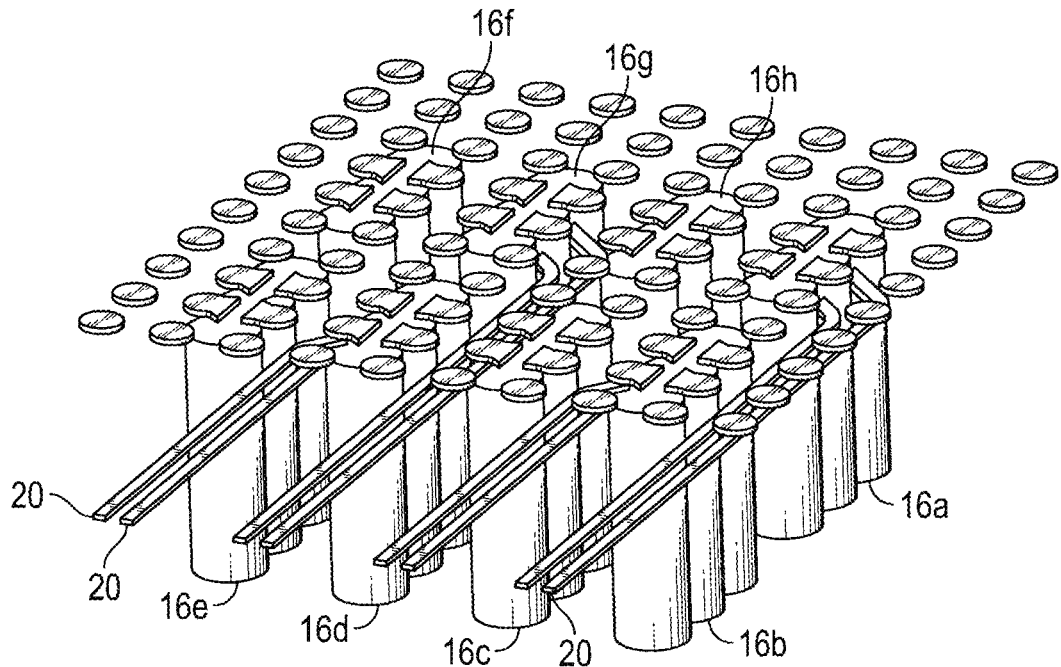

FIG. 10 is a partial perspective view of the substrate 12 showing traces 20 extending from multiple VCS 16a-h.

Figure 11:
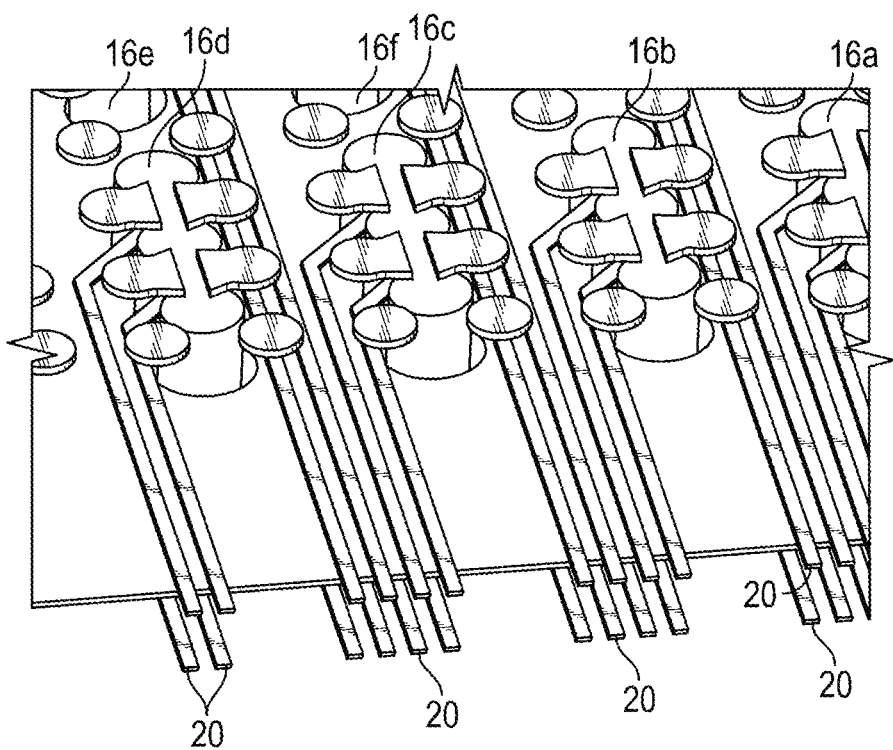

FIG. 11 is a partial perspective view of the substrate 12 showing traces 20 extending from VCS 16a-f at multiple layers.

Figure 12:
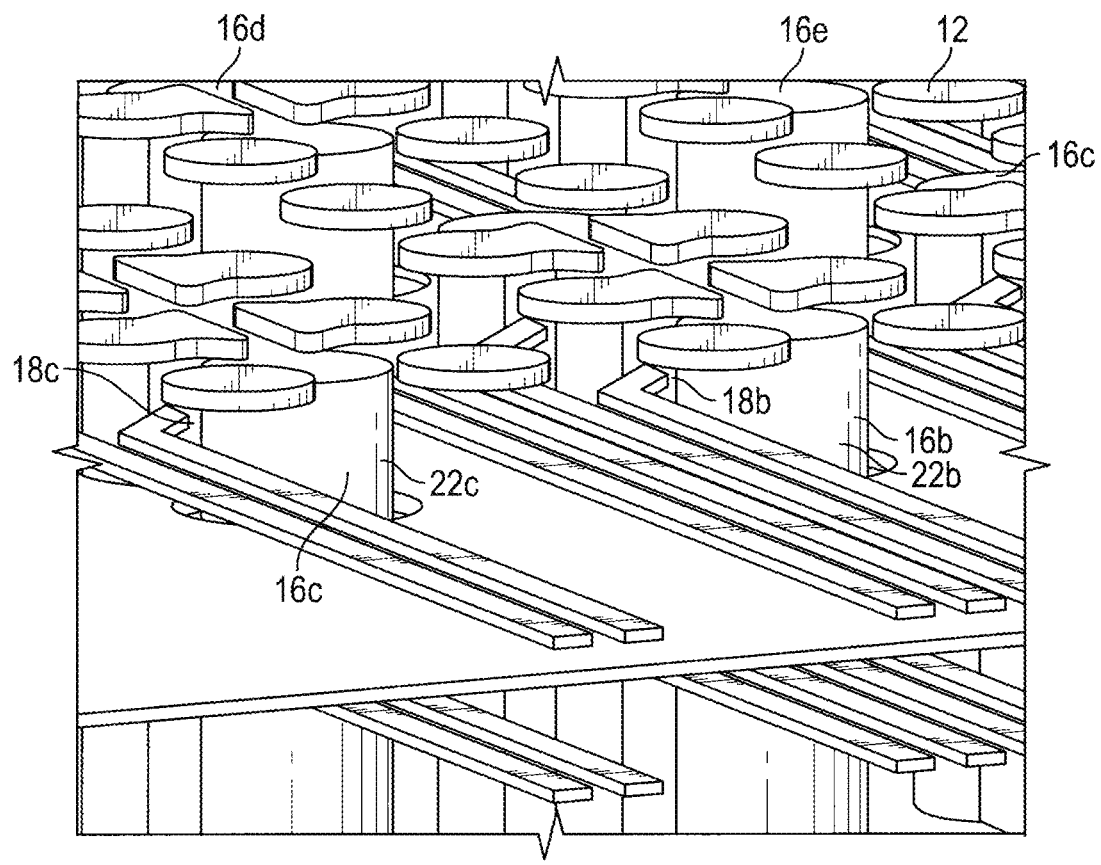

FIG. 12 is a partial perspective view of the substrate 12 having traces 20 extending from VCS 16a-f at multiple layers of the substrate 12.

Figure 13:
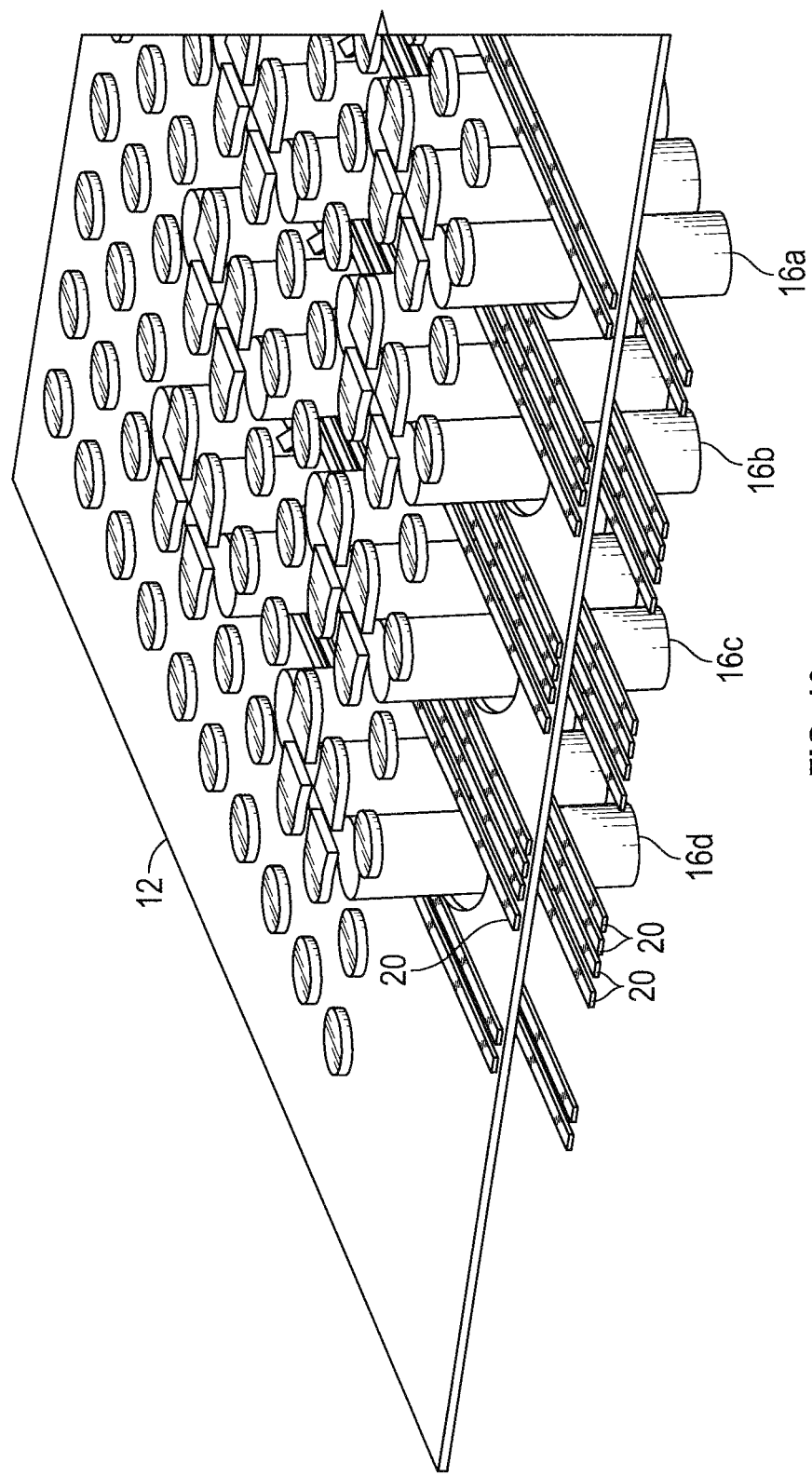

FIG. 13 is another partial perspective view of the substrate 12 having traces electrically connected and extending from VCS 16a-d at multiple layers.

Figure 14:
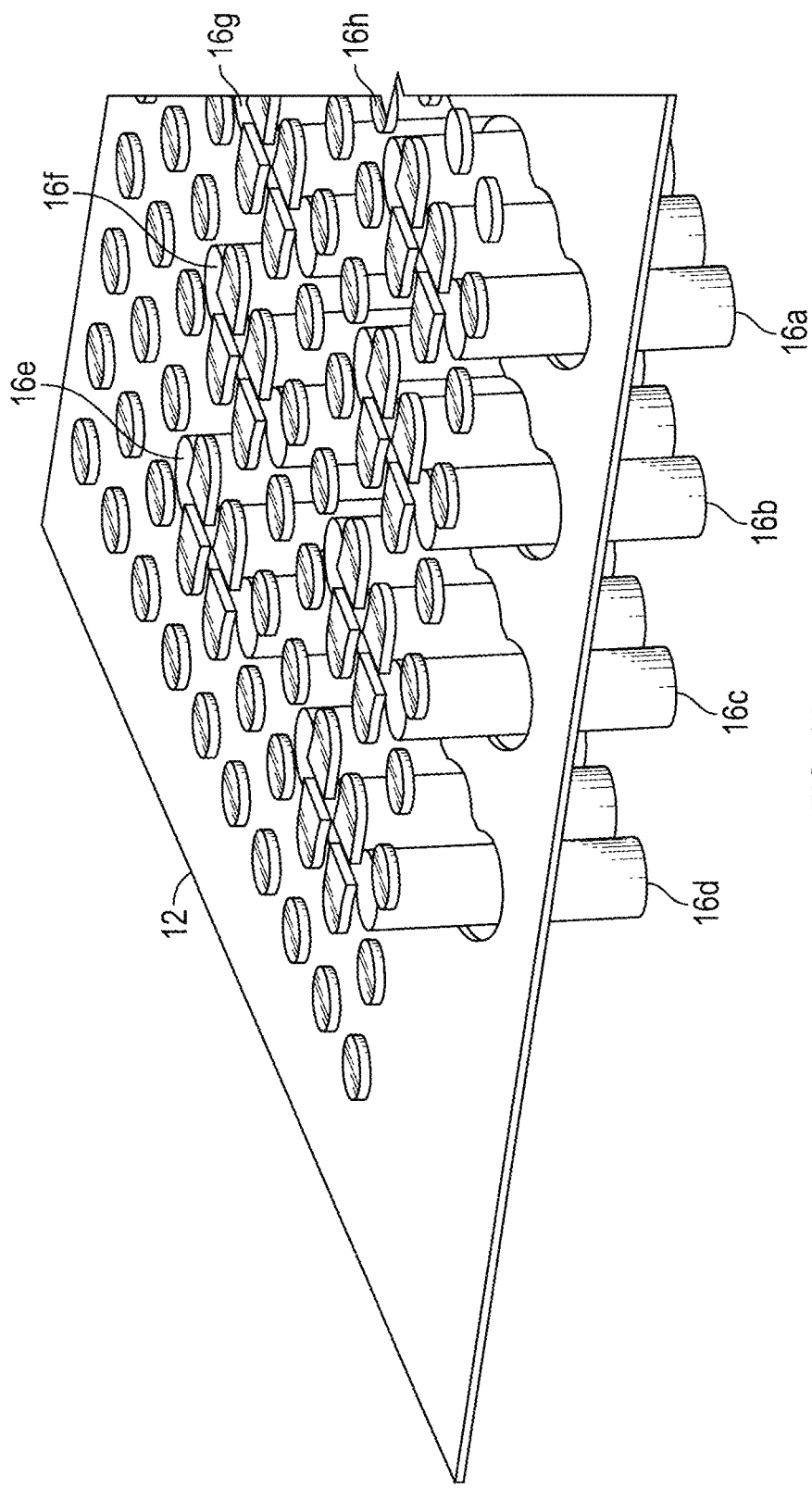

FIG. 14 is another partial perspective view of the substrate 12 having a 0.7 mm ball grid array shown positioned on multiple VCS 16a-h without traces shown.

Figure 15:
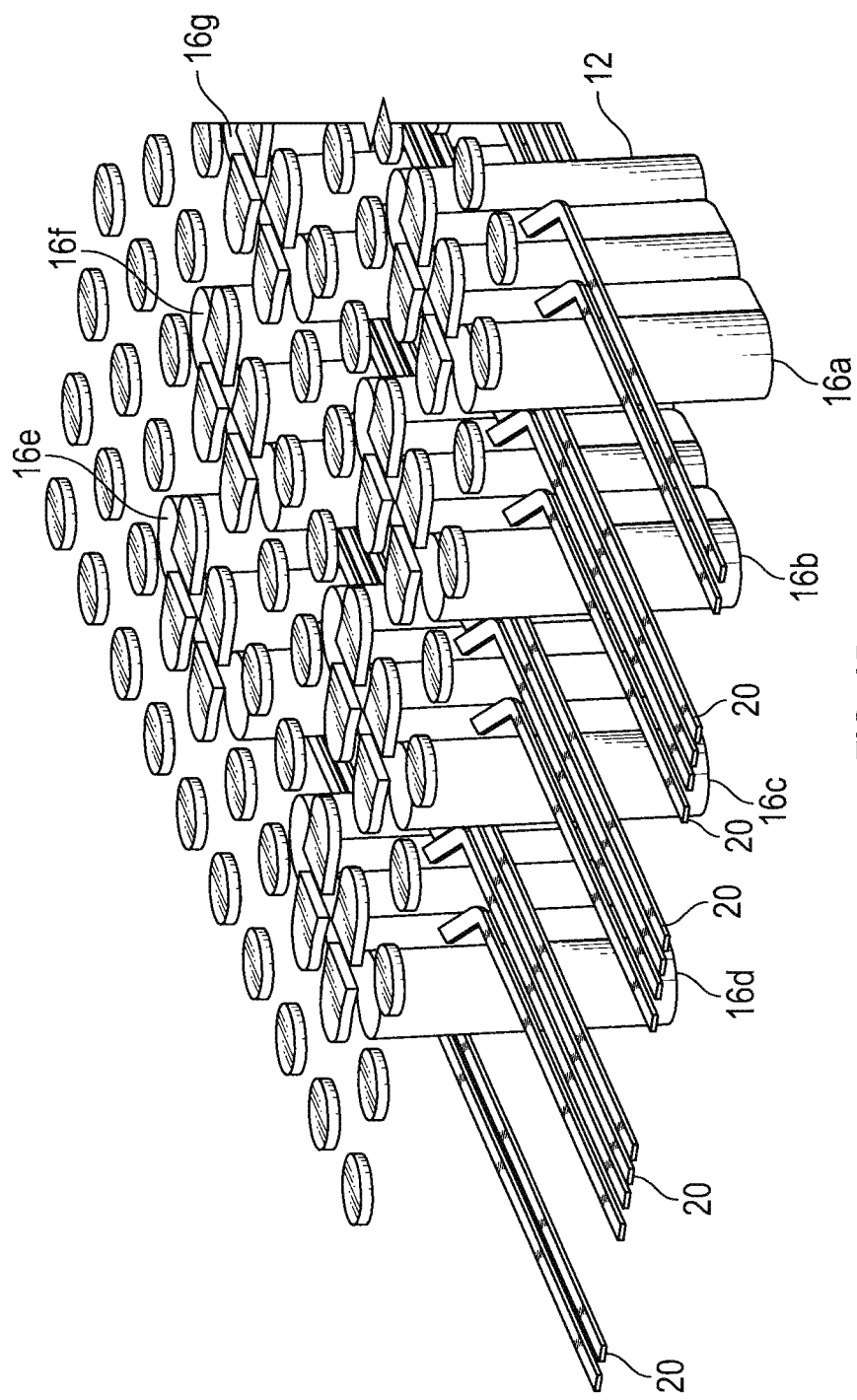

FIG. 15 is another partial perspective view of the substrate 12 with the ball grid array showing the VCS 16a-f showing electrically isolated conductive segments connected to traces 20 and extending from the VCS 16a-f. The ball grid array of FIG. 15 can be a 0.7 mm ball grid array.

Figure 16:
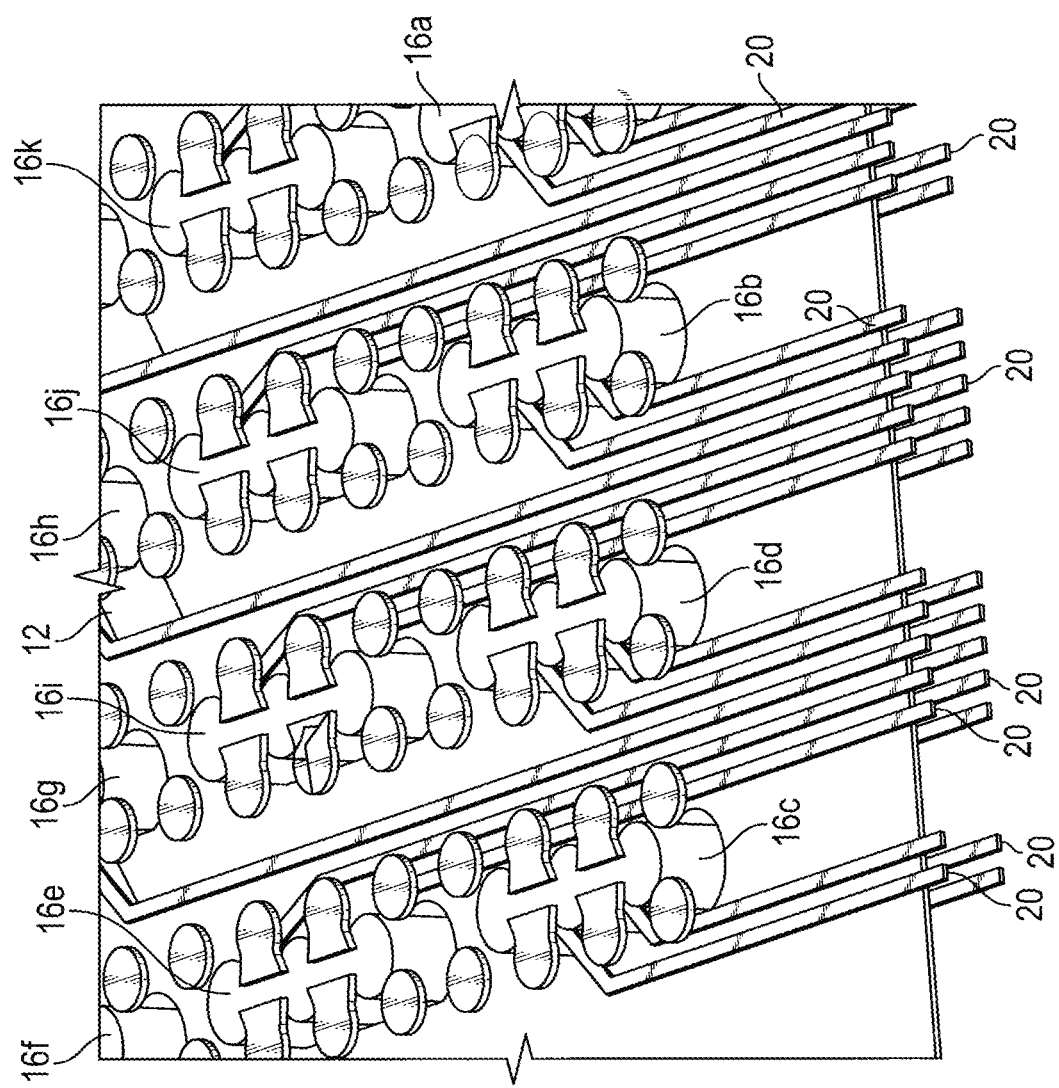

FIG. 16 is another partial perspective view of the substrate 12 showing traces 20 extending from multiple VCS 16a-k at multiple layers of the substrate 12.

Figure 17:
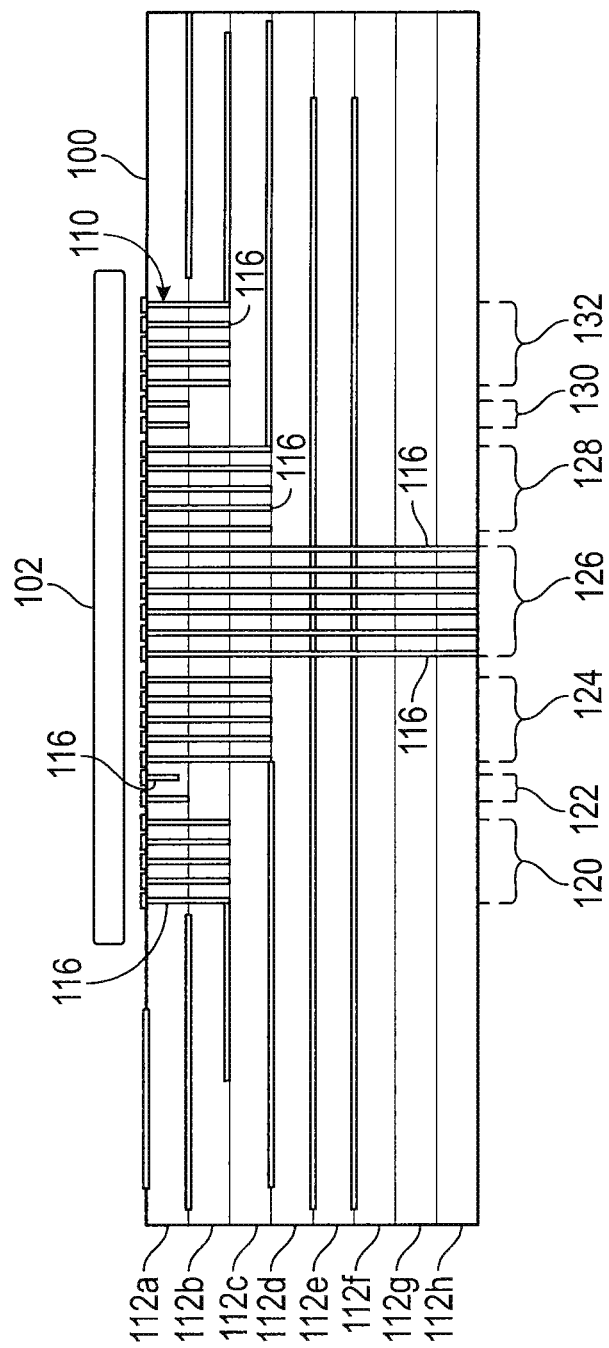
FIG. 17 is another example of a substrate having a vertical conductive structure constructed in accordance with the present invention in which the vertical conductive structure has conductive segments extending to differing layers and depths within the substrate. The conductive segments which extend to a certain layer are blind structures. The vertical conductive structure also has conductive segments extending through the substrate, which are through structures. When forming the vertical conductive structure of FIG. 17, forming a slot with portions extending to certain layers and other portions extending all of the way through the substrate enhances the circulation of fluid through the slot when applying platings and other materials to the substrate within the slot.

Although the vertical conductive structures 16a-f have been shown and described herein as through structures, it should be understood that the vertical conductive structures 16 can also be formed as blind structures, buried structures and combinations thereof. For example, FIG. 17 shows a cross-sectional diagram of a circuit board 100 with a BGA type of component 102 mounted to one or more vertical conductive structures 110 in accordance with the present disclosure. The circuit board 100 includes eight layers 112 that are numbered as 112a, 112b, 112c, 112d, 112e, 112f, 112g and 112h.

The one or more vertical conductive structure 110 can be constructed similar to the vertical conductive structures 16 discussed above, with the exception that when the final slot 50 is formed in the substrate 12, the final slot 50 is formed with a first region of the final slot 50 extending through a first number of layers of the substrate 12, and a second region of the final slot 50 extending through a second number of layers of the substrate 12, and with the first number of layers being different from the second number of layers. In certain instances, the substrate has N-layers, which in this example is eight layers, and the first number of layers may be equal to the N-layers. In this instance the first region would extend through the entire substrate 12.

For example, as shown, the vertical conductive structure 110 may include seven regions 120, 122, 124, 126, 128, 130 and 132. Each of the regions 120, 122, 124, 126, 128, 130 and 132 has one or more conductive segments 116 (only a few being numbered for purposes of clarity) that extend to a preselected depth within the circuit board 100, which may be the same as or different than the depths that the one or more conductive segments 116 extend to in the other regions 120, 122, 124, 126, 128, 130 and 132. For example, the region 120 includes five conductive segments 116 that extend to the same depth (through the layers 112a and 112b) as the five conductive segments 116 in the region 132, i.e., passing through two layers of the circuit board 100 and have the same functionality of a conventional blind via. Further, the conductive segments 116 in the region 122 only extend through a single layer of the circuit board 100 and have the same functionality of a blind via. The conductive segments 116 in the region 126 extend all of the way through the circuit board 100 and have the same functionality as a conventional through via. Further, prior to the formation of the conductive segments 116, forming a slot all of the way through the circuit board 100 enhances the ability of fluids to flow into the slot and thereby assists in forming the conductive layers 47, 47a and 47b as discussed above with reference to FIGS. 2D, 4D and 5E. The circuit board 100 can be formed in the manners described above for making the circuit board 10 using controlled-depth milling (i.e., milling at different depths) to form a cavity which is subsequently plated and then subjected to separated drilling, milling or other operation to remove preselected portions of the conductive layer to form the conductive segments 116, as well as removing any conductive material or etchresist from a bottom of the slot to electrically isolate the conductive segments 116.

Figure 18:
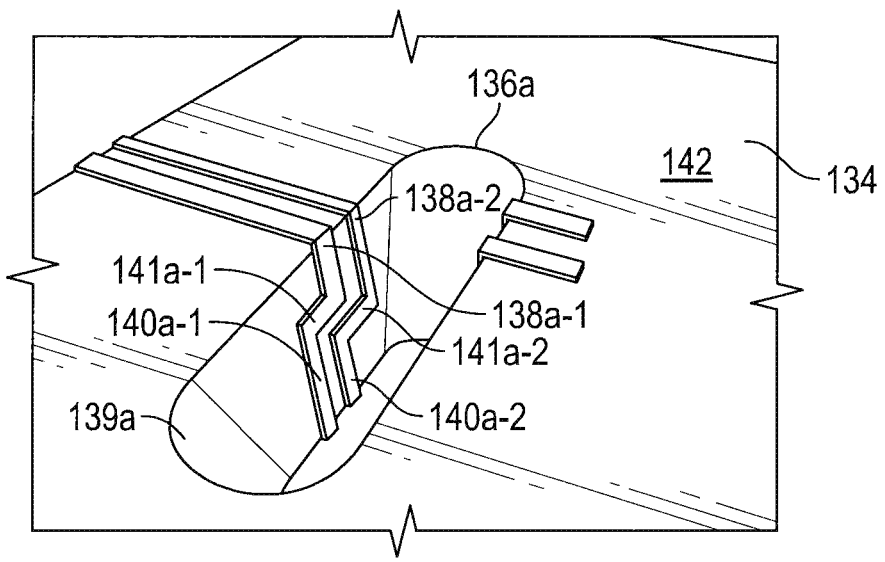
FIG. 18 is yet another example of a substrate having a vertical conductive structure constructed in accordance with the present disclosure in which the vertical conductive structure has one or more trace extending along a sidewall in a non-linear configuration.
Figure 19:
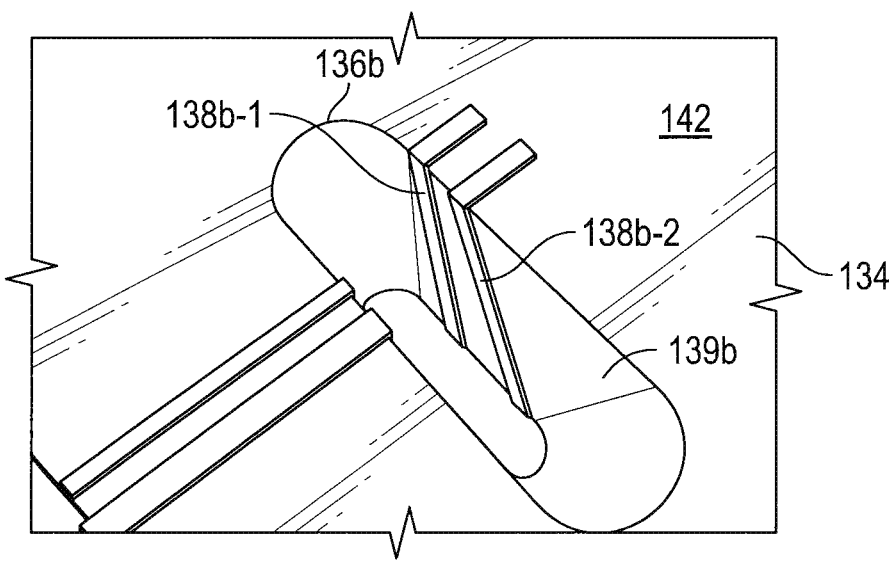
FIG. 19 is yet another example of a substrate having a vertical conductive structure constructed in accordance with the present disclosure in which the vertical conductive structure has multiple traces extending along a sidewall in a non-parallel configuration and with at least one of the traces extending at an angle relative to the upper surface at less than or greater than 90 degrees.

FIGS. 18 and 19 show other embodiments of a substrate 134 of a multi-layer circuit board having vertical conductive structures 136a (FIG. 18) and 136b (FIG. 19) constructed in accordance with the present disclosure. The vertical conductive structures 136a and 136b include a plurality of traces 138a-1, 138a-2, 138b-1 and 138b-2 extending on a sidewall 139a and 139b. As shown, the traces 138a-1 and 138a-2 have two first portions 140a-1 and 140a-2 that extend vertically on the sidewall 139a, and one second portions 141a-1 and 141a-2 that extend horizontally on the sidewall 139a. The traces 138b-1 and 138b-2 extend on the sidewall 139b in a manner that is not parallel with one another, and are also at a non-90 degree angle with respect to an upper surface 142 of the substrate 134. The configurations of the traces 138a-1, 138a-2, 138b-1 and 138b-2 are shown by way of example, and it should be understood that the traces 138a-1, 138a-2, 138b-1 and 138b-2 can have a variety of shapes, including linear portions, arc shaped portions and combinations of linear and arc shaped portions that connect with traces (not shown) that are internal or external to the substrate 134. The vertical conductive structures 136a (FIG. 18) and 136b (FIG. 19) are shown in a through hole configuration, but the vertical conductive structures 136a (FIG. 18) and 136b (FIG. 19) could be constructed in a blind configuration as well.

Figure 20:
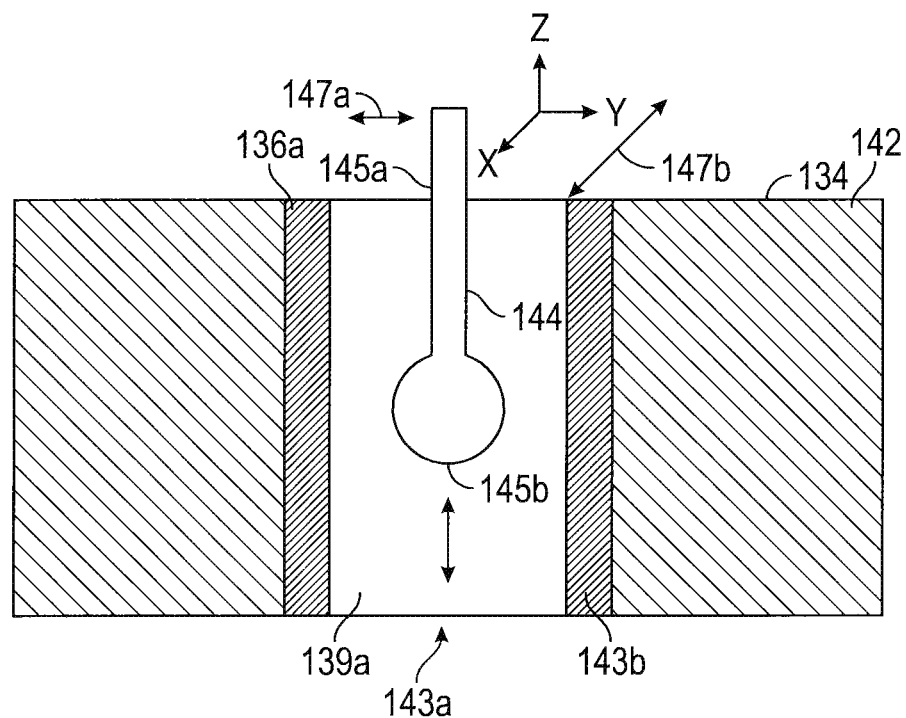
FIG. 20 is a cross-sectional view of a substrate having a slot in which a router bit is disposed and guided to form the traces depicted in FIG. 18 or 19. The router bit in the example can have a ball tip but also may have any other shape of tip extending outwardly from the router bit shaft such that the router bit shaft does not touch the sidewall of the VCS when the tip is engaging the sidewall. The sidewalls of the VCS do not need to be normal to the upper surface of the substrate, or parallel to one another, but can be angled toward each other in the form of a tapered slot.
Figure 21:
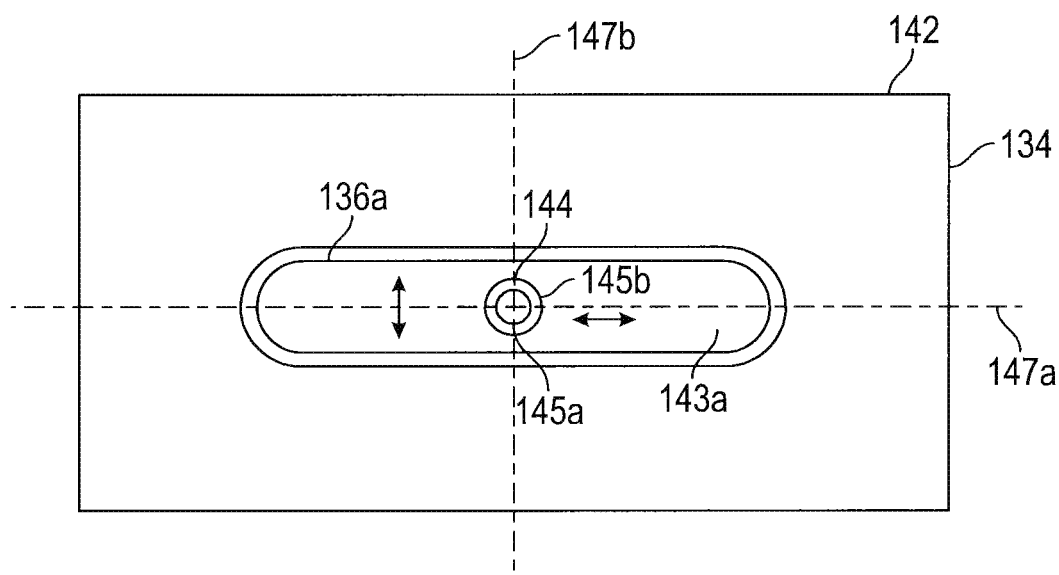
FIG. 21 is a top plan view of the substrate of FIG. 20 showing the router bit positioned within the slot of the substrate.

Shown in FIGS. 20 and 21 is an exemplary methodology for forming the traces 138a-1, 138a-2, 138b-1 and 138b-2. The vertical conductive structures 136a and 136b can be formed as discussed above by forming a slot 143a within the substrate 134, and then applying a plating of conductive material 143b to the sidewalls 139a and 139b of the slot 143a. As discussed above, the conductive material 143b can be gold or copper, for example. Then, a router bit 144 having a shaft 145a and a cutting end 145b is disposed into the slot 143a. The cutting end 145b extends outwardly beyond the perimeter of the shaft 145a such that the cutting end 145b can engage and cut predetermined portions of the conductive material 143b to remove unwanted portions of the conductive material 143b and thereby form the traces 138a-1, 138a-2, 138b-1 and 138b-2. The cutting end 145b can have any suitable shape, such as a ball shape as shown. The router bit 144 can be connected to a computerized guiding system (not shown) that has motors, mechanical structure and guides for rotating, supporting and moving the router bit 144 in at least three different directions, for example, along an X-axis, a Y-axis and a Z-axis for engaging the cutting end 145b with the conductive material 143b to remove the unwanted portions of the conductive material 143b. In this example, the slot 143a has a longitudinal axis 147a and a lateral axis 147b extending normal to the longitudinal axis 147a. The longitudinal axis 147a can be aligned with the Y-axis of the computerized guiding system, the lateral axis 147b can be aligned with the X-axis of the computerized guiding system, and the Z-axis of the computerized guiding system can be normal to the upper surface 142. In another embodiment, predetermined portions of the vertical conductive structures 136a and 136b can be removed to form the traces 138a-1, 138a-2, 138b-1 and 138b-2 using an imaging process. In this embodiment, the vertical conductive structures 136a and 136b are plated with a positive or negative photoresist material. Thereafter, predetermined portions of the photoresist material are exposed to light and then an etching process is used to remove unwanted portions of the vertical conductive structures 136a and 136b to form the traces 138a-1, 138a-2, 138b-1 and 138b-2.

The predetermined portions of the photoresist material can be exposed to light by using a laser connected to and emitting light through a fiber tip (not shown). The fiber tip may be sized and configured to be positioned in the slot 143a and may be rotatable and/or movable in multiple axes, such as two, three, four, five, or more axes. The fiber tip can be connected to the computerized guiding system that has motors, mechanical structure and guides for rotating, supporting and moving the fiber tip in at least three different directions, for example, along an X-axis, a Y-axis and a Z-axis for disposing the fiber tip into the slot 143a and aiming the light emitted by the fiber tip onto wanted and/or unwanted portions of the photoresist material to permit a subsequent etching process to remove the unwanted portions of the conductive material 143b.

After the traces 138a-1, 138a-2, 138b-1 and 138b-2 are formed, the slot 143a can be filled and overplated.

Figure 22:
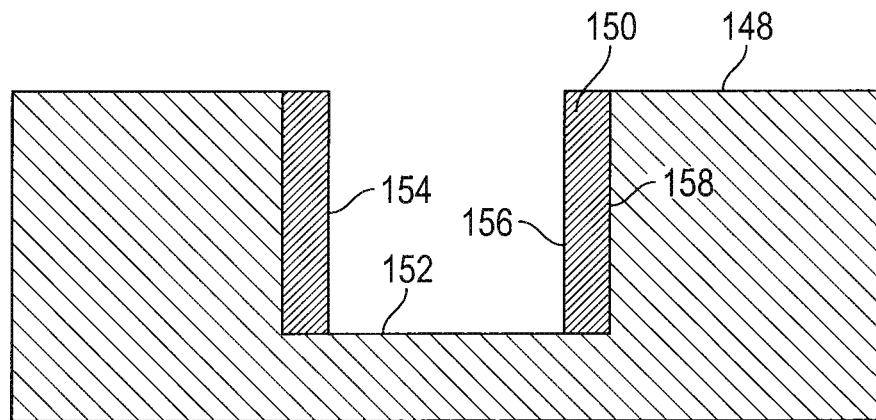
FIG. 22 is a cross-sectional view of another example of a substrate having a vertical conductive structure constructed in accordance with the present disclosure in which the vertical conductive structure is constructed in a blind configuration having a bottom, which is constructed of a dielectric material so as to electrically isolate a first conductive segment and a second conductive segment of the vertical conductive structure.

FIG. 22 is a cross-sectional view of another example of a substrate 148 having a vertical conductive structure 150 constructed in accordance with the present disclosure in which the vertical conductive structure 150 is constructed in a blind configuration having a bottom 152. The bottom 152 is constructed of a dielectric material so as to electrically isolate a first conductive segment 154 from a second conductive segment 156 of the vertical conductive structure 150. The vertical conductive structure 150 can be constructed in a manner similar to the construction of the vertical conductive structure 16 described above with further processing steps to avoid the plating of the bottom 152 with a conductive material, or to entirely remove a conductive material from the bottom 152. The conductive material can be removed from the bottom 152 using a fiber tip using an imaging process in which a photoresist is applied to the conductive material on the bottom 152, the photoresist is exposed to light using any suitable light source, such as a laser emitting light through a fiber tip, and an etching process. The vertical conductive structure 150 also includes a sidewall 158 supporting the first conductive segment 154 and the second conductive segment 156.

Figure 23:
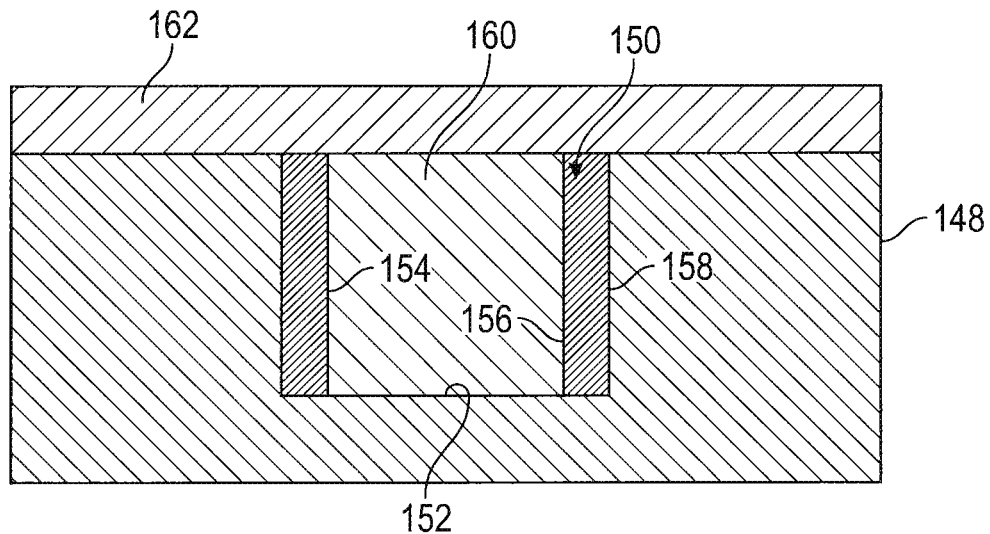
FIG. 23 is a cross-sectional view of the substrate and the vertical conductive structure depicted in FIG. 22 having a filling material within the vertical conductive structure, and one or more layers covering the vertical conductive structure such that the vertical conductive structure of FIG. 23 is in a buried configuration.

FIG. 23 is a cross-sectional view of the substrate 148 and the vertical conductive structure 150 depicted in FIG. 22 having a filling material 160 within the vertical conductive structure 150, and one or more layers 162 of printed circuit board material covering the vertical conductive structure 150 such that the vertical conductive structure 150 of FIG. 23 is in a buried configuration.

Figure 24:
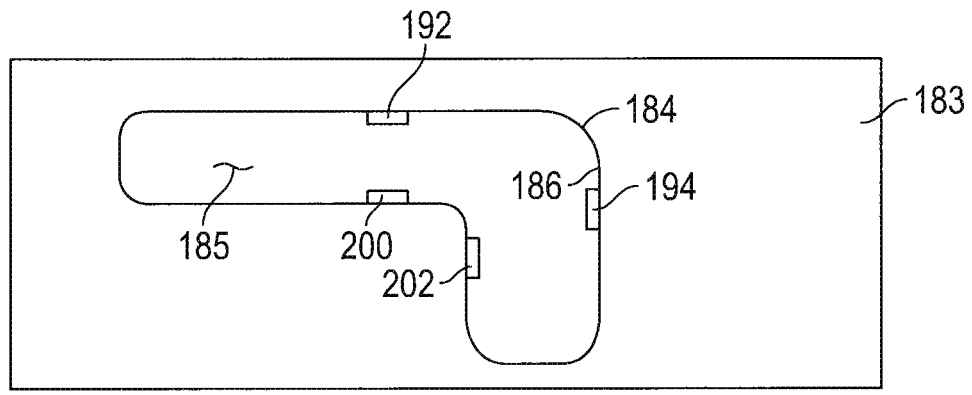
FIG. 24 is a top plan view of yet another example of a substrate having a vertical conductive structure constructed in accordance with the present disclosure in which the vertical conductive structure is constructed in a blind configuration having a bottom and is provided with a non-linear shape.
Figure 25A:
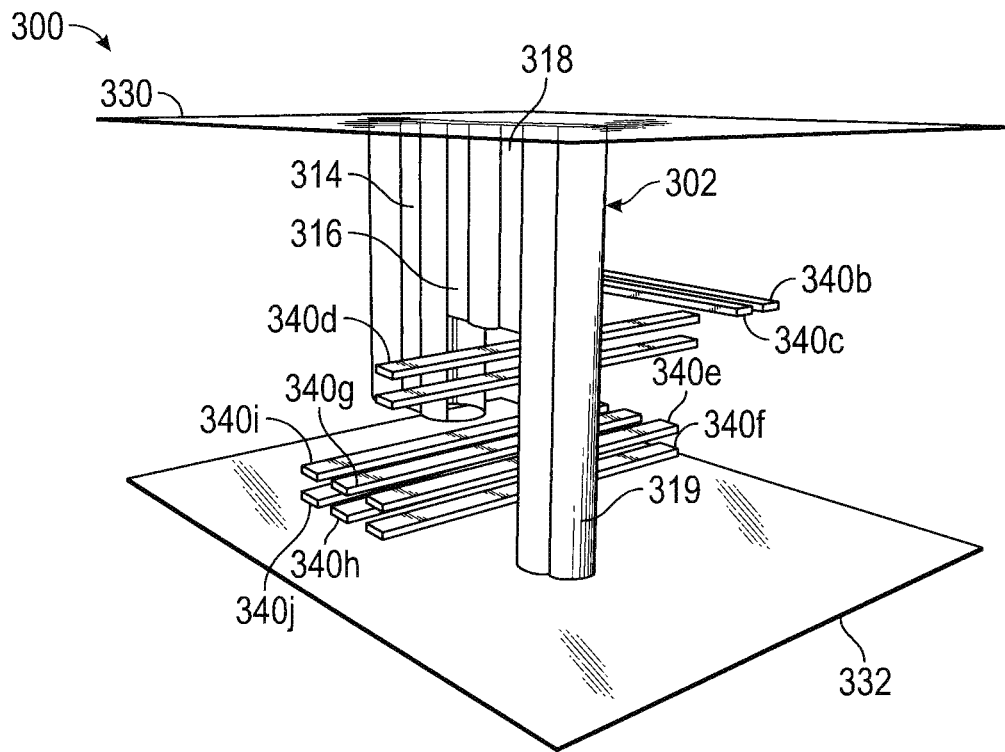
FIGS. 25a-25e are partial perspective views of another example of a printed circuit board having a vertical conductive structure including several blind structures going to different depths within the printed circuit board and on the right—a through structure.
Figure 25B:
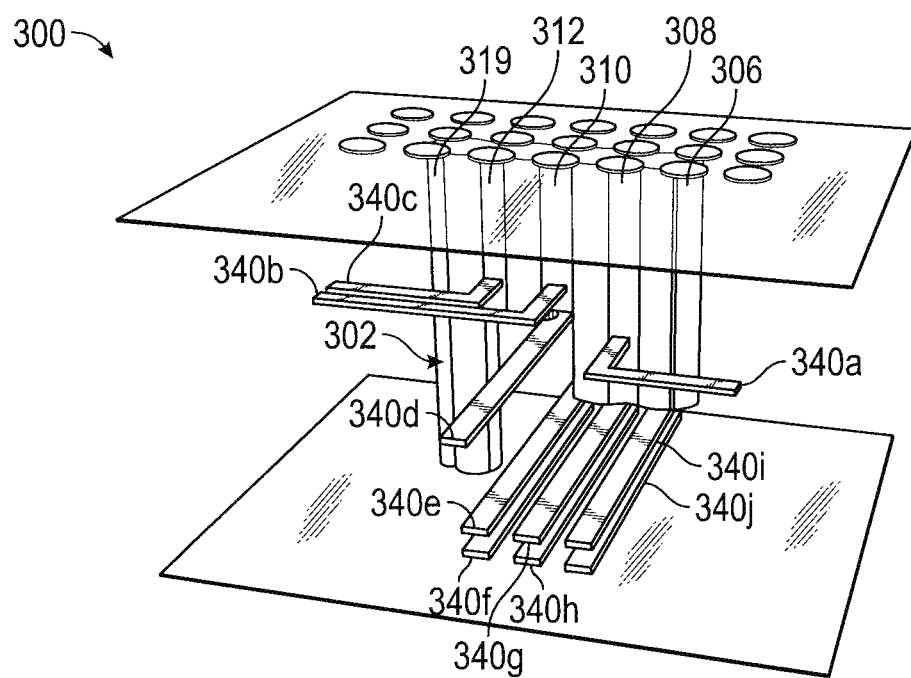
Figure 25C:
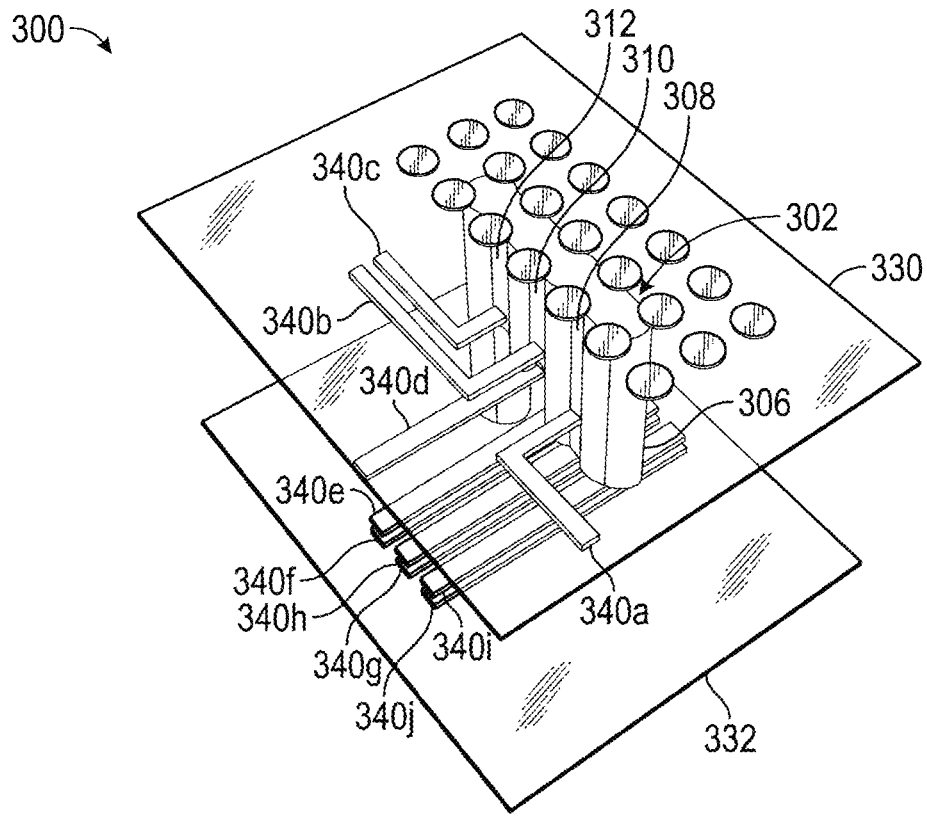
Figure 25D:
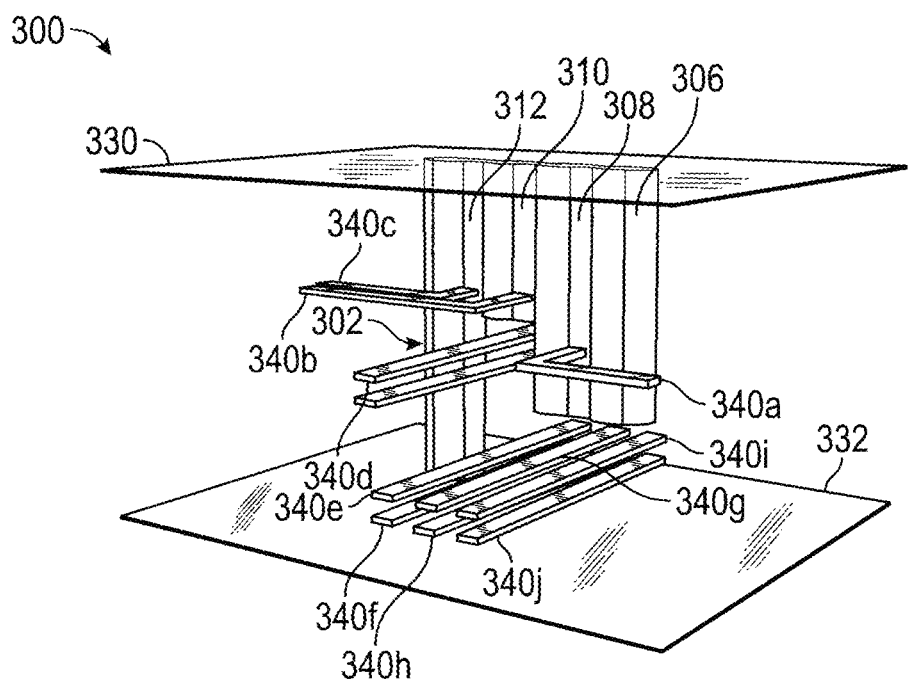
Figure 25E:
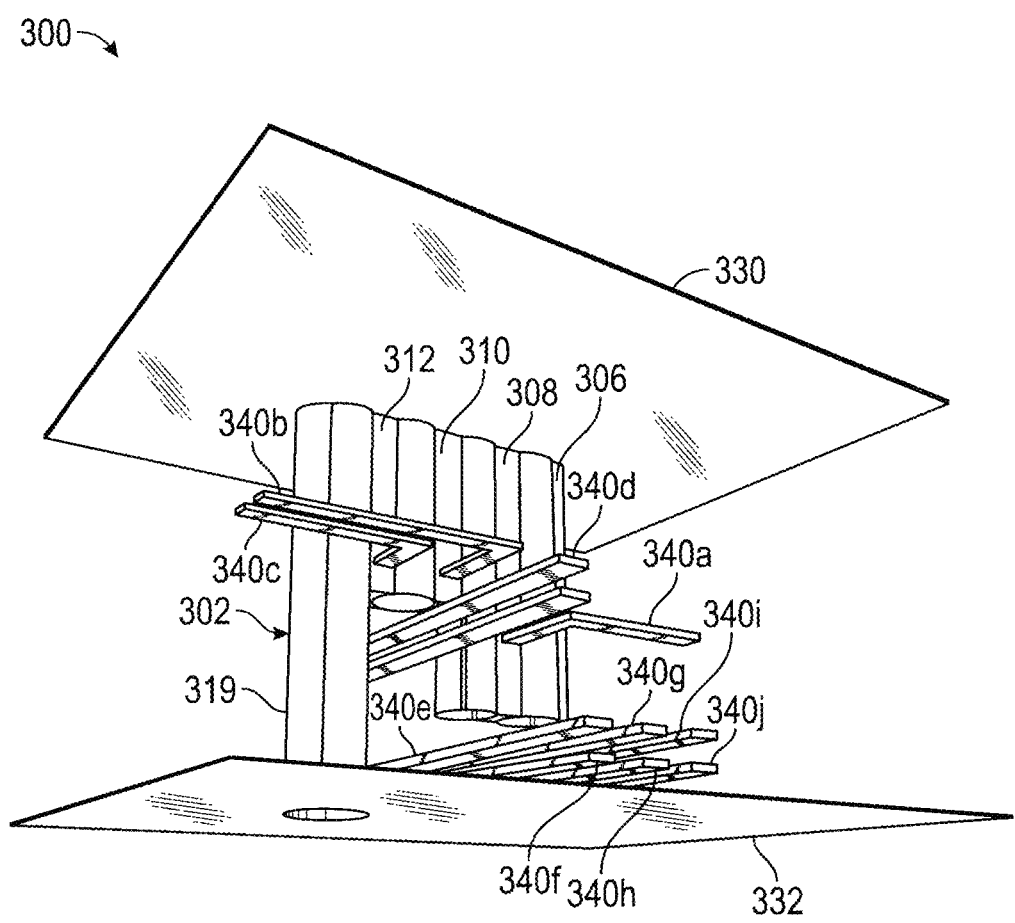

FIG. 24 is a top plan view of yet another example of a substrate 183 having a vertical conductive structure 184 constructed in accordance with the present disclosure in which the vertical conductive structure 184 is constructed in a blind configuration having a bottom 185 and a sidewall 186, which is partially coated with a conductive material to form a first conductive segment 192, a second conductive segment 194, a third conductive segment 200, and a fourth conductive segment 202. In this example, the sidewall 186 is shaped in the form of a hockey-stick and it should be understood that the sidewall 186 can be formed in many shapes, including an elongated linear slot as discussed above, a cross, bend, arc or a donut shape.

FIGS. 25a-25e are partial perspective views of another example of a printed circuit board 300 constructed in accordance with the embodiments disclosed above in which the printed circuit board 300 has a vertical conductive structure 302 including several blind structures having conductive segments 306, 308, 310, 312, 314, 316, and 318 with the conductive segments 306, 308, and 314 going to different depths within the printed circuit board 300 than the conductive segments 310, 312, 316 and 318. The vertical conductive structure 302 also includes a through structure having a conductive segment 319. The conductive segments 306, 308, 310, 312, 314, 316, and 318 can be constructed of any suitable conductive material(s), such as copper, silver or gold, as discussed above. The printed circuit board 300 includes a first side 330, and a second side 332 that opposes the first side 330. The printed circuit board 300 also includes a plurality of traces 340a, 340b, 340c, 340d, 340e, 340f, 340g, 340h, 340i and 340j that extend between the first side 330 and the second side 332. The traces 340a, 340b, 340c, 340d, 340e, 340f, 340g, 340h, 340i and 340j can be made of any suitable conductive material(s), such as copper, silver or gold, as discussed above. The conductive segment 308 is electrically connected to the trace 340a, the conductive segment 310 is electrically connected to the trace 340b, and the conductive segment 312 is electrically connected to the trace 340c. The traces 340d-340i are electrically isolated from the conductive segments 306, 308, 310, 312, 314, 316 and 319.

The conductive segments 306, 308, 310, 312, 314, 316 intersect and extend from the first side 330 and terminate prior to intersecting the second side 332. The conductive segment 319 intersects both the first side 330 and the second side 332 and also extends between the first side 330 and the second side 332. Optionally, a filling material can be positioned between adjacent pairs of the conductive segments 306, 308, 310, 312, 314, 316 and 319 to provide structural support for contact pads and also assist in electrically isolating the conductive segments 306, 308, 310, 312, 314, 316 and 319.

Figure 26:
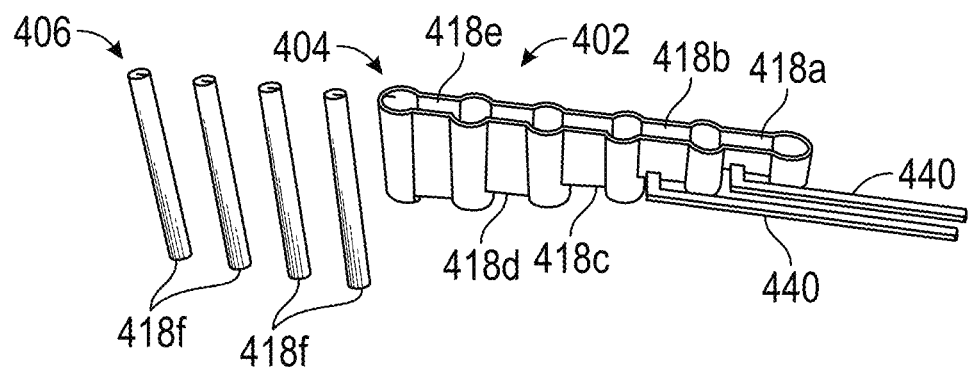
FIG. 26 is a partial elevational perspective view of an exemplary embodiment of a printed circuit board having vertical conductive structures in accordance with the present disclosure.
Figure 27:
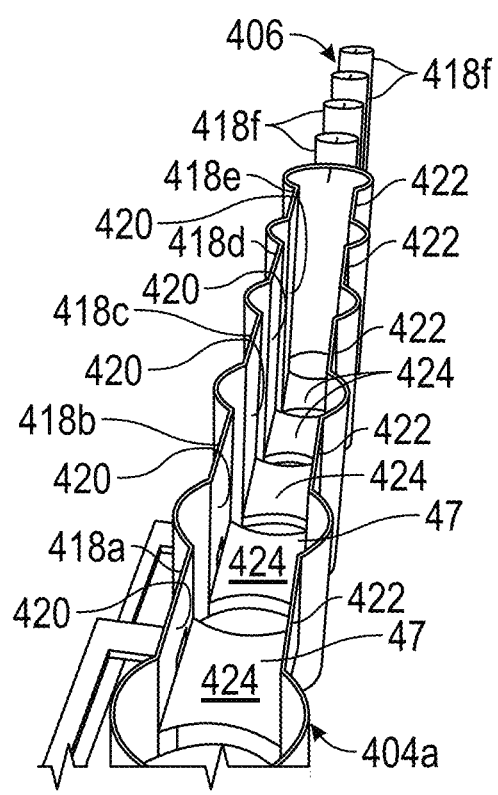
FIG. 27 is a partial perspective view of the vertical conductive structures of FIG. 26.
Figure 28:
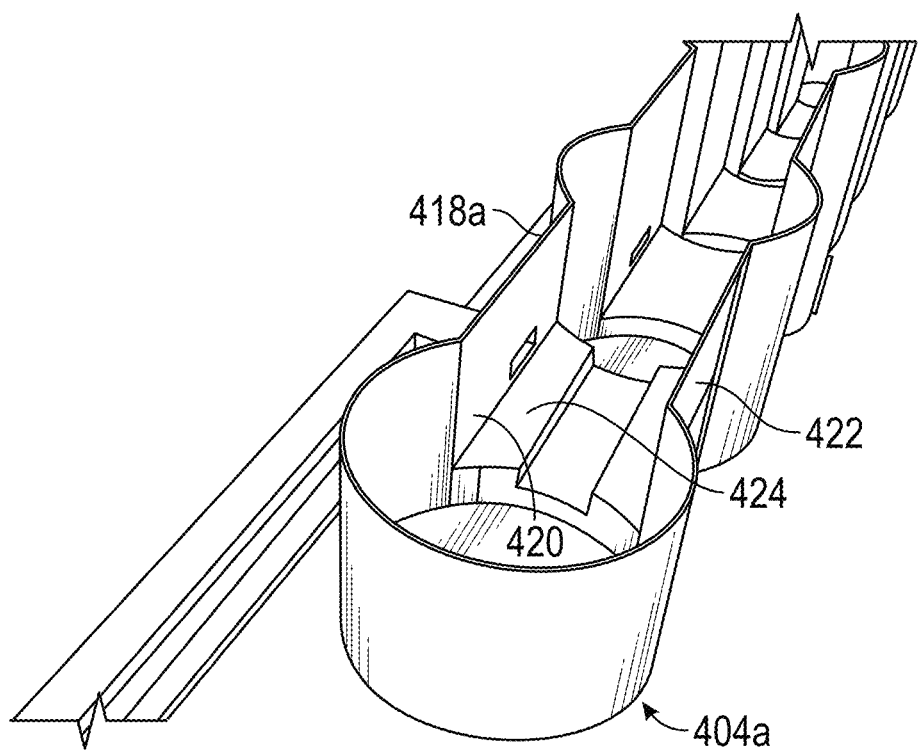
FIG. 28 is a partial top perspective view of an exemplary embodiment of vertical conductive structures in accordance with the present disclosure

Referring now to FIGS. 26-28, in one embodiment, a printed circuit board constructed in accordance with the embodiments disclosed herein may have a plurality of conductive structures 16 having one or more configurations. In one embodiment, the printed circuit board has a vertical conductive structure 402 including one or more blind structure 404 having one or more conductive segments 418, such as conductive segments 418a, 418b, 418c, 418d, and 418e. The conductive segments 418a, 418b, 418c, 418d, and 418e may extend to one or more different depths within the printed circuit board, thus reaching one or more different layers within the printed circuit board. In one embodiment, the conductive segments 418a-418e intersect and extend from a first side of the circuit board and terminate prior to intersecting a second side of the circuit board. In one embodiment, the blind structure 404 is a stepped blind structure 404a in which at least two of the conductive elements 418 extend to different depths within the printed circuit board.

In one embodiment, one or more of the conductive segments 418a-418e of the blind structure 404 and/or the stepped blind structure 404a intersect and extend from the first side of the circuit board to intersect the second side of the circuit board (for example, to improve plating ability by enhancing the fluid exchange in the vertical conductive structure 402).

Though five conductive segments 418a-418e extending to different depths are shown in the illustration for exemplary purposes, it will be understood that more or fewer conductive segments 418 extending to more or fewer depths and/or extending to intersect the second side of the circuit board may be used.

Figure 32:
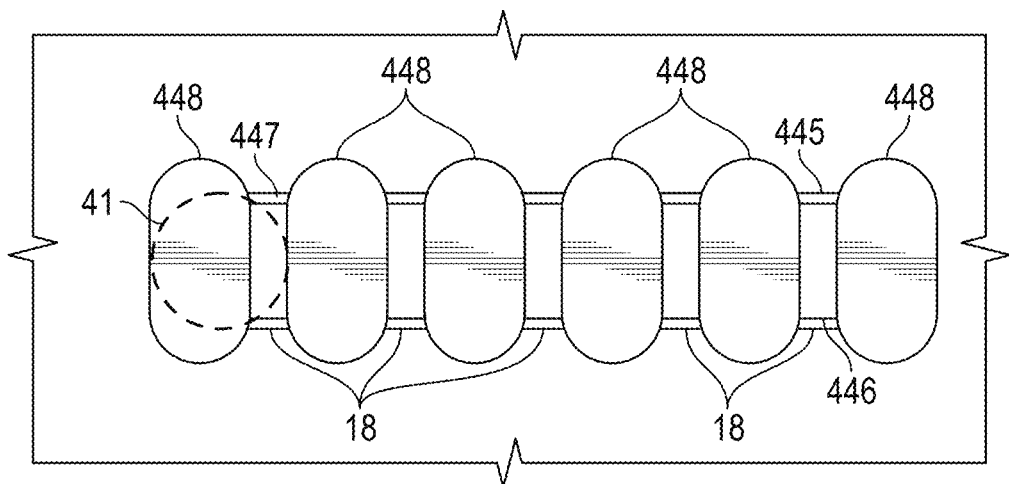
FIG. 32 is a schematic view of an exemplary embodiment of a process for forming a slot in a circuit board in accordance with the present disclosure.
Figure 33:
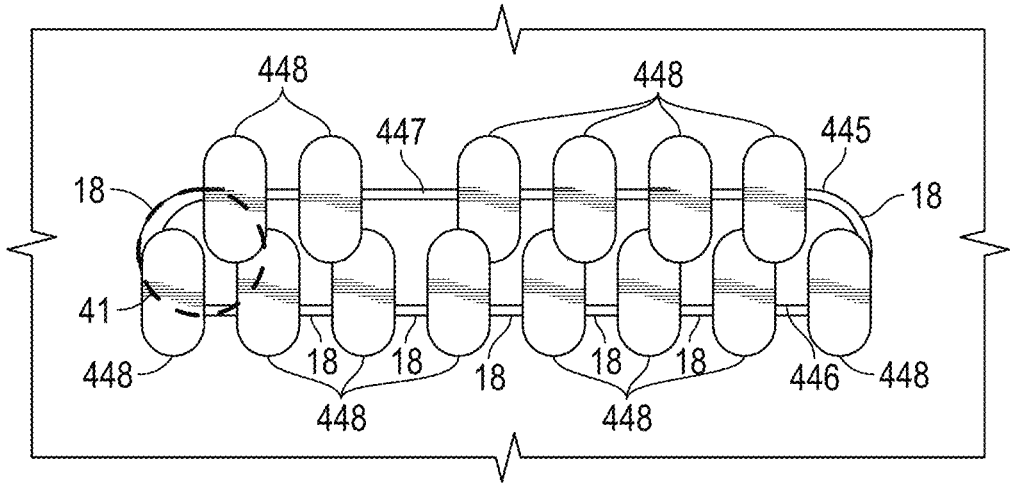
FIG. 33 is a schematic view of an exemplary embodiment of another process for forming a slot in a circuit board in accordance with the present disclosure.
Figure 34:
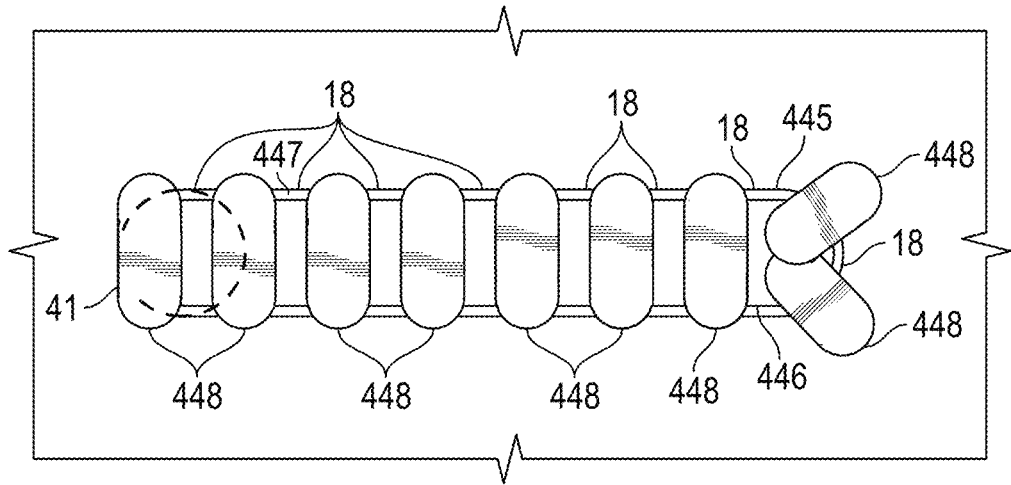
FIG. 34 is a schematic view of an exemplary embodiment of yet another process for forming a slot in a circuit board in accordance with the present disclosure.

The blind structure 404 may be formed, as described in the present disclosure, with one or more slot 445 (for example, as shown in FIGS. 32-34, and/or final slot 50, as shown in FIG. 2F). The depth of the slot 445 affects the application of the conductive layer 47 in the slot 445. The depth to which the conductive layer 47 can be applied is based at least in part on the width-to-length ratio of the dimensions of the slot 445, with a wider slot 445 generally allowing for more depth of application. Therefore, a slot-based blind structure can be deeper than a circular hole-based blind structure while maintaining the ability to apply the conductive layer 47 to the structure.

As illustrated in FIG. 27, in one embodiment, one or more of the conductive segments 418a-418e each has a first side 420, a second side 422, and a floor 424 between the first side 420 and the second side 422 and electrically connecting the first side 420 and the second side 422 such that the conductive layer 47 is substantially continuous from the first side 420 to the second side 422. In one embodiment, as illustrated in FIG. 28, one or more of the first side 420 and the second side 422 of the conductive segments 418a-418e are disconnected (electrically isolated). In such a case, for example, at least a portion of the conductive layer 47 may be removed from the floor 424 of the conductive segment 418 such that the conductive layer 47 no longer connects the first side 420 and the second side 422.

Returning to FIG. 26, the circuit board may also include one or more through-structure 406 having one or more conductive segment 418f. The conductive segment 418f intersects both the first side and the second side and also extends between the first side and the second side. In one embodiment, the through-structure 406 may be separated from the blind structure 404 and/or the stepped blind structure 404a. In one embodiment, the through-structure 406 may be connected to the blind structure 404 and/or the stepped blind structure 404a.

The conductive segments 418a-418f can be constructed of any suitable conductive material(s), such as copper, silver or gold, as discussed above. The printed circuit board also includes a plurality of traces 440 that extend within the circuit board. The traces 440 can be made of any suitable conductive material(s), such as copper, silver or gold, as discussed above. The conductive segments 418a-418f may be electrically connected to one or more of the traces 440 and electrically isolated from one or more other traces 440.

Optionally, a filling material can be positioned between adjacent pairs of the conductive segments 418a-418f to provide structural support for contact pads and also assist in electrically isolating the conductive segments 418a-418f.

It will be understood that the vertical conductive structure 402 may have other configurations than that shown in the exemplary embodiments to accommodate required pin assignments in Ball Grid Arrays (BGA's), based at least in part on reference voltages (power and ground) and signals.

Figure 29:
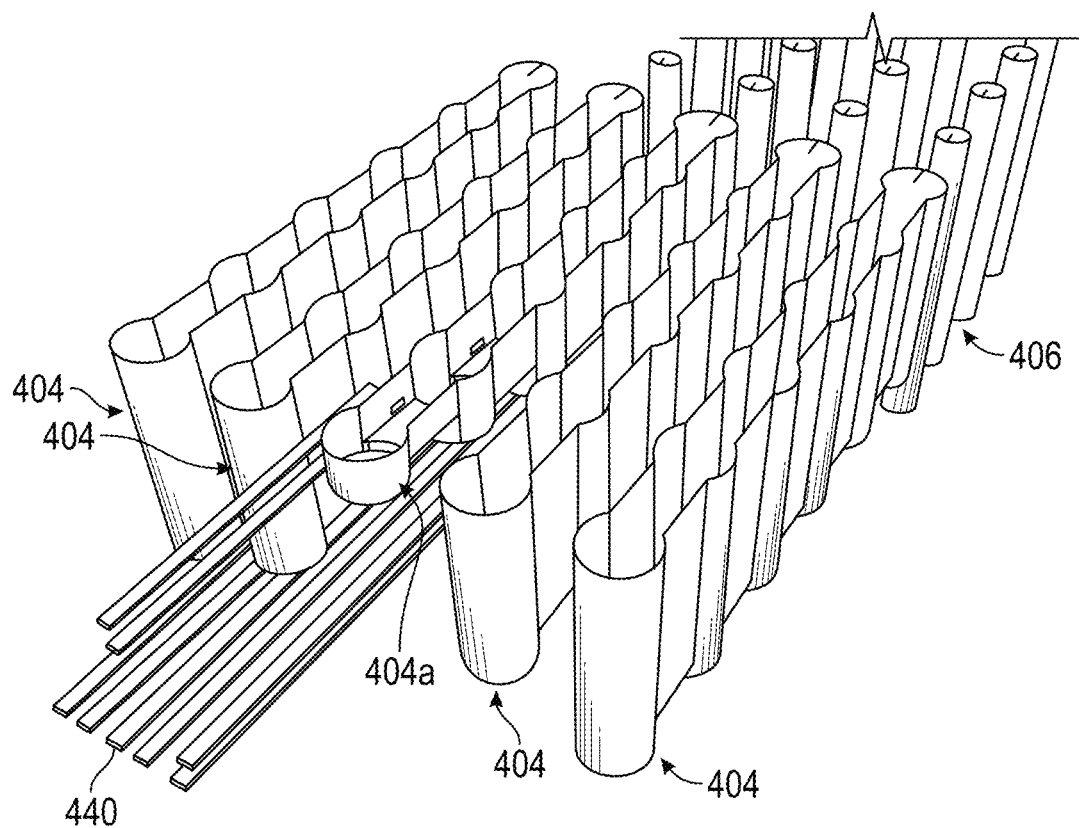
FIG. 29 is a partial top perspective view of an exemplary embodiment of a printed circuit board having a combination of vertical conductive structures in accordance with the present disclosure.
Figure 30:
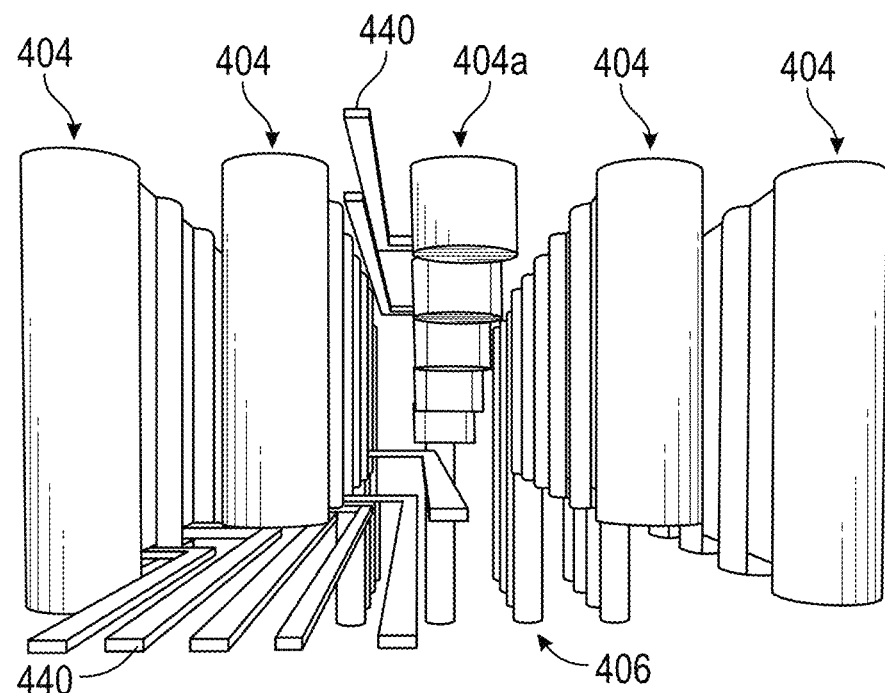
FIG. 30 is an end perspective view of the combination of vertical conductive structures of FIG. 29.

In one embodiment, as illustrated in FIGS. 29 and 30, a combination of one or more stepped blind structure 404a, one or more blind structure 404, and/or one or more through-structure 406 may be used. For example, the circuit board may have one stepped blind structure 404a positioned between two first blind structures 404 having conductive elements 418 extending to a first depth, which are positioned between two second blind structures 404 having conductive elements 418 extending to a second depth, different than the first depth. The second depth can be greater than the first depth. The first blind structures 404 and the second blind structures 404 may be in parallel. The circuit board may also have one or more through-structures 406. In this manner routing space within the circuit board underneath and adjacent to the stepped blind structure 404a and the two first blind structures 404 having conductive elements 418 extending to the first depth can be used for routing the traces 440.

Figure 31:
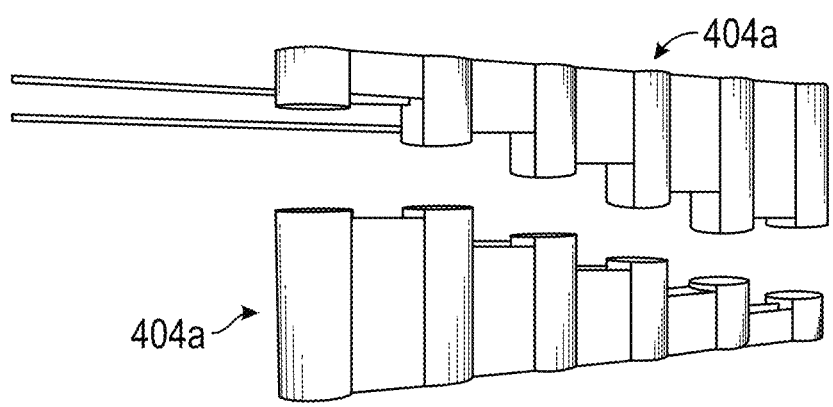
FIG. 31 is a partial elevation perspective view of an exemplary embodiment of a printed circuit board having a combination of vertical conductive structures in accordance with the present disclosure.

In one embodiment, as illustrated in FIG. 31, a combination of two or more stepped blind structures 404a may be used. In this non-exclusive example, a first stepped blind structure 404a descends from a first side of a circuit board while a second stepped blind structure 404a descends from a second side of the circuit board, opposite from and aligned with the first stepped blind structure 404a. The configuration shown in FIG. 31 enables increased density of components in the circuit board. Circuits on both sides of the circuit board can then be independent of each other but can also be connected by connecting the first and second stepped blind structures 404a (by, for example, using a through hole or a buried hole or a through connection in the conductive structure 16).

Referring now to FIGS. 32-34, further variations of the conductive structures 16, and methods for producing conductive structures 16, will be described. It will be understood that such variations may be used in any of the circuit boards 10, 10a previously described in relation to FIGS. 1 and 3 herein, as well as in other circuit boards. As illustrated in FIG. 32, in one embodiment, a hole 41 may be formed in the insulator substrate 40 at a desired position and desired angle relative to the upper surface of the insulator substrate 40. For example, the hole 41 may be formed at an angle substantially normal to the upper surface of the insulator substrate 40.

The hole 41 may be formed through the use of a drilling method, but any conventional method, such as milling, punching, laser drilling, water cutting, or photo-definition, can be used. The diameter D1 of the hole 41 can be any size that is compatible with the other design requirements of the insulator substrate 40. In an embodiment, the diameter D1 of the hole 41 may be in a range between about 0.05 millimeters and about 0.5 millimeters. In some embodiments, the diameter D1 of the hole 41 may be in a range between about 0.1 millimeters and about 0.5 millimeters.

Then, at least a portion of the material of the insulator substrate 40 is removed by formation of the slot 445 in the substrate 40 starting in the hole 441. The slot 445 has a perimeter sidewall 446. The slot 445 may have a width W substantially equal to the diameter D1 of the hole 41. The slot 445 may have rounded ends having a diameter substantially equal to the diameter D1 of the hole 41. In one embodiment, one of the rounded ends is a half-circle created by the formation of the hole 41. In one embodiment, two holes 41 are formed spaced apart from one another and the slot 445 is formed between the two holes 41, and extends from one of the holes 41 to the other one of the holes 41.

The slot 445 may have a floor 424a (not shown) at the base of the sidewall 446. In one embodiment, the floor 424a is angled. A larger angle of the floor 424a enhances fluid exchange and flow of material inserted into the slot 445.

The slot 445 may be formed by the use of a straight router bit (with or without an end mill), but any conventional method, such as drilling, routing, milling, punching, laser drilling/cutting/ablation, water cutting, or photo-definition, can be used.

Thereafter, the conductive seed layer (not shown) is added followed by the addition of a conductive layer 447 of a first conductive material being deposited on the surfaces of the substrate 40 and the sidewall 446 to leave an opening in the substrate 40 surrounded by the conductive layer 447. In one embodiment, the first conductive material is copper and may be deposited to a thickness in the range between about 2.54 micron and about 25 microns, to a thickness of greater than approximately five microns, and to a thickness of approximately 15-25 microns. For a through structure, the thickness may be in a range from about 20 to 25 micron and for a blind structure, the thickness may be about 15 micron, for example. The conductive layer 447 on the sidewall 446 may be thick enough to provide a robust mechanical structure that will survive the thermal fluctuations and aggressive handling experienced by a printed circuit board during subsequent component assembly and usage.

In an embodiment, an electrolytic plating process is used to deposit the conductive layer 447. The electrolytic process may follow a surface preparation step involving either a direct metallization process or an electroless process. The surface preparation step includes depositing a thin conductive seed layer that sensitizes the surface and assists in the adhesion of the conductive layer 447 to the sidewalls 446. Direct metallization comprises depositing a thin conductive molecular layer (not shown) on the substrate surfaces and the sidewall 446 of the slot 445 of the vertical conductive structure 16 prior to depositing the conductive layer 447. The conductive layer 447 may also be palladium or platinum. This process avoids the typical catalytically deposited copper, thereby rendering this device more economically feasible.

The electroless surface preparation process comprises depositing a thin conductive seed layer (not shown), which may be copper, on the surfaces of the substrate 40 and the sidewalls 446 prior to depositing the conductive layer 447, to a thickness in the range between about 30 microns and about 200 microns, and in an embodiment, to a thickness in the range between about 70 microns and about 80 microns.

The surface preparation followed by the electrolytic deposition may result in a non-linear distribution of the conductive layer 447 on the sidewall 446 due to a natural tendency for the thickness of the conductive layer 447 to reduce as a depth of the sidewall 446 increases.

Then, one or more oblong shaped hole that is referred to hereinafter as a cross-slot 448 is formed into the sidewall 446 of the insulator substrate 40. In one embodiment, the cross-slot 448 is milled with a straight router bit (not shown), though it will be understood that punching, laser drilling, water cutting, or drilling may be used. The router bit/mill tool may be sized and configured to be positioned in the slot 445 and rotatable and/or movable in multiple axes, such as two, three, four, five, or more axes.

In one embodiment, a mill tool having a diameter less than the width of the slot 445 is lowered into the slot 445 and articulated through a first portion of the conductive layer 447 and into a first portion of the sidewall 446 of the insulator substrate 40 to remove a first portion of the conductive layer 447. In one embodiment, the mill tool may be articulated across the width of the slot 445 into a second portion of the sidewall 446.

The one or more cross-slot 448 and the slot 445 cooperate to form the electrically isolated conductive segments 18. In one embodiment, the cross-slot 448 extends into the insulator substrate 40 an amount that disrupts longitudinal strands in the insulator substrate 40 that may, when uninterrupted, allow electrical bridging between the conductive segments 18 (known as a conductive anodic filament effect). In one non-exclusive example, the amount the cross-slot extends into the insulator substrate 40 is equal to or greater than approximately 0.1 millimeter.

In one embodiment, as illustrated in FIG. 32, the length of the one or more cross-slot 448 extends substantially perpendicularly across the slot 445. In one embodiment, the one or more cross-slot 448 is two or more cross-slots 448 spaced apart from each other along the length of the slot 445. In one embodiment, the two or more cross-slots 448 are substantially equally spaced apart from each other along the length of the slot 445.

In one embodiment, as illustrated in FIG. 33, the one or more cross-slot 448 is formed substantially perpendicularly to the slot 445 but does not extend across the slot 445. In such an embodiment, for example, the mill tool may be lowered into the slot 445 and articulated across the width of the slot 445, through the conductive layer 47, and into the sidewall 446 of the insulator substrate 40. Then the mill tool may be articulated back into the slot 445, offset along the length of the slot 445, then again articulated across the width of the slot 445, through the conductive layer 47, and into the sidewall 446 of the insulator substrate 40 at a different location along the length of the slot 445. In one embodiment, the one or more cross-slot 448 is two or more cross-slots 448 that cooperate to form staggered offsets between two or more vertical conductive segments 18.

In one embodiment, as illustrated in FIG. 34, the one or more cross-slot 448 may be positioned at a non-ninety degree angle to the slot 445.

In one embodiment, a drill forms one or more hole in the insulator substrate 40 proximate to the slot 445, then the mill tool is started in the drilled hole and then articulated into the slot 445 and/or across the width of the slot 445.

Figure 35:
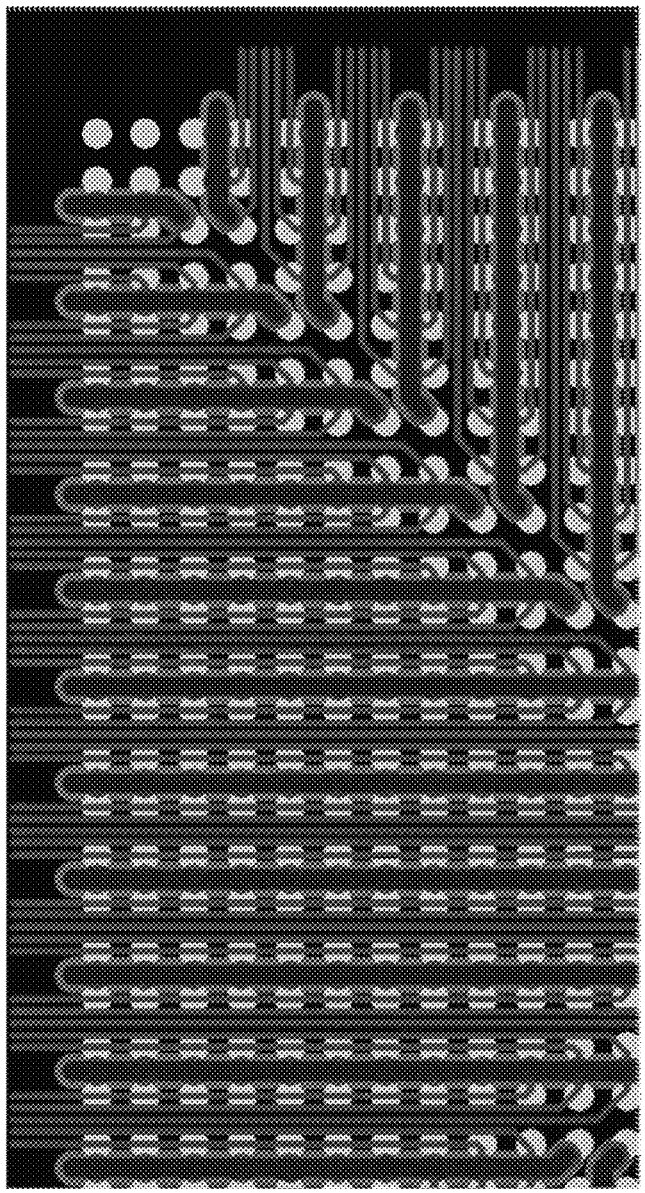
FIG. 35 is a schematic plan view of a circuit board having a plurality of vertical conductive structures for attachment to a component using a ball grid array.
Figure 36:
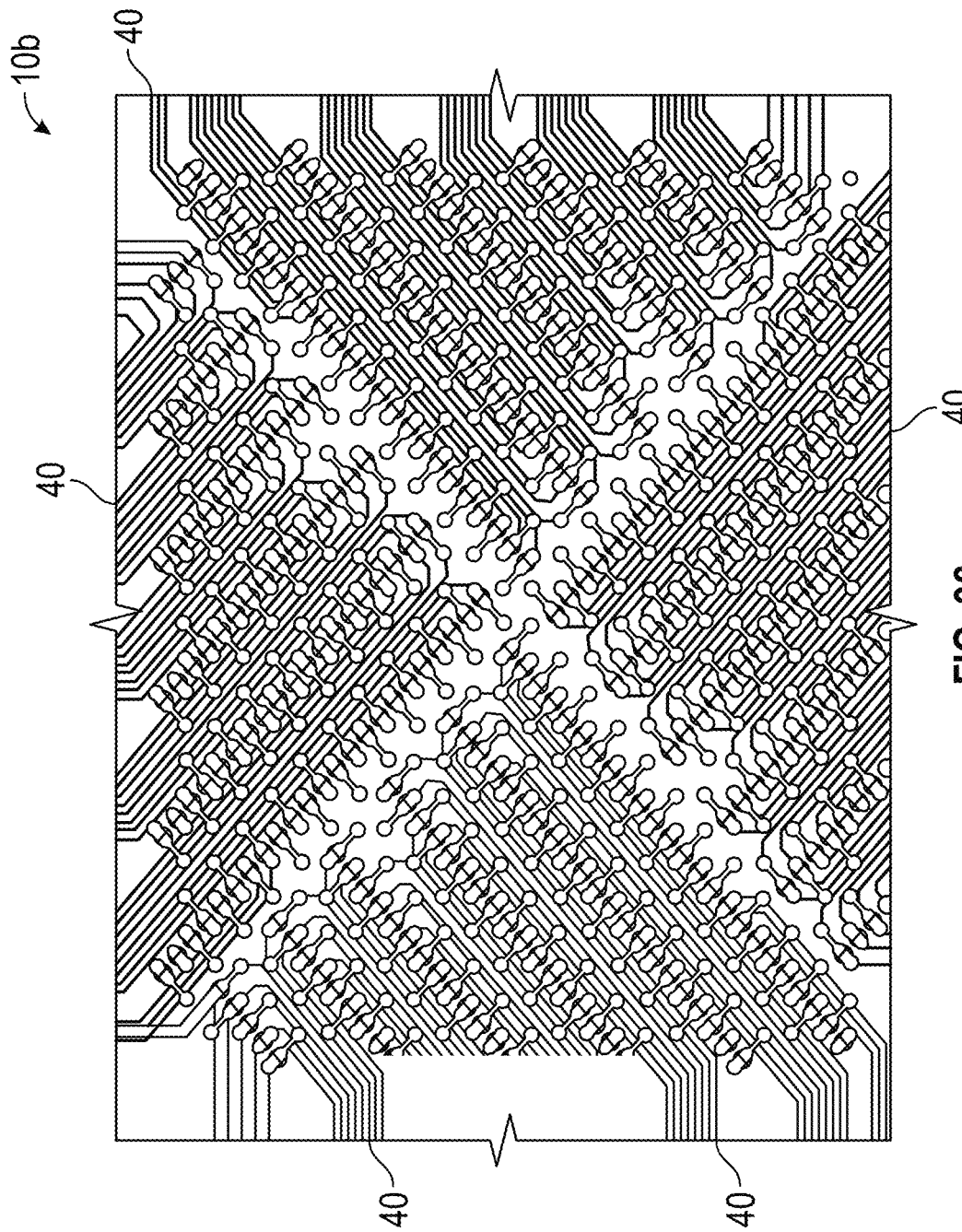
FIG. 36 is a schematic plan view of a circuit board having vertical conductive structures diagonally placed in accordance with the present disclosure for attachment to a component using a ball grid array.

Referring now to FIGS. 35-40, placement of conductive structures 16 on circuit boards, such as area array type components (for example, Ball Grid Arrays) will be described. As shown in FIG. 35, conductive structures may be placed in an orthogonal pattern on a circuit board (across a width and length). In accordance with the inventive concepts of the present disclosure, as shown in FIGS. 36-40, one or more of the vertical conductive structures 16 may be diagonally aligned in relation to a circuit board 10*b*. The diagonal placement may widen a routing channel, thus enabling a higher efficiency. For example, positioning the conductive structures 16 at an approximately forty-five degree angle, creates a routing channel that is wider than orthogonally-placed structures by a factor of two times the square root of two (that is, by a factor of approximately 2.8). The diagonal placement may allow for more signals per channel or more spaces between traces 40, only a few of which are labeled for purposes of clarity, and for more space for power/GND planes.

Figure 37:
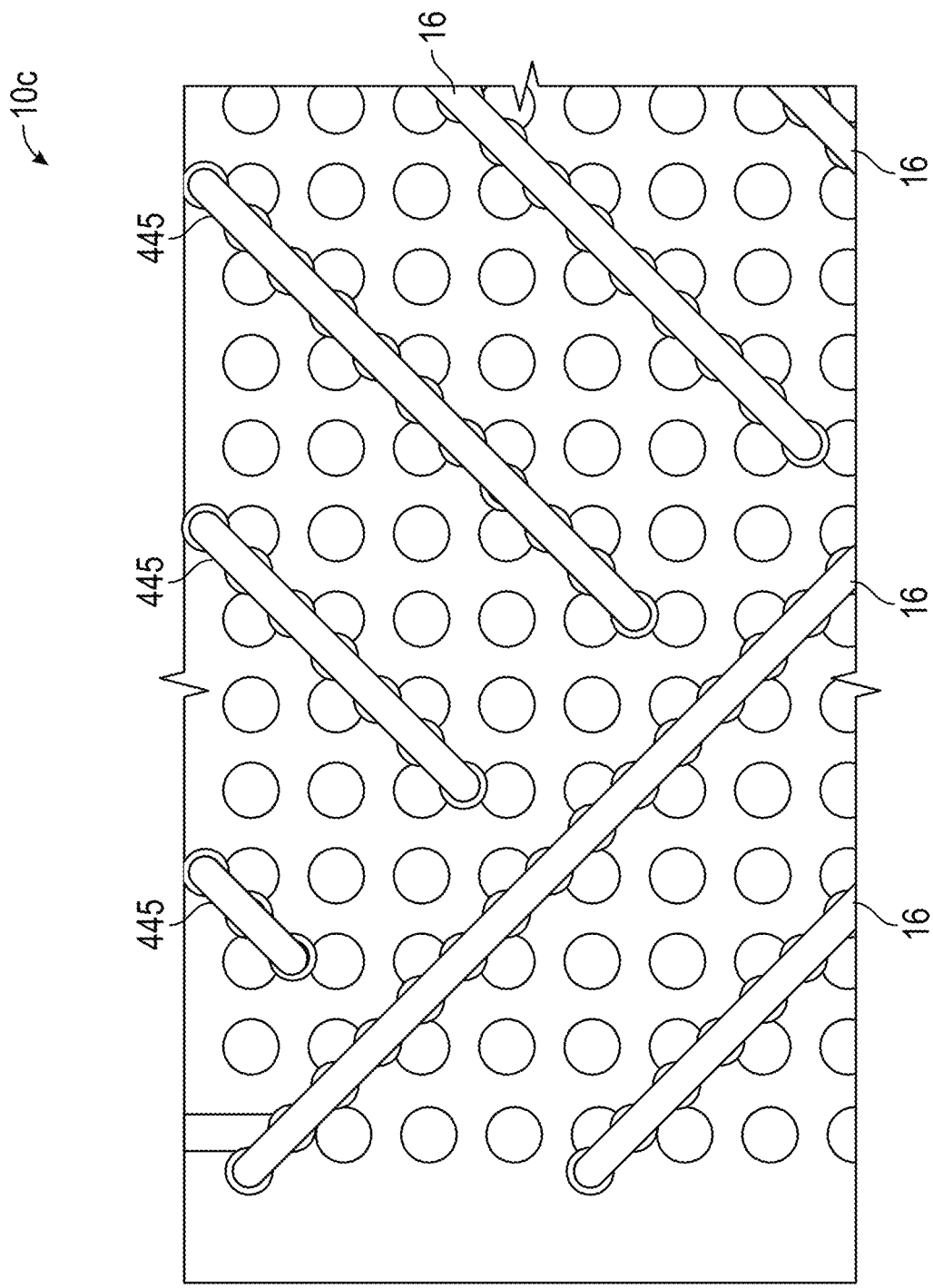
FIG. 37 is a schematic plan view of a circuit board in which the vertical conductive structures are diagonally placed in accordance with the present disclosure.
Figure 38:
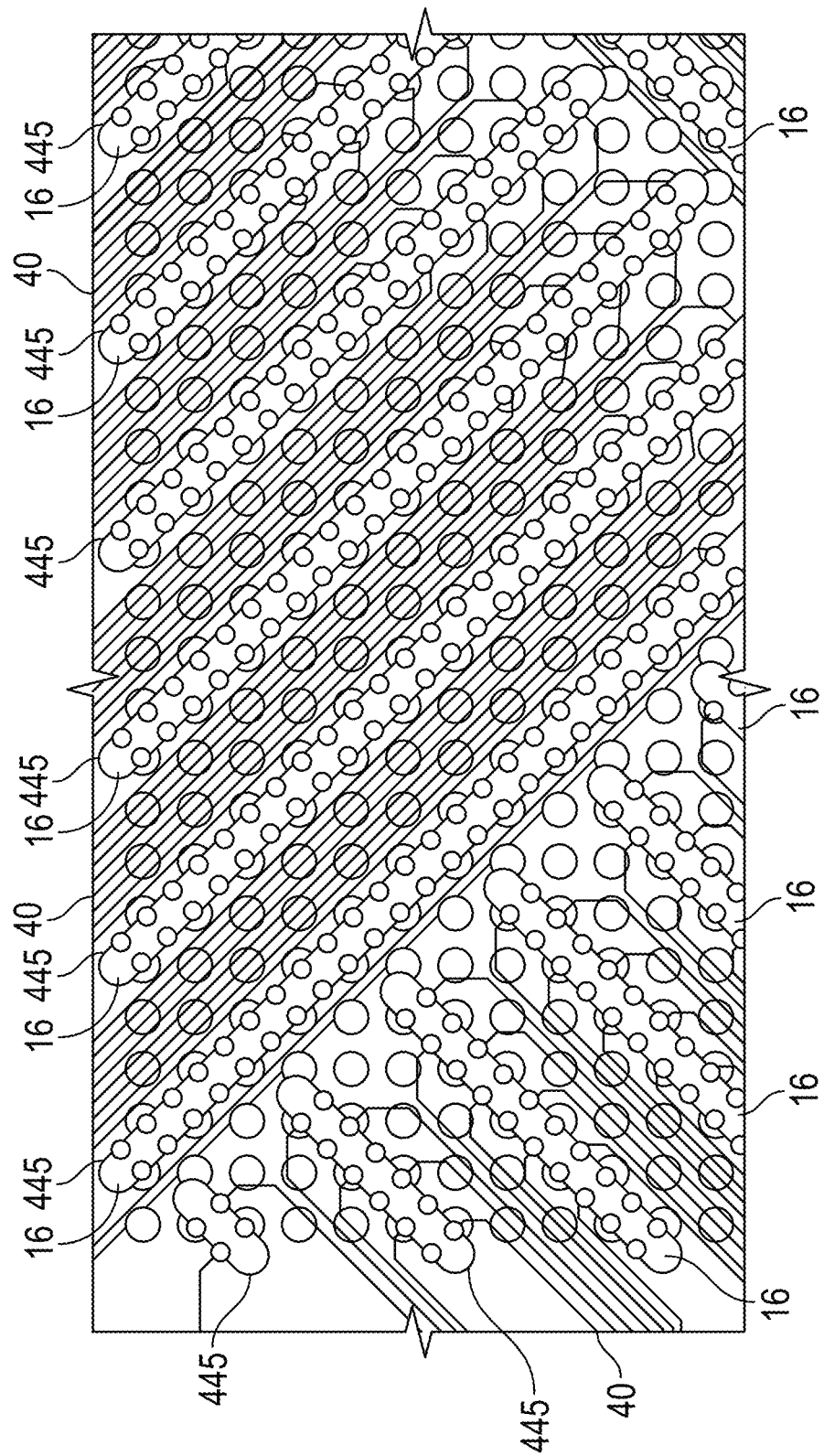
FIG. 38 is another schematic plan view of a circuit board having conductive structures diagonally placed in accordance with the present disclosure.

In one embodiment, as illustrated in FIG. 37, the diagonal placement of the conductive structures 16 is shown with a 0.5 millimeter pitch Ball Grid Array, also (referred to as a BGA) 10*c*. In one embodiment, the conductive structures 16 may be formed diagonally in relation to pads on the circuit board (such as the BGA). In one embodiment, the conductive structures 16 may be spaced apart such that parallel diagonal conductive structures 16 are separated by a greater distance compared to an orthogonal placement of the conductive structures 16. The distance between the conductive structures 16 when placed at forty-five degree angles is equal to 2*(BGA pitch)*(square root(2)).

Figure 39:
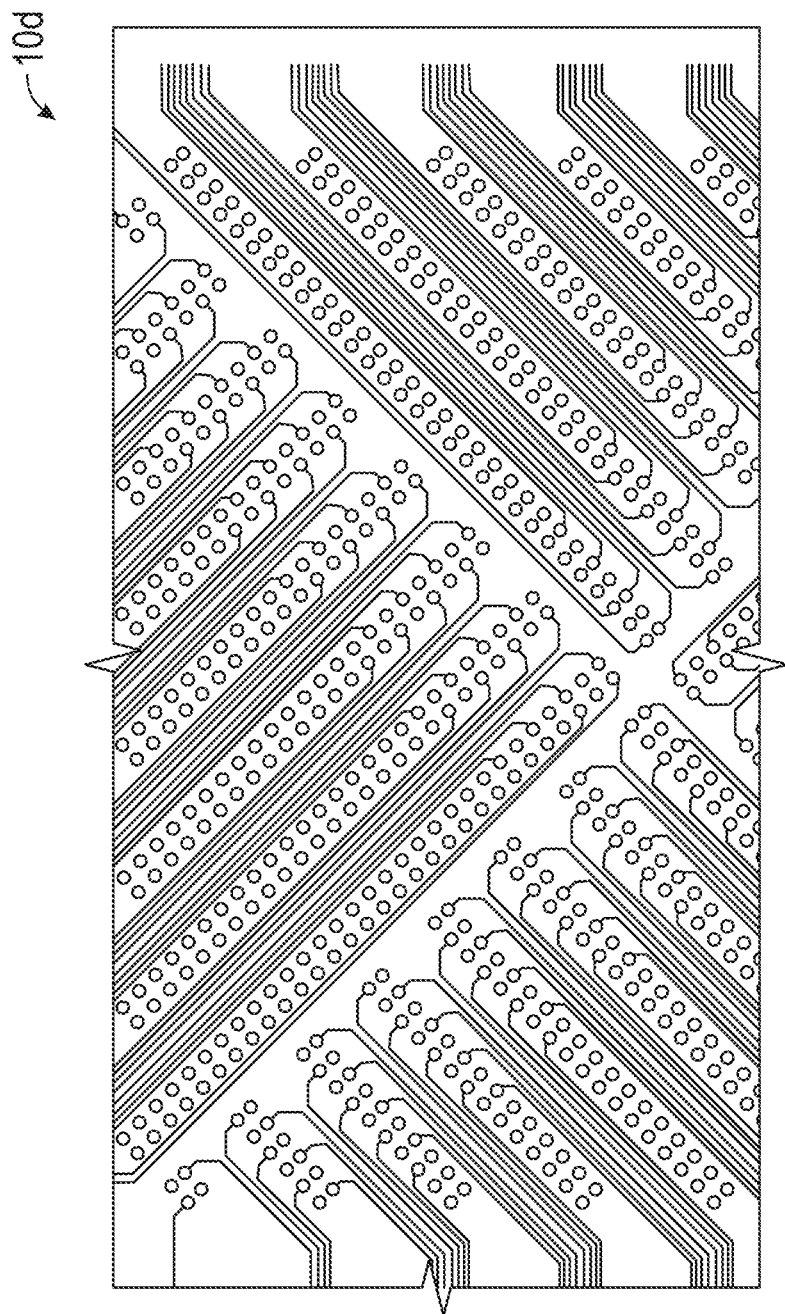
FIG. 39 is a schematic plan view of another example of a circuit board in which conductive structures are diagonally placed in accordance with the present disclosure.

As illustrated in FIG. 39, the diagonal placement of the conductive structures 16 is shown with a 0.4 millimeter pitch BGA 10*d*. In one embodiment, the trace width and spacing may be 0.040 millimeters (eight traces per channel) with such a BGA 10*d*. In one embodiment, the width of the slot 45, 445 of the diagonal conductive structures 16 may be approximately 0.25 millimeters.

Figure 40:
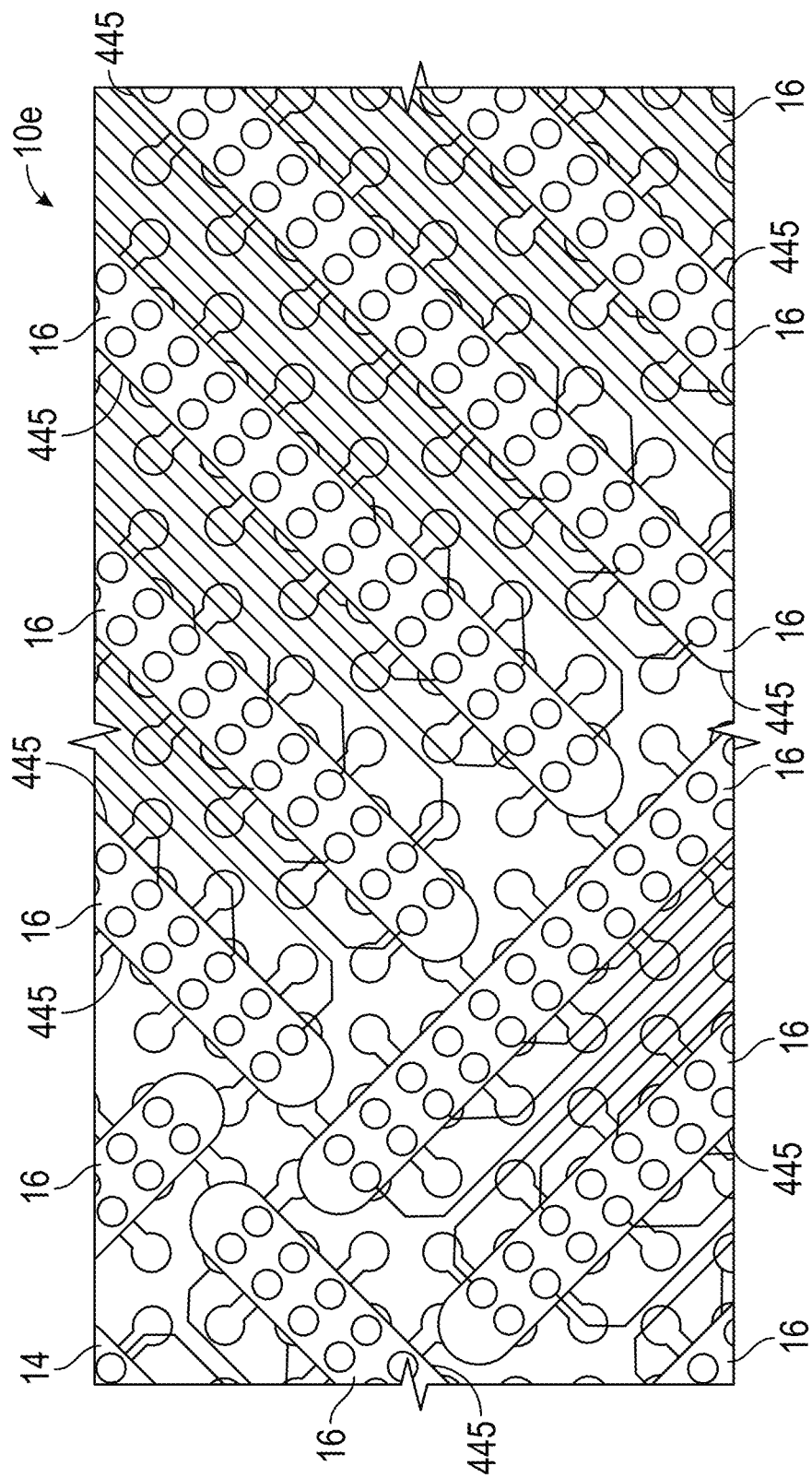
FIG. 40 is a schematic plan view of another example of a circuit board in which conductive structures are diagonally placed in accordance with the present disclosure.

As illustrated in FIG. 40, the diagonal placement of the conductive structures 16 is shown with a 0.35 millimeter pitch BGA 10*e*. In one embodiment, the trace width and spacing may be 0.040 millimeters (seven traces per channel) with such a BGA 10*e*. In one embodiment, the width of the slot 45, 445 of the diagonal conductive structures 16 may be approximately 0.20 millimeters.

Of course, it will be recognized that the diagonal placement of the conductive structures 16 and the width of the slot 45, 445 of the diagonal conductive structures 16 may vary depending on the type and configuration of the circuit board.

Figure 41:
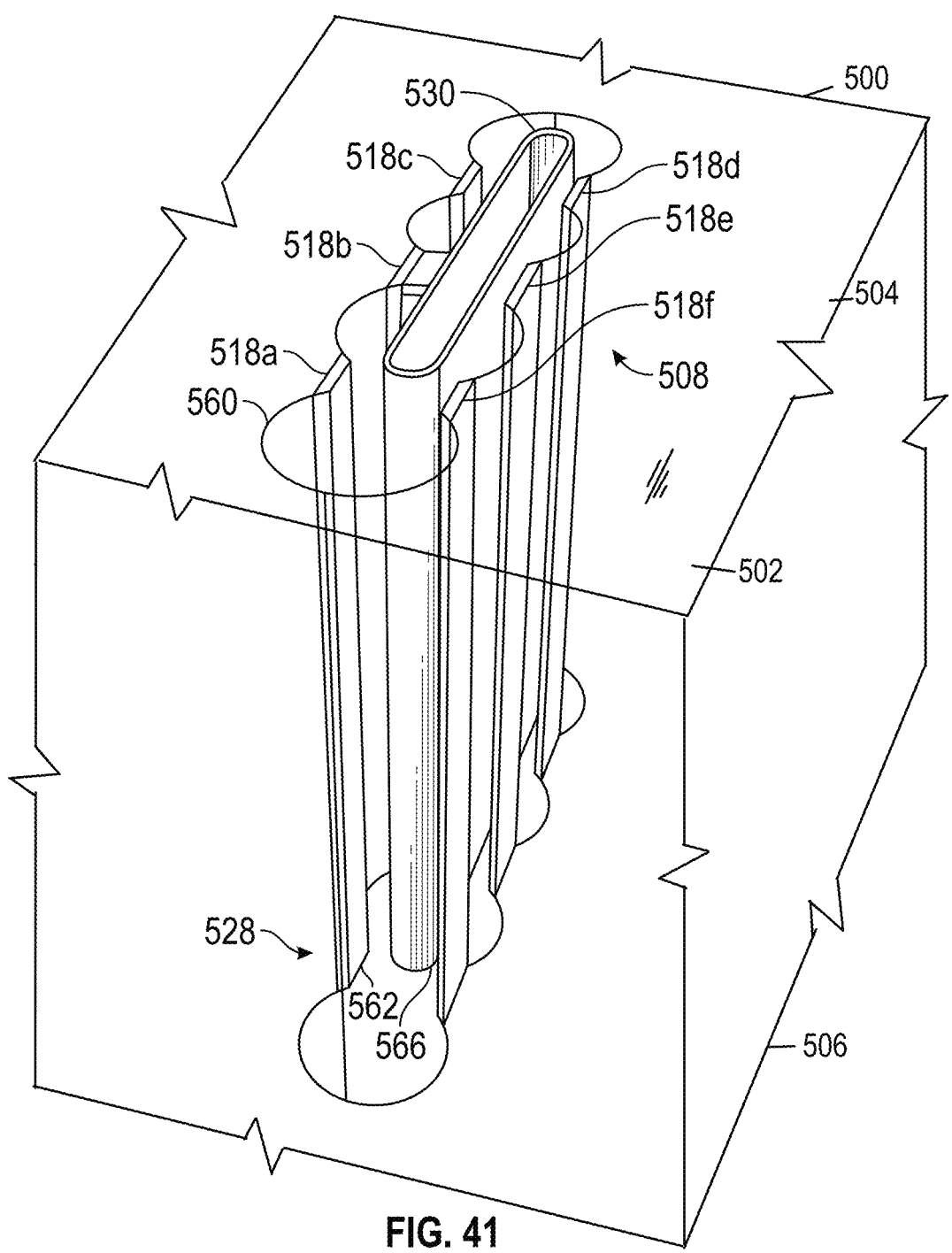
FIG. 41 is a partial perspective view of a circuit board constructed in accordance with the present disclosure in which a filling material (discussed below) is not shown to more clearly show other components.
Figure 42:
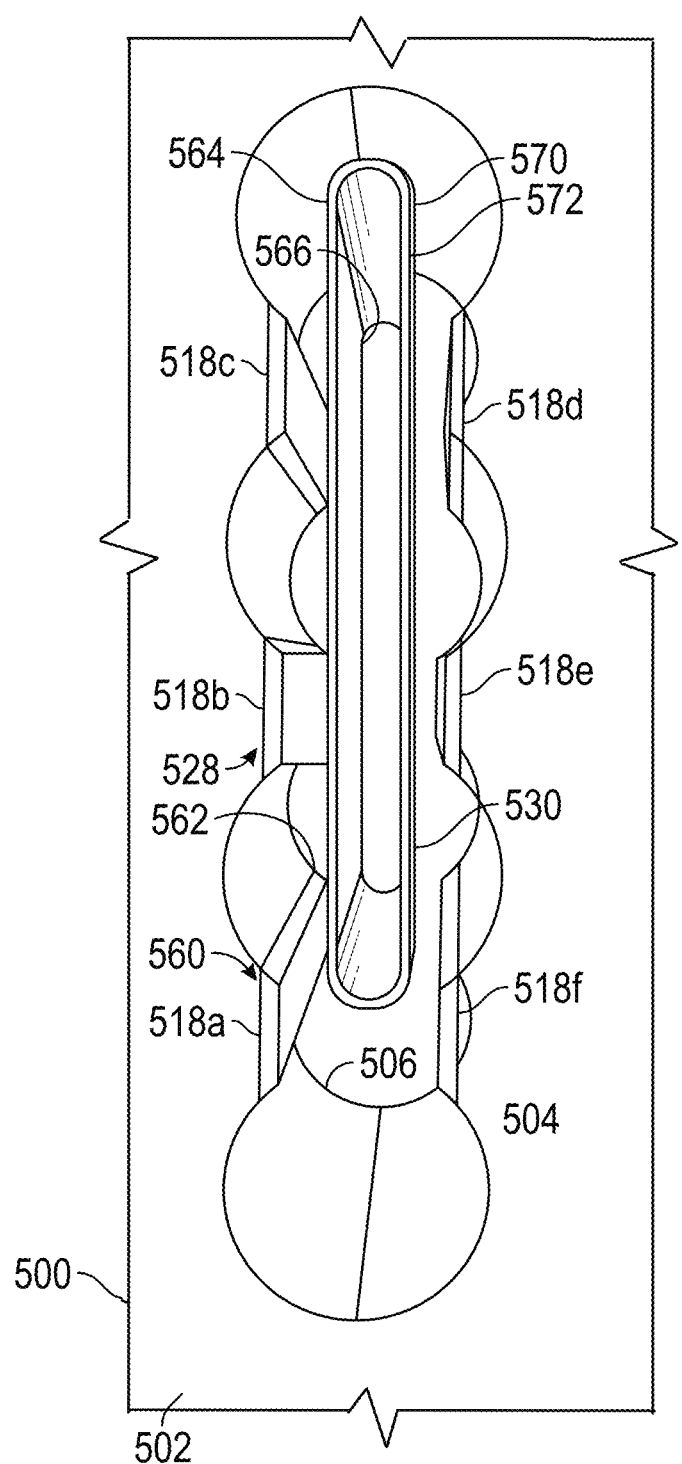
FIG. 42 is a top partial perspective view of the circuit board of FIG. 41 in which a filling material (discussed below) is not shown to more clearly show other components.
Figure 43:
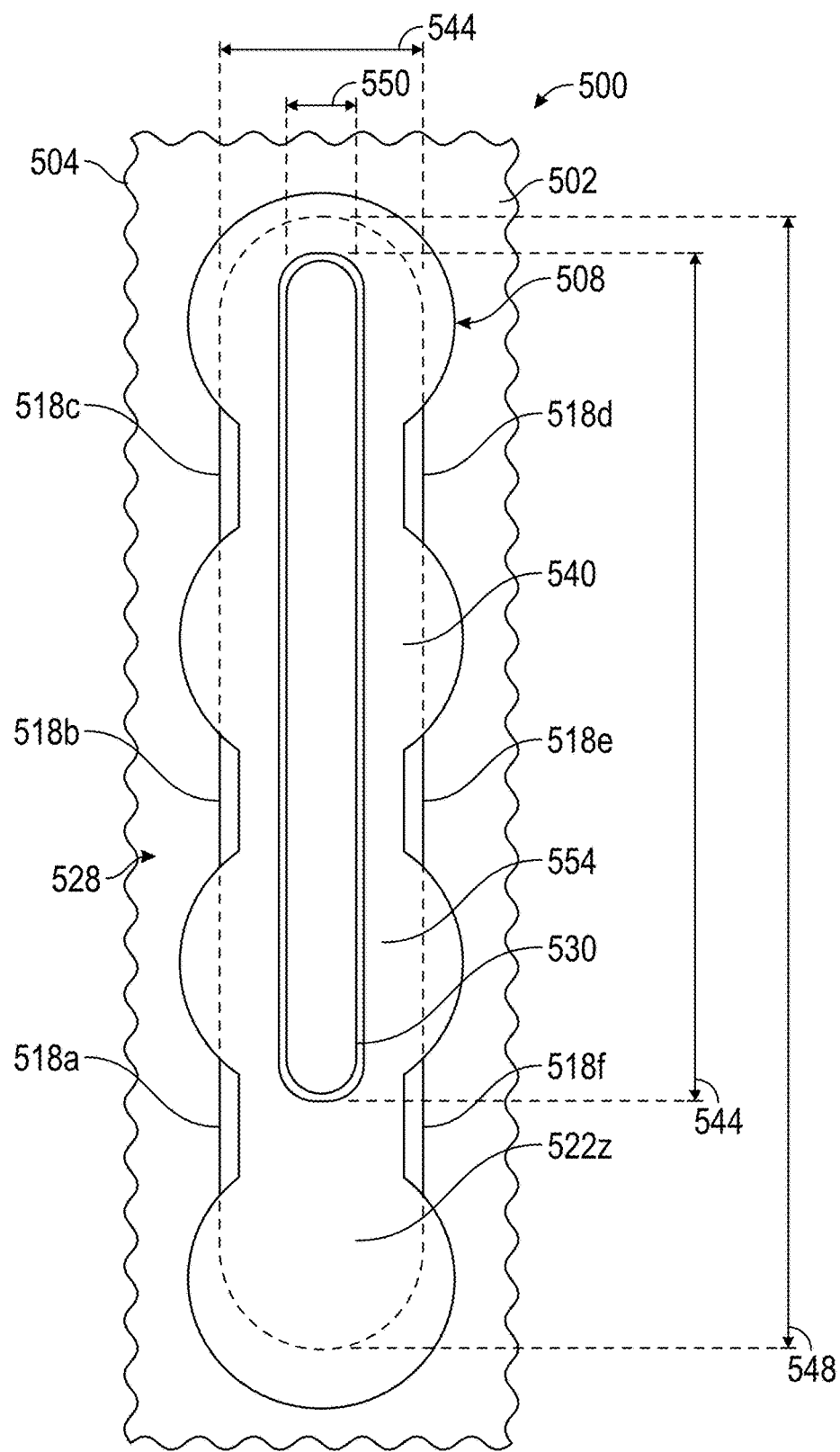
FIG. 43 is a top plan view of the circuit board of FIG. 41 showing the filling material.

Referring now to FIGS. 41-43, other variations of the conductive structures 16, and methods for producing conductive structures 16, will be described. It will be understood that such variations may be used in any of the circuit boards 10, 10*a* previously described in relation to FIGS. 1 and 3 herein, as well as in other circuit boards. Shown in FIG. 41 is a partial perspective view of a circuit board 500 constructed in accordance with the present disclosure in which a filling material (discussed below) is not shown to more clearly show other components. The circuit board 500 is provided with a substrate 502 having a first side 504, a second side 506 and at least one shielded vertical conductive structure 508 extending from the first side 504 to the second side 506, i.e., a through configuration. It should be understood that the shielded vertical conductive structure 508 could also be constructed in a blind configuration or a buried configuration.

The substrate 502 can be any material or device capable of being utilized to support electrical components, conductors, and the like. In one preferred embodiment, the substrate 502 includes multiple layers of interleaved conductive paths (or traces) and insulators.

The printed circuit board 500 may also be provided with a plurality of contact pads and one or more traces (not shown) as discussed herein. The shielded vertical conductive structure 508 is provided with at least two spaced apart and electrically isolated conductive segments 518*a* and 518*b*, although in the example shown the shielded vertical conductive structure 508 is provided with six electrically isolated conductive segments 518*a-f*. Each of the conductive segments 518*a-f* may be connected to a separate contact pad, component (not shown) or the like by way of a trace (not shown), although the conductive segments 518*a-f* may be connected directly to the contact pads. The conductive segments 518*a-f* are electrically isolated by a non-conductive filling material 522 (not shown in FIG. 41, but shown in FIG. 43) interposed between the conductive segments 518*a-f*. As will be discussed in more detail below, the conductive segments 518*a* and 518*b* are typically formed by a continuous conductive plating which has been separated or cut as discussed above.

The shielded vertical conductive structure 508 is provided with a vertical conductive structure 528, and at least one electromagnetic shield 530 that is positioned between at least two of the conductive segments 518*a-f*. The vertical conductive structure 528 can be structurally the same as (and made the same as) the vertical conductive structures 16, 110, 136a, 136b, 150, and 184 described herein. The electromagnetic shield 530 serves to reduce an electromagnetic field in a space encompassed by the vertical conductive structure 528 by blocking the electromagnetic field with a barrier made of a conductive or magnetic material. In this case, the electromagnetic shield 530 is designed to reduce undesired capacitive, inductive, or conducting coupling from a first set of the conductive segments 518a-f to a second set of the conductive segments 518a-f. In FIG. 41 vertical contact 518b is connected to the shield 530. The shielding is basically functional in FIG. 41 between vertical contact 518c and 518d. In this example, the first set includes conductive segment 518c, and the second set includes conductive segments 518d. The electromagnetic shield 530 does not extend between the conductive segments 518a and 518f. Thus, the conductive segments 518a and 518f are unshielded relative to one another.

The electromagnetic shield 530 may be positioned within a border 540 of a slot (shown in dashed lines in FIG. 43) used to form the vertical conductive structure 528. In some embodiments, the electromagnetic shield 530 is entirely positioned within the border 540. And, in other embodiments, the electromagnetic shield 530 may also extend beyond the border 540. Or, said another way, the electromagnetic shield 530 may have a first portion positioned within the border 540 and a second portion outside of the border 540.

The border 540 of the vertical conductive structure 528 has a length 544 and a width 546. The electromagnetic shield 530 is also provided with a length 548 and a width 550. When the electromagnetic shield 530 is entirely within the border 540 as shown in FIG. 43, the length 548 is less than the length 544, and the width 550 is less than the width 546. When the electromagnetic shield 530 extends beyond the border 540, the length 548 may be greater than the length 544 and/or the width 550 may be greater than the width 546.

In some embodiments, the electromagnetic shield 530 is electrically isolated from the conductive segments 518a-f. Electrical isolation can be accomplished in various manners, such as by having the non-conductive filling material 522 positioned between the electromagnetic shield 530 and the conductive segments 518a-f.

In the example shown, the electromagnetic shield 530 is coextensive with the conductive segments 518a-f to be shielded from one another. For example, each of the conductive segments 518a-f has a first end 560 and a second end 562 (only the conductive segment 518a has been labeled with the reference numerals 560 and 562 for purposes of clarity). The electromagnetic shield 530 is provided with a first end 564 and a second end 566. The first end 564 of the electromagnetic shield 530 can be positioned coplanar with the first end 560 of the conductive segments 518a-f, and the second end 566 of the electromagnetic shield 530 can be positioned coplanar with the second end 562 of the conductive segments 518a-f. In some embodiments, the electromagnetic shield 530 extends beyond the first end 560 and/or the second end 562 to provide additional shielding capability. This can be accomplished, for example when the electromagnetic shield 530 is a through configuration, and the conductive segments 518a-f are a buried and/or a blind configuration.

In the example of the electromagnetic shield 530 depicted in FIG. 41, the electromagnetic shield 530 extends in a substantially linear direction. It should be understood, however, that the electromagnetic shield 530 can be provided with a variety of shapes, including a cross shape, a + shape, a T shape, and the like so as to shield one or more of the conductive segments 518a-f from one or more other of the conductive segments 518a-f.

The electromagnetic shield 530 can be constructed as follows. After the vertical conductive structure 528 has been formed and the slot filled with the non-conductive filling material 522, at least a portion of the nonconductive filling material 522 is removed by formation of a second slot 570 within the border 540 and plated. The second slot 570 has a perimeter sidewall 572 and may extend parallel to the border 540 of the slot used to form the vertical conductive structure 528. The second slot 570 may have the width 550 and also may have rounded ends. In one embodiment, ends of the second slot 570 can be formed by drilling perpendicular to the first side 504, and the remainder of the second slot 570 can be removed by reciprocating a router bit between the ends of the second slot 570. In this embodiment, two holes are formed spaced apart from one another and the second slot 570 is formed between the two holes, and extends from one of the holes to the other one of the holes.

The second slot 570 may have a floor (not shown) when the second slot 570 is formed in a blind configuration.

The second slot 570 may be formed by the use of a straight router bit (with or without an end mill), but any conventional method, such as drilling, routing, milling, punching, laser drilling/cutting/ablation, water cutting, or photo-definition, or electrical discharge machining, can be used.

Thereafter, the perimeter sidewall 572 of the substrate 502 bordering the second slot 570 can be plated to form the electromagnetic shield 530. This may be accomplished by providing a conductive seed layer (not shown) followed by the addition of a conductive layer as discussed above. The electromagnetic shield 530 is preferably a continuous conductive layer. In other embodiments, the second slot 570 can be filled with a conductive material to form the electromagnetic shield 530. In one embodiment, the conductive layer is copper and may be deposited on the perimeter sidewall 572 to a thickness in the range between about 2.54 micron and about 25 microns, to a thickness of greater than approximately five microns, and to a thickness of approximately 15-25 microns. For a through structure, the thickness may be in a range from about 20 to 25 micron and for a blind structure, the thickness may be about 15 micron, for example. The electromagnetic shield 530 may be thick enough to provide a robust mechanical structure that will survive the thermal fluctuations and aggressive handling experienced by a printed circuit board during subsequent component assembly and usage.

In an embodiment, an electrolytic plating process is used to deposit the conductive layer forming the electromagnetic shield 530. The electrolytic process may follow a surface preparation step involving either a direct metallization process or an electroless process. Plating could be a conductive material such as silver or copper paste.

The surface preparation step includes depositing a thin conductive seed layer that sensitizes the surface and assists in the adhesion of the electromagnetic shield 530 to the perimeter sidewall 572. Direct metallization comprises depositing a thin conductive molecular layer (not shown) on the substrate surfaces and the sidewall of the second slot 570 prior to depositing the electromagnetic shield 530. The electromagnetic shield 530 may also be palladium or platinum. This process avoids the typical catalytically deposited copper, thereby rendering this device more economically feasible.

The electroless surface preparation process comprises depositing a thin conductive seed layer (not shown), which may be copper, on the surfaces of the sidewalls prior to depositing the electromagnetic shield 530, to a thickness in the range between about 30 microns and about 200 microns, and in an embodiment, to a thickness in the range between about 70 microns and about 80 microns.

The surface preparation followed by the electrolytic deposition may result in a non-linear distribution of the electromagnetic shield 530 on the perimeter sidewall 572 due to a natural tendency for the thickness of the electromagnetic shield 530 to reduce as a depth of the sidewall increases.

The electromagnetic shield 530 is preferably a continuous layer of conductive material. After formation, the electromagnetic shield 530 is preferably not separated into conductive segments. In some embodiments, the electromagnetic shield 530 can be connected to a reference voltage such as ground. Further, in some embodiments, after the electromagnetic shield 530 is formed, the second slot 570 can be filled with a conductive or a non-conductive filling material, such as a conductive paste or polymer. In these embodiments, the filling material may engage the electromagnetic shield 530. Additionally, the electromagnetic shield 530 be be used as a shielding as well as a signal conducting element. The placement of the electromagnetic shield 530 within the border 540 of the slot (shown in dashed lines in FIG. 43) used to form the vertical conductive structure 528 creates a capacitive and inductive structure for the vertical traces 518 (c,d,e). The distance of the electromagnetic shield 530 to the vertical trace (c,d,e) can be varied to tune the impedance of the vertical trace (c,d,e) to the required value.

It should be further understood that the vertical conductive structures discussed herein are shown in a linear or straight configuration, but may also be bent, arced, or any or any other shape that supports the design.

It will be understood from the foregoing description that various modifications and changes may be made in the preferred and alternative embodiments of the present invention without departing from its true spirit. For example, embodiments of the invention can be combined with High Density Interconnect (HDI) technology. As standard PCB technology knows many different constructions where vertical conductive structures are created as through holes, blind holes and/or buried holes so can the vertical conductive structures 16, 110, 136*a*, 136*b*, 150, and 184. Thus, the processes described herein can be applied in combination with known PCB technology, including but not limited to the embedding of passive components and/or active components into the PCB, as well as a number of sequential/high density interconnect build-up constructions. Any sequential or high density interconnect constructions using through holes or any buried and blind holes/microvias can be turned into constructions using the vertical conductive structures 16, 110, 136*a*, 136*b*, 150, and 184. Further, the processes described herein for forming the vertical conductive structures 16, 110, 136*a*, 136*b*, 150, and 184 can be used to construct single chip modules, multi-chip modules and printed circuit boards including back planes and mid planes.

From the above description, it is clear that the inventive concepts disclosed and claimed herein are well adapted to carry out the objects and to attain the advantages mentioned herein, as well as those inherent in the invention. While exemplary embodiments of the inventive concepts have been described for purposes of this disclosure, it will be understood that numerous changes may be made which will readily suggest themselves to those skilled in the art and which are accomplished within the spirit of the inventive concepts disclosed and/or as defined in the appended claims.

What is claimed is:

1. A method for making a printed circuit board, comprising the steps of:
   forming a slot in a substrate, the substrate having a first side and a second side and having at least three layers, with the slot extending through at least two of the at least three layers from the first side and terminating prior to intersecting the second side of the substrate such that the slot is blind, the substrate having multiple layers of traces and insulators including an internal trace, the slot having a length, depth, and a width, with the length being greater than the width, the slot having a first end and a second end, the first end and the second end having a semi-circular shape, the slot having a perimeter sidewall, wherein at least a portion of the perimeter sidewall is linear along the length of the slot, the slot being formed by a routing method;
   coating the perimeter sidewall of the substrate surrounding the slot with a conductive layer; and
   separating the conductive layer into at least two conductive segments that are electrically isolated along the perimeter sidewall of the substrate for providing an electrical connection between the internal trace and another internal or external trace.

2. The method of claim 1, wherein the step of separating the conductive layer into at least two segments that are electrically isolated is defined further as creating at least one cross-slot by removing a first portion of the conductive layer and the substrate and a second portion of the conductive layer and the substrate.

3. The method of claim 2, wherein the first portion and the second portion are aligned and located on opposite sides of the slot.

4. The method of claim 2, wherein the first portion and the second portion are spaced apart along the length of the slot.

5. The method of claim 1, wherein the step of separating the conductive layer into the at least two conductive segments that are electrically isolated is defined further as positioning a tool having a diameter less than the slot into the slot so as to avoid contact with the conductive layer as the tool is positioned within the slot, and moving the tool laterally into the conductive layer and the perimeter sidewall to form at least one cross-slot separating the conductive layer into the at least two conductive segments.

6. The method of claim 1, wherein the step of forming the slot includes forming at least a portion of the slot so as to avoid the slot extending through at least one of the at least three layers so as to form a floor of the slot, and further comprising the steps of plating the floor of the slot with the conductive layer so that the conductive layer is continuous between a first side of the slot and a second side of the slot, and wherein the step of separating the conductive layer is defined further as removing a portion of the conductive layer and the substrate on the floor of the slot.

7. The method of claim 1, wherein the method further comprises the steps of filling the slot with a non-conductive filling material; and forming an electromagnetic shield within the non-conductive filling material between the two conductive segments.

8. The method of claim 7, wherein the slot is a first slot, and wherein forming the electromagnetic shield is defined further as forming a second slot within the non-conductive filling material, and positioning a conductive material within the second slot to form the electromagnetic shield.

9. The method of claim 8, wherein positioning the conductive material within the second slot is defined further as plating a perimeter sidewall forming a boundary of the second slot with the conductive material.

10. The method of claim 8, wherein positioning the conductive material within the second slot is defined further as filling the second slot with the conductive material.

11. The method of claim 10, wherein the conductive material is a conductive paste.

12. The method of claim 1, further comprising one or more additional layers covering the slot in the substrate, such that the slot is in a buried configuration.

13. The method of claim 1, wherein forming the slot in the substrate further comprises forming the slot with a bit that can be moved in at least two different lateral directions within the substrate to remove portions of the conductive layer and/or the substrate.

14. The method of claim 1, further comprising introducing a filling material into the slot.

15. The method of claim 1, wherein the substrate is a flexible thin-film substrate.

\* \* \* \* \*